US008872423B2

United States Patent
Kambe et al.

(10) Patent No.: US 8,872,423 B2
(45) Date of Patent: Oct. 28, 2014

(54) ORGANIC ELECTROLUMINESCENT DEVICE AND DISPLAY DEVICE

(75) Inventors: Emiko Kambe, Kanagawa (JP); Akifumi Nakamura, Kanagawa (JP); Yasunori Kijima, Tokyo (JP); Hiroshi Yamamoto, Chiba (JP)

(73) Assignee: Sony Corporation, Tokyo (JP)

( * ) Notice: Subject to any disclaimer, the term of this patent is extended or adjusted under 35 U.S.C. 154(b) by 1140 days.

(21) Appl. No.: 12/037,718

(22) Filed: Feb. 26, 2008

(65) Prior Publication Data
US 2008/0233387 A1    Sep. 25, 2008

(30) Foreign Application Priority Data

Mar. 7, 2007  (JP) ................................. 2007-056599

(51) Int. Cl.
| | | |
|---|---|---|
| C09K 11/06 | (2006.01) | |
| H01L 51/54 | (2006.01) | |
| H01L 51/50 | (2006.01) | |
| H01L 51/52 | (2006.01) | |
| H01L 51/00 | (2006.01) | |

(52) U.S. Cl.
CPC ......... H01L 51/5048 (2013.01); *H01L 51/5052* (2013.01); *H01L 51/5206* (2013.01); *H01L 51/006* (2013.01); *H01L 51/5234* (2013.01); *H01L 2251/558* (2013.01); *H01L 51/5265* (2013.01); *H01L 51/0059* (2013.01); H01L 51/0072 (2013.01); *Y10S 428/917* (2013.01)
USPC ........... 313/504; 313/506; 428/690; 428/917; 257/40; 257/E51.051

(58) Field of Classification Search
None
See application file for complete search history.

(56) References Cited

U.S. PATENT DOCUMENTS

| | | | |
|---|---|---|---|
| 6,589,673 B1 | 7/2003 | Kido et al. | |
| 2003/0044640 A1* | 3/2003 | Funahashi et al. | 428/690 |
| 2003/0148142 A1 | 8/2003 | Fryd et al. | |
| 2003/0165715 A1 | 9/2003 | Yoon et al. | |
| 2004/0113547 A1* | 6/2004 | Son et al. | 313/504 |
| 2005/0093432 A1* | 5/2005 | Yamazaki et al. | 313/503 |
| 2006/0147747 A1* | 7/2006 | Yamamoto et al. | 428/690 |
| 2007/0257605 A1 | 11/2007 | Son et al. | |
| 2010/0193773 A1 | 8/2010 | Yamamoto et al. | |

FOREIGN PATENT DOCUMENTS

| | | |
|---|---|---|
| JP | 2001-102175 | 4/2001 |
| JP | 2002-198176 | 7/2002 |
| JP | 2005-101008 | 4/2004 |
| JP | 2004-077886 | 9/2004 |

(Continued)

OTHER PUBLICATIONS

Japanese Office Action issued Sep. 13, 2011, for corresponding Japanese Appln. No. 2008-055950.

(Continued)

*Primary Examiner* — Jennifer Chriss
*Assistant Examiner* — Brett A Crouse
(74) *Attorney, Agent, or Firm* — K&L Gates LLP

(57) ABSTRACT

An electroluminescent device is provided with an anode, a cathode, and an organic layer having at least a light-emitting layer and held between the anode and the cathode. A layer with a nitrogen-containing heterocycle derivative therein is arranged between the anode and the light-emitting layer. The layer with the nitrogen-containing heterocycle derivative contained therein has a thickness greater than a hole supply layer arranged between the anode and the light-emitting layer.

4 Claims, 10 Drawing Sheets

(56) References Cited

FOREIGN PATENT DOCUMENTS

| | | | |
|---|---|---|---|
| JP | 2004-531850 | 10/2004 | |
| JP | 2004-352655 | 12/2004 | |
| JP | 2005-515233 | 5/2005 | |
| JP | 2006-66890 | 3/2006 | |
| KR | 20010050711 | 6/2001 | |
| KR | 20040051507 | 6/2004 | |
| KR | 20050107620 | 11/2005 | |
| WO | WO 2004/080975 | * 9/2004 | ........... C07D 235/18 |

OTHER PUBLICATIONS

Naka, et al. High electron mobility in bathophenanthroline, Applied Physics Letter, 76(2), 197-199, Jan. 10, 2000.

Efficient organic light-emitting diodes with undoped active layers based on silole derivatives, Applied Physics Letter, 80(2), 189-191, Jan. 14, 2002.

Korean Office Action issued Apr. 23, 2014 in corresponding Korean Patent Application No. 20080020045.

* cited by examiner

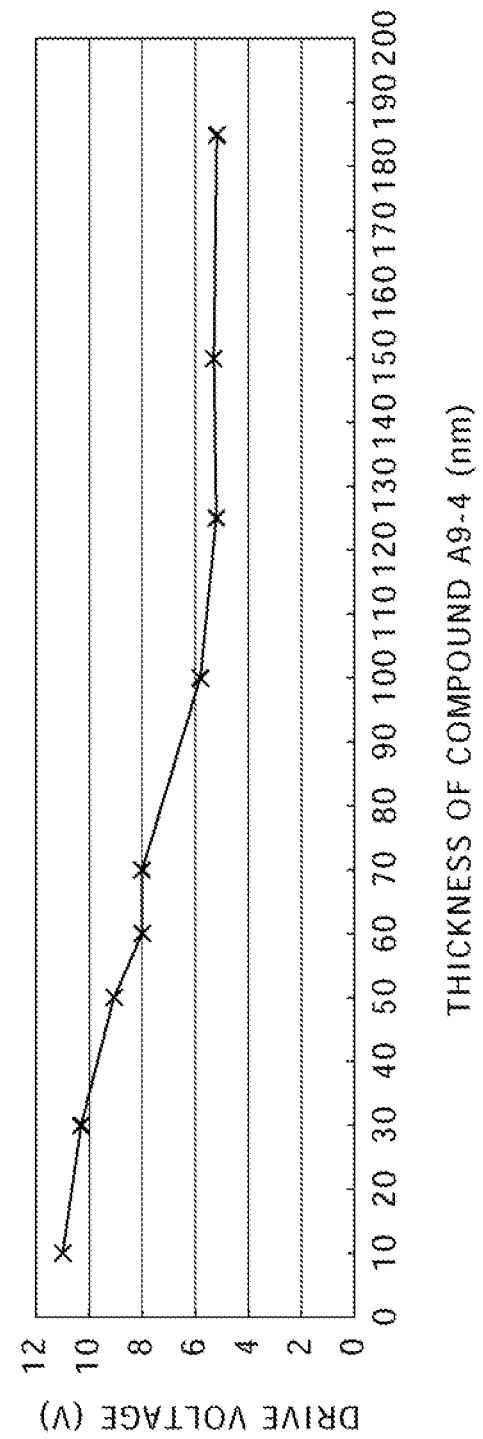

ORGANIC ELECTROLUMINESCENT DEVICE AND DISPLAY DEVICE

CROSS REFERENCE TO RELATED APPLICATIONS

The present application claims priority to Japanese Patent Application. JP 2007-056599 filed in the Japan Patent Office on Mar. 7, 2007, the entire contents of which being incorporated herein by reference.

BACKGROUND

The present application relates to an organic electroluminescent device (so-called "organic EL device") and a display device, and specifically to an organic electroluminescent device equipped with an electron transport layer containing a nitrogen-containing heterocycle derivative and a display device.

Organic electroluminescent devices (so-called organic EL devices) which make use of electroluminescence (hereinafter referred to as "EL") of organic materials are each provided between an anode and a cathode with an organic layer formed of an organic hole transport layer and an organic light-emitting layer stacked one over the other, and are attracting interests as light-emitting devices enabling a high-brightness light emission by a low-voltage direct current drive.

FIG. 12 is a cross-sectional view showing one configuration example of such an organic electroluminescent device. An organic electroluminescent device 51 shown in this figure is arranged on a transparent substrate 52 made, for example, of glass or the like, and is constructed of an anode 53 arranged on the substrate 52, an organic layer 54 arranged on the anode 53, and a cathode 55 arranged on the organic layer 54. The organic layer 54 has a configuration that a hole injection layer 54a, a hole transport layer 54b. a light-emitting layer 54c and an electron transport layer 54d are stacked successively in this order front the side of the anode 53. In this organic electroluminescent device 51, electrons injected from the cathode 55 and holes injected from the anode 53 recombine with each other in the light-emitting layer 54c, and light produced upon this recombination is outputted via the anode 53 or cathode 55. It is to be noted that organic electroluminescent devices also include those of a configuration that a cathode, an organic layer and an anode are stacked successively in this order from the side of a substrate.

Still higher efficiency and longer life are demanded in recent years for such organic electroluminescent devices. For example, 8-hydroxyquinoline aluminum (Alq3) has conventionally been used as the electron transport layer 54d. As Alq3 is low in electron mobility, phenanthroline derivatives (see, for example, Applied Physics Letter (U.S.A.), 76(2). 197-199, Jan. 10, 2000 (hereinafter referred to as Non-patent document 1)) and silole derivatives (see, for example, Applied Physics Letter (U.S.A.), 80(2), 189-191 Jan. 14, 2002 (hereinafter referred to as Non-patent document 2)) have been reported as materials having higher electron mobility than Alq3. The use of these electron transport materials has a merit in that, because the injection of electrons is intensified and the region of recombination between electrons and holes is concentrated on the side of a hole injection electrode (the anode 53), the recombination probability is improved, the luminescence efficiency is raised, and a low-voltage drive is feasible. For the movement of the region of recombination between electrons and holes to the side of the anode 53, on the other hand, more electrons reach the hole transport layer 54b. A triphenylamine derivative commonly employed as the hole transport layer 54b, therefore, becomes very unstable and deteriorates when it accepts electrons. As a consequence, the light-emitting life of the electroluminescent device is shortened.

As attempts to control the carrier balance throughout a device, examples of organic electroluminescent devices each having a layer of high hole transport ability between a light-emitting layer and an electron transport layer have been disclosed (see, for example, the pamphlet of PCT International Publication No. WO 2004/077886 A (hereinafter referred to as Patent document 1) and JP-A-2006-66890 (hereinafter referred to as Patent document 2)).

To prevent short-circuiting between the anode and the cathode to reduce the occurrence of light emission failure, the organic layer is required to have a certain thickness or greater. It is a common practice to choose a hole transport material, which shows high mobility, and to deposit it thick (see, for example, Patent document 1 and JP-A-2005-101008 (hereinafter referred to as Patent document 3)).

As described in Patent documents 1 and 2, the organic electroluminescent device having the layer of high hole transport ability between the light-emitting layer and the electron transport layer is, however, accompanied by a problem in that the electron transport ability is lowered and due an increased drive voltage and insufficient carriers, the current efficiency is deteriorated.

When a material equipped with electron mobility high enough to enable high-efficiency light emission is used as the electron transport layer 54d as described in Non-patent documents 1 and 2, the configuration that the hole transport layer 54a is deposited thick as described in Patent documents 1 and 3 intensifies the supply of electrons owing to the large thickness despite a limitation to the transport of holes, and therefore, involves problems that the earner balance is deteriorated and the life is very shortened.

SUMMARY

It is desirable, therefore, to provide an organic electroluminescent device which can realize both higher efficiency and longer life.

To achieve the above-described desire, an embodiment is characterized in that in an organic electroluminescent device provided with an anode, a cathode, and an organic layer having at least a light-emitting layer and held between said anode and said cathode, a layer with a nitrogen-containing heterocycle derivative therein is arranged between the cathode and the Sight-emitting layer, and the layer with the nitrogen-containing heterocycle derivative contained therein has a thickness greater than a hole supply layer arranged between the anode and the light-emitting layer.

Another embodiment is also characterized in that in a display device provided with a substrate and organic electroluminescent devices formed in an array on the substrate, each of the organic electroluminescent devices being provided with an anode, a cathode and an organic layer held between the anode and the cathode and having at least a light-emitting layer, wherein a layer with a nitrogen-containing heterocycle derivative therein is arranged between the cathode and the light-emitting layer, and the layer with the nitrogen-containing heterocycle derivative contained therein has a thickness greater than a hole supply layer arranged between the anode and the light-emitting layer.

According to the organic electroluminescent device and display device in an embodiment, the layer with the nitrogen-containing hetero cycle derivative contained therein is arranged between the cathode and the light-emitting layer, and the nitrogen-containing hetero cycle derivative has high electron supply ability. The layer with the nitrogen-containing hetero cycle derivative contained therein can, therefor, provide the light-emitting layer with electrons necessary and sufficient to achieve higher efficiency at low drive voltage despite the formation of the layer, which contains the nitrogen-containing hetero cycle derivative therein, with the thickness greater than the hole supply layer. In addition, forming the hole supply layer, which is disposed between the anode and light-emitting layer, thinner than the layer contains nitrogen-containing hetero cycle can increase the supply of holes. It is, therefore, possible to achieve a carrier balance with just enough holes and electrons while assuring a sufficiently large supply quantity of carriers, and therefore, to obtain high luminescence efficiency. As holes and electrons are neither too much nor too little, the carrier balance is hardly disrupted, thereby making it possible to reduce a deterioration in drive and to lengthen the light-emitting life.

As has been described above, the organic electroluminescent device and display device according to an embodiment can achieve higher efficiency and longer life, and therefore, can realize a display excellent in long-term reliability.

Additional features and advantages are described herein, and will be apparent from the following Detailed Description and the figures.

BRIEF DESCRIPTION OF THE FIGURES

FIG. 9 is a diagram illustrating variations in drive voltage when the thickness of a layer with a nitrogen-containing heterocycle derivative contained therein was changed;

DETAILED DESCRIPTION

Embodiments of the present application Will be described in detail below.

Figure 1:
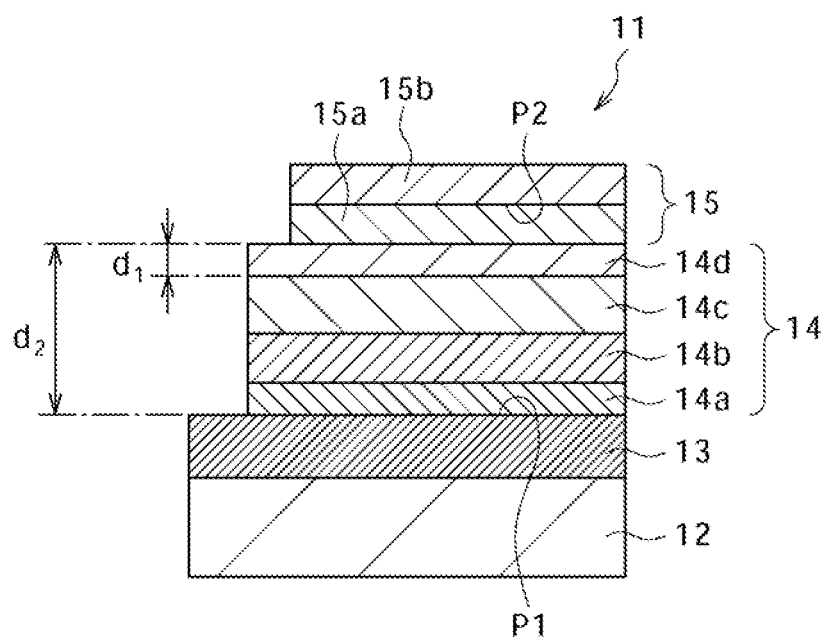
FIG. 1 is a cross-sectional view illustrating the configuration of an organic electroluminescent device according to an embodiment.

FIG. 1 is a perspective view illustrating one configuration example of the organic electroluminescent device according an embodiment. An organic electroluminescent device 11 illustrated in the figure is provided with an anode 13 arranged on a substrate 12, an organic layer 14 arranged in a multilayer form on the anode 13, and a cathode 15 arranged on the organic layer 14.

In the following description, a description will be made of the organic electroluminescent device 11 of the top-emitting configuration that light generated upon recombination of holes, which have been injected from the anode 13, and electrons, which have been injected from the cathode 15, in a light-emitting layer 14c is outputted from the side of the cathode 15 located on the side opposite to the substrate 12.

Firstly, assume that as the substrate 12 on which the organic electroluminescent device 11 is arranged, one of a transparent substrate such as a glass substrate, a silicon substrate, a film-shaped flexible substrate and the like is selected and employed as desired. When the drive system of a display device fabricated using a plurality of such organic electroluminescent devices 11 is the active matrix system, a TFT substrate with TFTs arranged corresponding respective pixels is employed as the substrate 12. In this case, this display device is constructed such that the top-emitting, organic electroluminescent elements 11 are driven by using the TFTs.

As the anode 13 arranged as a lower electrode on the substrate 12, electrode materials each of which has a large work function from a vacuum level to efficiently inject holes, for example, chromium (Cr), gold (Au), alloys of tin oxide (SnO2) and antimony (Sb), alloys of zinc oxide (ZnO) and aluminum (Al), silver (Ag) alloys, oxides of these metals and alloys, and the like can be used either singly or in combination.

When the organic electroluminescent device 11 is a top-emitting system, the configuration of the anode 13 with a high-reflectivity material makes it possible to improve the output efficiency of light to the outside owing to interference effects and high-reflectivity effects. As such an electrode material, it is preferred to use, for example, an electrode material composed primarily of Al, Ag or the like. By arranging a layer of a transparent electrode material having a large work function, such as ITO, on a layer of such a high-reflectivity material, the injection efficiency of carriers can be raised.

When the anode 13 is formed of an Al alloy, the use of a metal as an accessory component to the Al alloy, said metal having a smaller work function relative to Al as the principal component, such as, for example, neodymium improves the stability of the Al alloy so that a high-reflectivity, stable anode can be realized. In this case, the work function often becomes smaller compared with an anode in the form of a layer of a transparent electrode material, such as ITO, having a large work function, frequently resulting in a large hole injection barrier insofar as a commonly-employed amine material is solely used as a hole injection layer. Therefore, by forming a layer of an amine material and an acceptor material such as F4TCNQ (2,3,5,6-tetrafluoro-7,7,8,8-tetracyanoquinodimethane) mixed therein, a so-called p-doped layer of PEDOT-PSS (polyethylenedioxythiophene-polystyrenesulfonic acid) or the like at an interface with the anode or by using an azatriphenylene derivative to be described subsequently herein, a low drive voltage can be used. An azatriphenylene derivative is preferred especially from the standpoint of device stability and low drive voltage.

It is to be noted that, when the drive system of a display device fabricated by using a plurality of such organic electroluminescent devices 11 is the active matrix system, such anodes 13 are patterned corresponding to the respective TFT-arranged pixels. As an upper layer for the anode 13, an insulating film is arranged although its illustration is omitted in the figure, and through holes in the insulating film, the surfaces of the anodes 13 at the respective pixels are exposed.

As the cathode 15, on the other hand, a layer is formed with a material having a small work function such that the layer is contiguous with the organic layer 14. It is necessary for this layer to have a configuration which is good in light transmittance. As such a configuration, the cathode 15 may have a configuration that a first, layer 15a and a second layer 15b are stacked in this order from the side of the anode 13.

The first layer 15a is formed by using a material having a small work function and good light transmittance. Examples of such a material include alkali metal oxides, alkali metal fluorides, alkaline earth metal oxides and alkaline earth metal fluorides, such as $Li_2O$, $Cs_2Co_3$, $Cs_2SO_4$, MgF, LiF and CaF2, The second layer 15b, on the other hand, is made of a material having light transmittance and electrical conductivity, for example, in the form of a thin-film MgAg electrode or Ca electrode. When this organic electroluminescent device 11 is a top-emitting device formed especially of a resonator configuration that generated light is caused to resonate between the anode 13 and the cathode 15 and is then outputted, the second layer 15b is formed with a semi-transmitting reflective material such as, for example, Mg—Ag to cause the generated light to resonate between the second layer 15b and the anode 13.

Further, the second layer 15b is made, for example, of a transparent SiNx compound, and is formed as a sealing electrode for the prevention of electrode deteriorations.

The above-described first layer 15a and second layer 15b can be formed by a process such as vacuum evaporation, sputtering or plasma CVD. When the drive system of a display device fabricated with such organic electroluminescent devices is the active matrix system, the cathode 15 may be formed as a solid film on the substrate 12 such that the cathode 15 is insulated from the anode 13 by an insulating film, which covers peripheral edges of the anode 13 although its illustration is omitted in the figure, and the organic layer 14, and the cathode 15 may be used as a common electrode to the respective pixels.

The organic layer 14 held between the above-described anode 13 and cathode 15 has at least a light-emitting layer, and has been formed by stacking a hole supply layer for supplying holes from the anode 13 to the light-emitting layer, the light-emitting layer, and the below-described electron supply layer for supplying electrons from the cathode to the light-emitting layer, in this order from the side of the anode 13. Described specifically, the organic layer 14 has been formed by stacking a hole supply layer composed of a hole injection layer 14a and a hole transport layer 14b, a light-emitting layer 14c and an electron transport layer (electron supply layer) 14d in this order from the side of the anode 13.

These layers can be made of organic layers formed, for example, by vacuum evaporation or another process such as spin coating.

As a characteristic feature an embodiment, a layer with a nitrogen-containing heterocycle derivative contained therein is arranged between the light-emitting layer 14c and the cathode 15. Described specifically, the electron transport layer 14d is assumed to contain the nitrogen-containing heterocycle derivative. This electron transport layer 14d is formed with a thickness greater than the total thickness of the hole supply layer, that is, the hole injection layer 14a and hole transport layer 14b. Owing to the high electron supply ability of the nitrogen-containing heterocycle derivative, the supply of electrons is hence maintained high at a low drive voltage despite the formation of the electron transport layer 14d with the thickness greater than the total thickness of the hole injection layer 14a and hole transport layer 14b. Further, owing to the thickness of the electron transport layer 14d formed thicker than the total thickness of the hole injection layer 14a and hole transport layer 14b, short circuiting can be prevented between the anode 13 and the cathode 15.

The electron transport layer 14d may be formed preferably with a thickness of 70 nm or greater. Its formation with a thickness of 70 nm or greater is preferred, because the supply of electrons is not excessive and can be balanced with the supply of holes. Further, the formation of the electron transport layer 14d and organic layer 14 to satisfy the relationship of 0.90>d1/d2>0.30 (d1: the thickness of the electron transport layer 14d, d2: the thickness of the organic layer 14) is preferred, because a balance can be readily established between the supply of holes and that of electrons and a longer life can be assured.

By fabricating the organic electroluminescent device 11 into the resonator configuration that generated light is caused to resonate between the anode 13 and the cathode 15 and is outputted, it is possible to output light with improved color purity while increasing the intensity of light around the central wavelength of resonation. When fabricated into a resonator configuration that a reflecting end face of the anode 13, said reflecting end face being located on the side of the light-emitting layer 14c, is set at a first end portion P1, a reflecting end face of the cathode 15, said reflecting end face being located on the side of the light-emitting layer 14c, is set as a second end portion P2, the organic layer 14 is set as a resonance portion, and light produced in the light-emitting layer 14c is caused to resonate and is outputted from the side of the second end portion, the optical distance L between the first end portion P1 and the second end portion P2 in the resonator is set to satisfy the below-described equation (1), in practice, this optical distance L may be preferably set to take a positive minimum value that satisfies the equation (1).

$$(2L)/\lambda + \Phi/(2\pi) = m \qquad \text{Equation (1)}$$

In the equation (1), L represents the optical distance between the first end portion P1 and the second end portion P2, Φ represents the sum of the phase shift $\Phi_1$ of reflected Sight produced at the first end portion P1 and the phase shift Φ2 of reflected, light produced at the second end portion P2, ($\Phi = \Phi_1 + \Phi_2$) (rad), λ represents the peak wavelength of the spectrum of light desired to be outputted from the side of the second end portion P2, and m represents an integer to make L positive. It is to be noted that the same unit can be used for L and λ in the equation (1), for example, "nm" can be used as a unit.

In the organic electroluminescent device 11, the optical distance $L_1$ between a maximum light-emitting position of the light-emitting layer 14c and the first end portion P1 is set to satisfy the below-described equation (2), and the optical distance $L_2$ between the maximum light-emitting position and the second end portion P2 is set to satisfy the below-described equation (3). It is to be noted that the term "maximum light-emitting position" means a position at which the intensity of light emission is highest in a light-emitting region. When the emission of light takes place at both of the interfaces of the light-emitting layer 14c on the side of the anode 13 and on the side of the cathode 15, the maximum light-emitting position is one of the interfaces, said one interface being higher in the intensity of light generation than the other interface.

$$\left. \begin{array}{l} L_1 = tL_1 + a_1 \\ (2tL_1)/\lambda = -\Phi_1/(2\pi) + m_1 \end{array} \right\} \quad \text{Equation 2}$$

In the equation (2), tL1 represents a theoretical optical resistance between the first end portion P1 and the maximum light-emitting position, a1 represents a correction value based on the distribution of light generation at the light-emitting layer 14c, $\lambda$ represents the peak wavelength of the spectrum of light desired to be outputted, $\Phi_1$ represents the phase shift (rad) of reflected light produced at the first end portion P1, and m1 represents 0 or an integer.

$$\left. \begin{array}{l} L_2 = tL_2 + a_2 \\ (2tL_2)/\lambda = -\Phi_2/(2\pi) + m_2 \end{array} \right\} \quad \text{Equation 3}$$

In the equation (3), tL2 represents a theoretical optical resistance between the second end portion P2 and the maximum light-emitting position, $a_2$ represents a correction value based on the distribution of light generation in the light-emitting layer 14c, $\lambda$ represents the peak wavelength of the spectrum of light desired to be outputted, $\Phi_2$ represents the phase shift (rad) of reflected light produced at the second end portion P2, and $m_2$ represents 0 or an integer.

The equation (2) is to assure that when a portion of light produced in the light-emitting layer 14c, said portion heading toward the anode 13, returns subsequent to its reflection on the first end portion P1, the light so returned has the same phase as that of the light at the time of its production and is in such a relationship with another portion of the generated light said portion heading toward the cathode 15, that they intensify each other. The equation (3), on the other hand, is to assure that, when the portion of light produced in the light-emitting layer 14c, said portion heading toward the cathode 15, returns subsequent to its reflection on the second end portion P2, the light so returned has the same phase as that of the light at the time of its production and is in such a relationship with another portion of the generated light, said portion heading toward the anode 13, that they intensify each other.

The organic electroluminescent device 11 according to this embodiment can be designed to achieve $m_1 > m_2$ in the equations (2) and (3) by forming the electron transport layer 14d thicker than the total thickness of the hole injection layer 14a and hole transport layer 14b. This design can increase the output efficiency of light.

It is to be noted that the theoretical optical distance $tL_1$ in the equation (2) and the theoretical optical distance $tL_2$ in the equation (3) are theoretical values that, when the light-emitting region is assumed to have no spread, the amount of a phase shift at the first end portion P1 or the second end portion P2 and the amount of a phase shift as a result of the advance are exactly cancelled out and the phase of the returned light becomes the same as the phase of the light at the time of its production. In general, however, a light-emitting region has a spread. Based on the distribution of light generation, the correction values $a_1$, $a_2$ are, therefore, added in the equation (2) and equation (3).

The correction values $a_1$, $a_2$ differ depending on the distribution of light generation. Nonetheless, they can be determined, for example, in accordance with the following equation (4) when the maximum light-emitting position is on one side of the light-emitting layer 14c said side being on the side of the cathode 15, and the distribution of Sight generation spreads from the maximum light-emitting position toward the anode 13 or when the maximum light-emitting position is on the other side of the light-emitting layer 14c, said side being on the side of the anode 13, and the distribution of light generation spreads from the maximum light-emitting position toward the cathode 15.

$$\left. \begin{array}{l} a_1 = b(\log_e(s)) \\ a_2 = -a_1 \end{array} \right\} \quad \text{Equation 4}$$

In the equation (4), b stands for a value in a range of 2n<b<6n when the distribution of light generation in the light-producing layer 14c spreads from the maximum light-emitting position toward the anode 13 or a value in a range of −6n<b<−2n when the distribution of light generation in the light-emitting layer 14c spreads from the maximum light-emitting position toward the cathode 15, s represents a physical property value relating to the distribution of light generation in the light-emitting layer 13C (1/e attenuation resistance), and n represents an average refractive index between the first end portion P1 and the second end portion P2 at the peak wavelength $\lambda$ of the spectrum of light desired to be outputted.

Preferred usable examples of the nitrogen-containing heterocycle complex, which makes up the electron transport layer 14d, include benzimidazole derivatives and phenanthroline derivatives represented by the following formulas (1) to (3).

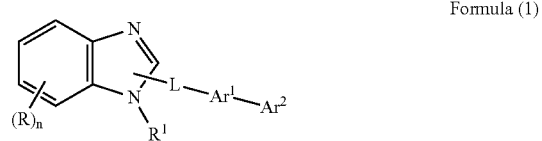

Formula (1)

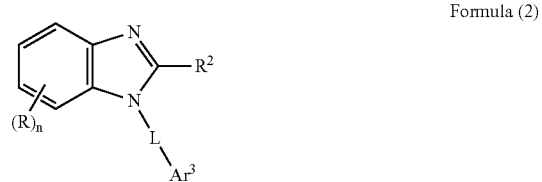

Formula (2)

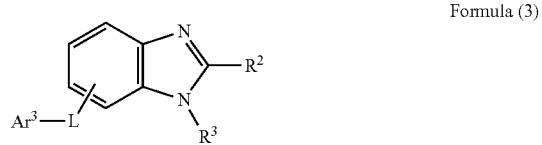

Formula (3)

In the formulas (1), (2) and (3), R represents a hydrogen atom, a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group, and n stands for an integer of from 0 to 4.

$R^1$ represents a substituted or unsubstituted $C_6$-$C_{60}$ and group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group; and R2 and R3 each independently represent a hydrogen atom, a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group.

L represents a substituted or unsubstituted $C_6$-$C_{60}$ arylene group, a substituted or unsubstituted pyridinylene group, a substituted or unsubstituted quinolinylene group or a substituted or unsubstituted fluolenylene group.

$Ar^1$ represents a substituted or unsubstituted $C_6$-$C_{60}$ arylene group, a substituted or unsubstituted pyridinylene group or a substituted or unsubstituted quinolinylene group; and $Ar^2$ represents a substituted or unsubstituted $C_6$-$C_{60}$ aryl group, a substituted, or unsubstituted pyridyl group, a substituted, or unsubstituted quinolyl group, a substituted or unsubstituted $C_1$-$C_{20}$ alkyl group or a substituted or unsubstituted $C_1$-$C_{20}$ alkoxy group.

$Ar^3$ represents a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group, a substituted or unsubstituted $C_1$-$C_{20}$ alkoxy group, or a group represented by —$Ar^1$—$Ar^2$ in which $Ar^1$ and $Ar^2$ have the same meanings as defined above.

Compounds A, specific examples of the benzimidazole derivatives represented by the formulas (1) to (3), will be shown below in Tables 1 to 24, while Compounds B, specific examples of the phenanthroline derivatives represented by the formulas (1) to (3), will be presented below in Table 25. However, the present application shall not be limited to the use of these illustrative compounds. It is to be noted that in the following tables, $Ar^3$ in the formulas (2) and (3) is —$Ar^1$—$Ar^2$ and "HAr" represents the benzimidazole structure.

TABLE 1

| No. of Compound A | HAr | L | $Ar^1$ | $Ar^2$ |
|---|---|---|---|---|
| 1-1 | | | | |
| 1-2 | | | | |
| 1-3 | | | | |
| 1-4 | | | | |

TABLE 1-continued
| No. of Compound A | HAr-L-Ar¹-Ar² | | | |
|---|---|---|---|---|
| | HAr | L | Ar¹ | Ar² |
| 1-5 | 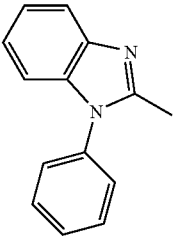 | 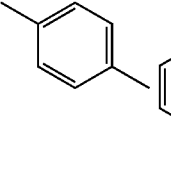 | 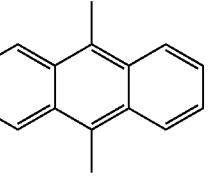 | 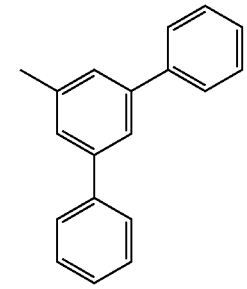 |
| 1-6 | 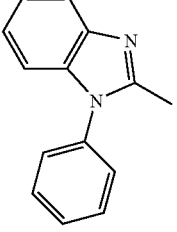 | 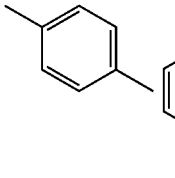 | 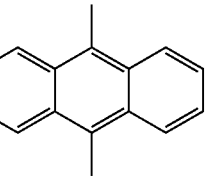 | 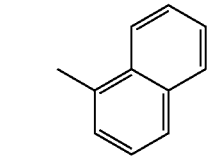 |
| 1-7 | 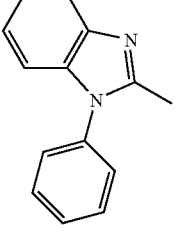 | 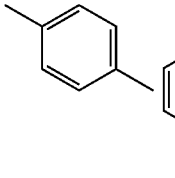 | 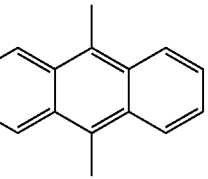 | 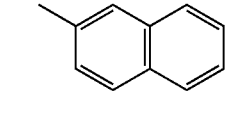 |
| 1-8 | 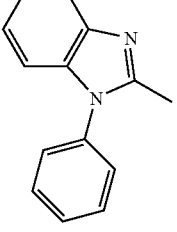 | 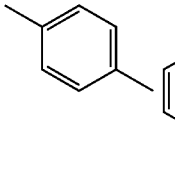 | 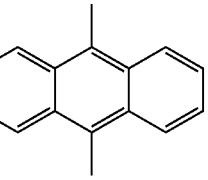 | 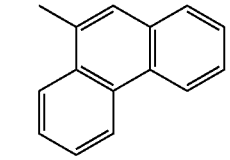 |
| 1-9 | 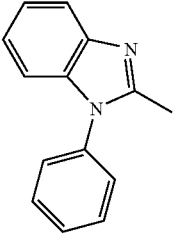 | 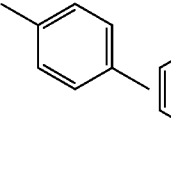 | 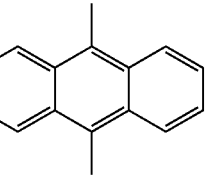 | 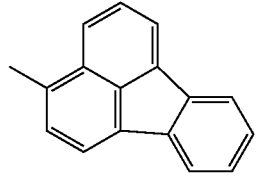 |

TABLE 2
| No. of Compound A | HAr | L | Ar¹ | Ar² |
|---|---|---|---|---|
| 1-10 | 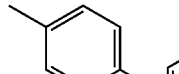 | 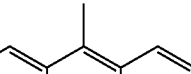 | 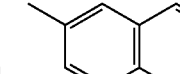 |  |
| 1-11 | 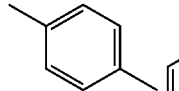 | 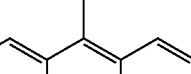 | 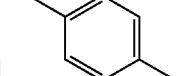 |  |
| 1-12 | 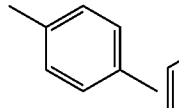 | 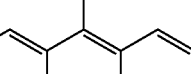 | 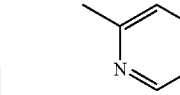 |  |
| 1-13 | 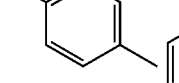 | 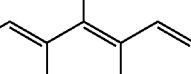 | 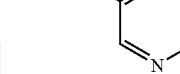 |  |
| 1-14 | 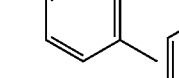 | 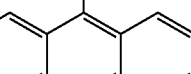 | 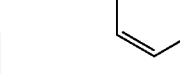 |  |
| 1-15 | 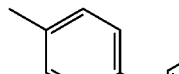 | 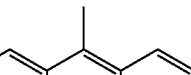 |  |  |

TABLE 3
| No. of Compound A | HAr | L | Ar¹ | Ar² |
|---|---|---|---|---|
| 2-1 | 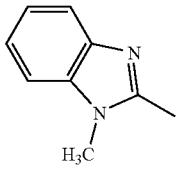 | 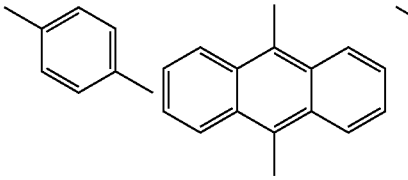 | 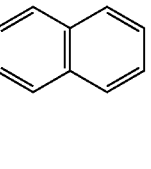 | 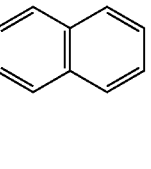 |
| 2-2 | 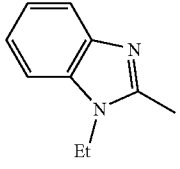 | 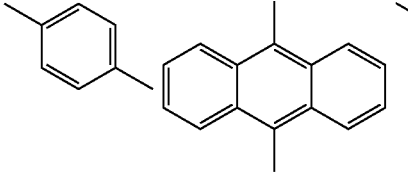 | 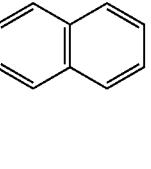 | 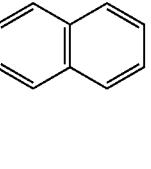 |
| 2-3 | 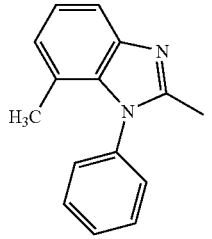 | 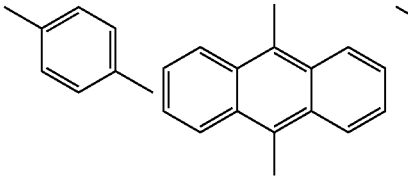 | 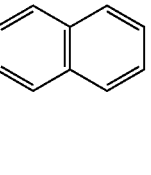 | 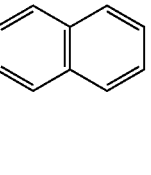 |
| 2-4 | 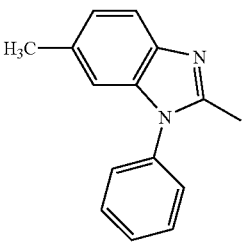 | 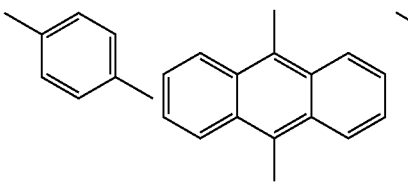 | 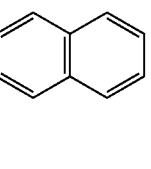 | 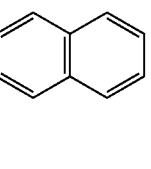 |
| 2-5 | 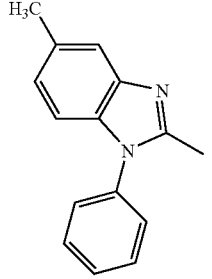 | 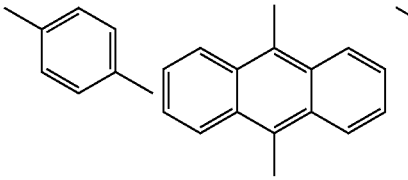 | 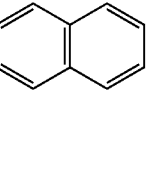 | 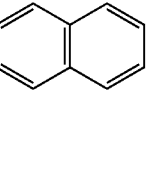 |

TABLE 3-continued
| No. of Compound A | HAr | L | Ar¹ | Ar² |
|---|---|---|---|---|
| 2-6 | 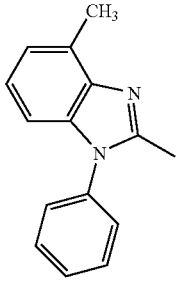 | 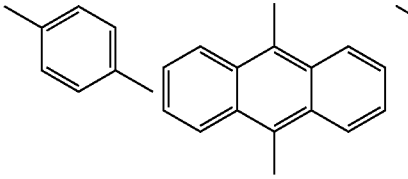 | 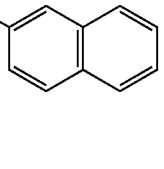 | 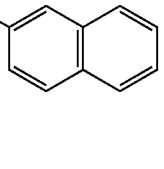 |
| 2-7 | 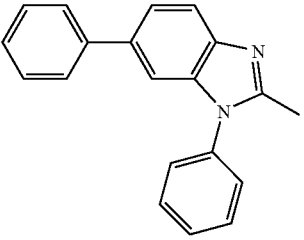 | 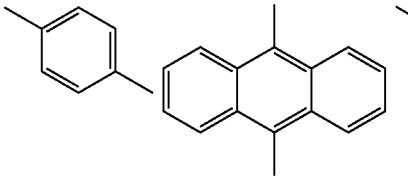 | 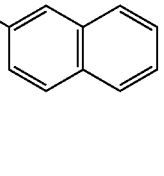 | 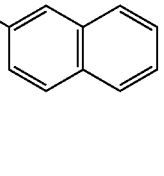 |
TABLE 4
| No. of Compound A | HAr | L | Ar¹ | Ar² |
|---|---|---|---|---|
| 2-8 | 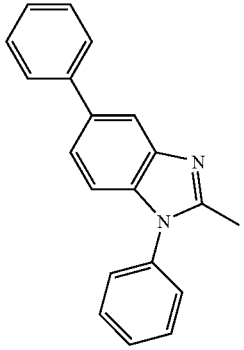 | 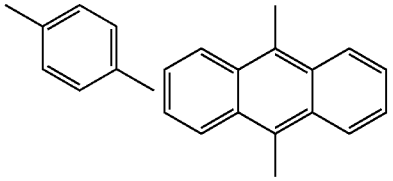 | 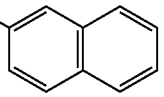 | 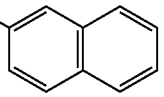 |
| 2-9 | 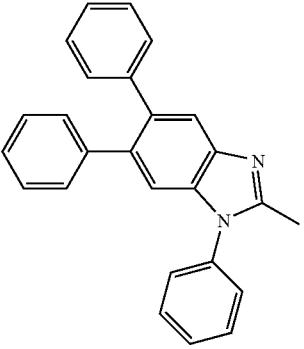 | 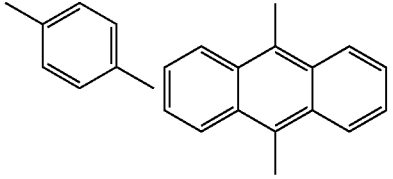 | 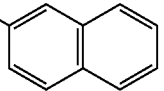 | 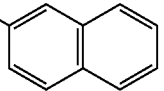 |

TABLE 5
| No. of Compound A | HAr-L-Ar¹-Ar² | | | |
|---|---|---|---|---|
| | HAr | L | Ar¹ | Ar² |
| 3-1 | 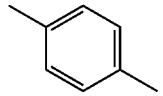 | 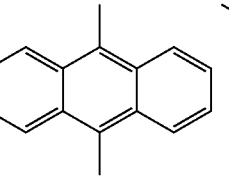 | 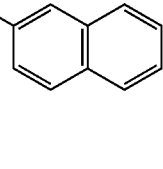 |  |
| 3-2 | 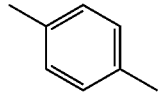 | 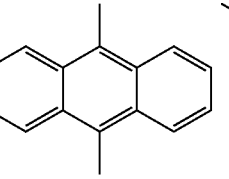 | 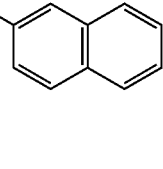 |  |
| 3-3 | 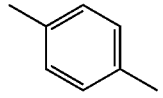 | 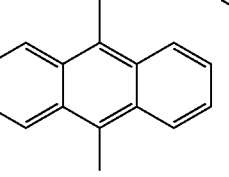 | 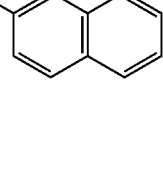 |  |
| 3-4 | 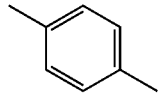 | 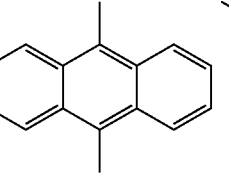 | 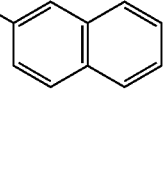 |  |
| 3-5 | 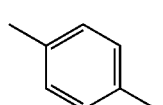 | 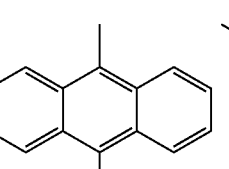 | 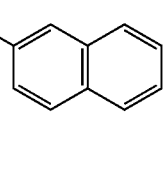 |  |

TABLE 5-continued

| No. of Compound A | HAr-L-Ar¹-Ar² | | | |
|---|---|---|---|---|
| | HAr | L | Ar¹ | Ar² |
| 3-6 | (2-methylbenzimidazole-N-quinoline) | p-phenylene | 9,10-dimethylanthracene | 2-naphthyl |

TABLE 6

| No. of Compound A | HAr-L-Ar¹-Ar² | | | |
|---|---|---|---|---|
| | HAr | L | Ar¹ | Ar² |
| 4-1 | 1-phenyl-2-methylbenzimidazole | — | 9,10-dimethylanthracene | 2-naphthyl |
| 4-2 | 1-phenyl-2-methylbenzimidazole | m-phenylene | 9,10-dimethylanthracene | 2-naphthyl |
| 4-3 | 1-phenyl-2-methylbenzimidazole | o-phenylene | 9,10-dimethylanthracene | 2-naphthyl |
| 4-4 | 1-phenyl-2-methylbenzimidazole | pyridinediyl | 9,10-dimethylanthracene | 2-naphthyl |

TABLE 6-continued
| No. of Compound A | HAr-L-Ar¹-Ar² | | | |
|---|---|---|---|---|
| | HAr | L | Ar¹ | Ar² |
| 4-5 | 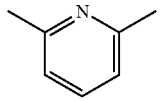 | 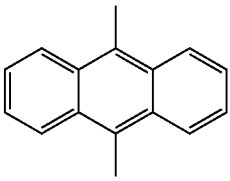 | 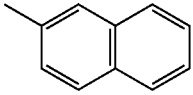 | 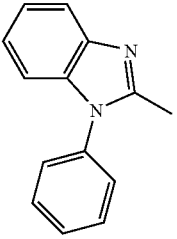 |
| 4-6 | 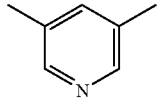 | 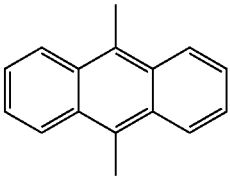 | 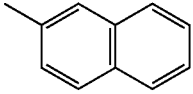 | 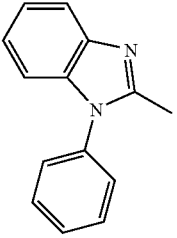 |
| 4-7 | 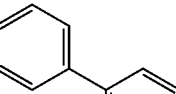 | 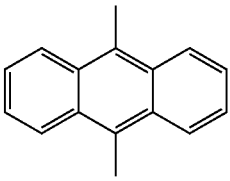 | 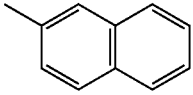 | 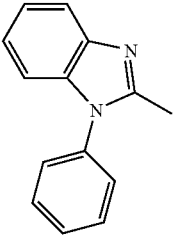 |
| 4-8 | 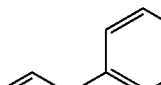 | 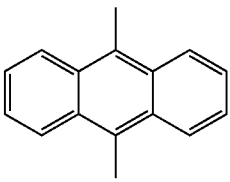 | 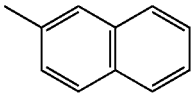 | 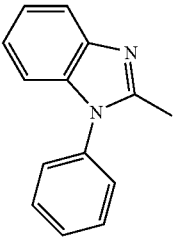 |
| 4-9 | 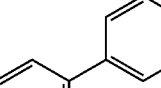 | 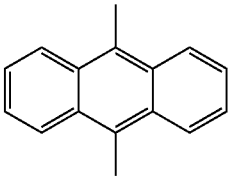 | 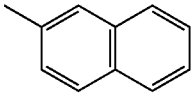 | 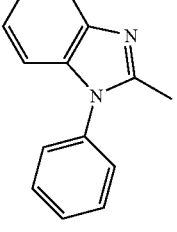 |

TABLE 7

| No. of Compound A | HAr-L-Ar¹-Ar² | | | |
|---|---|---|---|---|
| | HAr | L | Ar¹ | Ar² |
| 4-10 | benzimidazole, N-phenyl, 2-yl | 1,4-naphthylene | 9,10-anthrylene | 2-naphthyl |
| 4-11 | benzimidazole, N-phenyl, 2-yl | 2,6-naphthylene | 9,10-anthrylene | 2-naphthyl |
| 4-12 | benzimidazole, N-phenyl, 2-yl | 9,10-anthrylene | 9,10-anthrylene | 2-naphthyl |

TABLE 8

| No. of Compound A | HAr-L-Ar¹-Ar² | | | |
|---|---|---|---|---|
| | HAr | L | Ar¹ | Ar² |
| 5-1 | benzimidazole, N-phenyl, 2-yl | 1,4-phenylene | 2-methyl-9,10-anthrylene | 2-naphthyl |
| 5-2 | benzimidazole, N-phenyl, 2-yl | 1,4-phenylene | 2-tert-butyl-9,10-anthrylene | 2-naphthyl |

TABLE 8-continued
| No. of Compound A | HAr-L-Ar¹-Ar² | | | |
|---|---|---|---|---|
| | HAr | L | Ar¹ | Ar² |
| 5-3 | 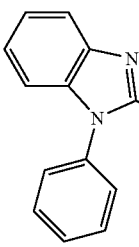 | 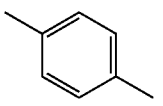 | 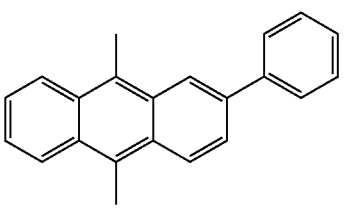 | 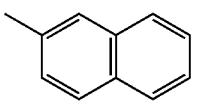 |
| 5-4 | 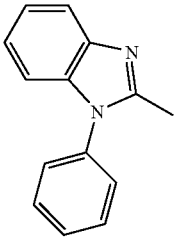 | 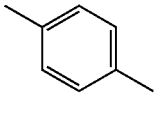 | 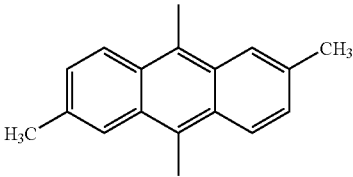 | 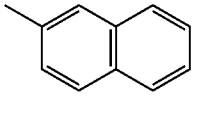 |
| 5-5 | 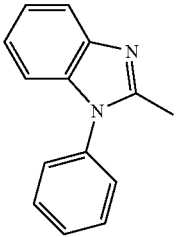 | 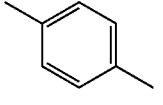 | 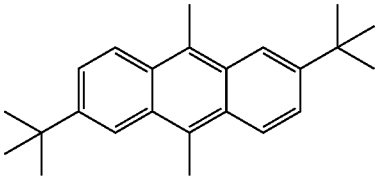 | 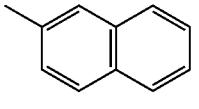 |
| 5-6 | 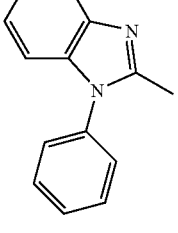 | 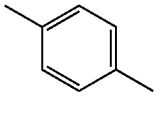 | 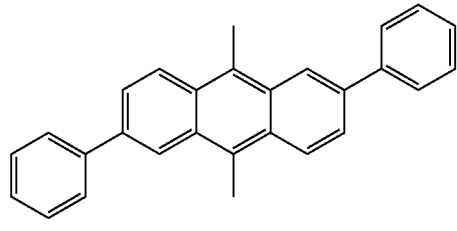 | 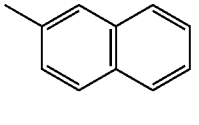 |
TABLE 9
| No. of Compound A | HAr-L-Ar¹-Ar² | | | |
|---|---|---|---|---|
| | HAr | L | Ar¹ | Ar² |
| 6-1 | 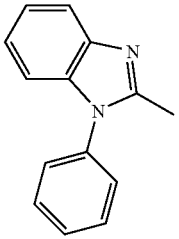 | 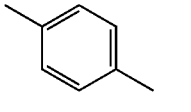 | 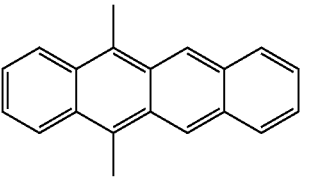 | 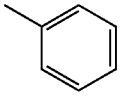 |

TABLE 9-continued
| No. of Compound A | HAr-L-Ar¹-Ar² | | | |
|---|---|---|---|---|
| | HAr | L | Ar¹ | Ar² |
| 6-2 | 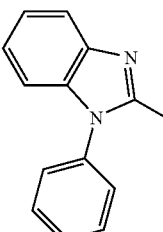 | 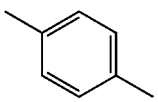 | 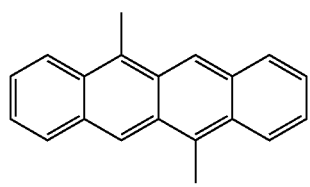 | 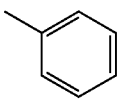 |
| 6-3 | 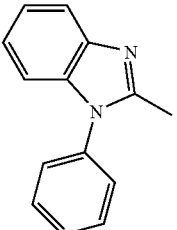 | 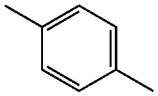 | 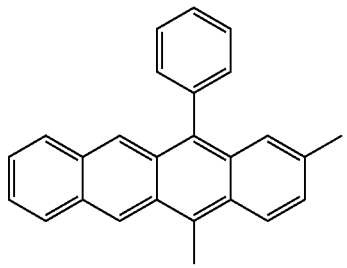 | 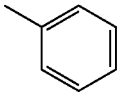 |
| 6-4 | 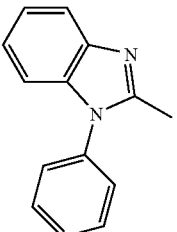 | 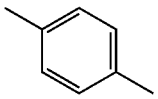 | 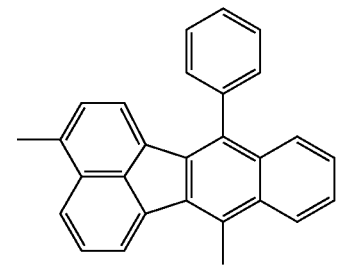 | 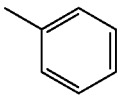 |
| 6-5 | 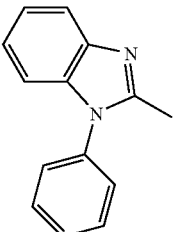 | 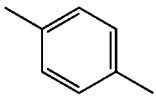 | 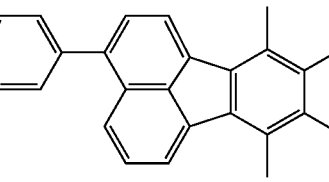 | 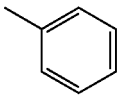 |
TABLE 10
| No. of Compound A | HAr-L-Ar¹-Ar² | | | |
|---|---|---|---|---|
| | HAr | L | Ar¹ | Ar² |
| 7-1 | 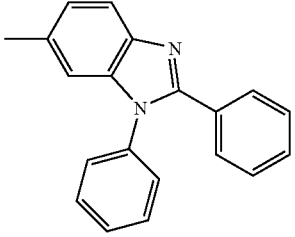 | 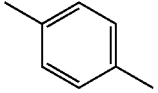 | 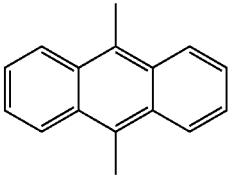 | 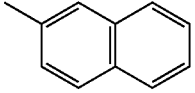 |

TABLE 10-continued

| No. of Compound A | HAr | L | Ar¹ | Ar² |
|---|---|---|---|---|
| 7-2 | | | | |
| 7-3 | | | | |
| 7-4 | | | | |
| 7-5 | | | | |
| 7-6 | | | | |
| 7-7 | | | | |

(HAr-L-Ar¹-Ar²)

TABLE 10-continued
| No. of Compound A | HAr-L-Ar¹-Ar² | | | |
|---|---|---|---|---|
| | HAr | L | Ar¹ | Ar² |
| 7-8 | 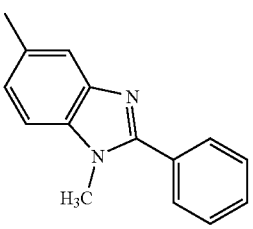 | 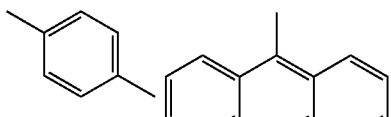 | 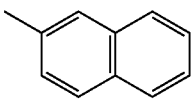 |  |
TABLE 11
| No. of Compound A | HAr-L-Ar¹-Ar² | | | |
|---|---|---|---|---|
| | HAr | L | Ar¹ | Ar² |
| 7-9 | 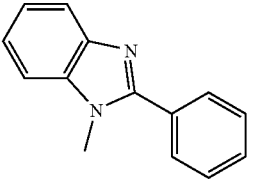 | 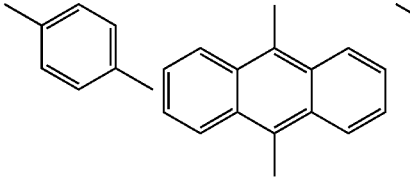 | 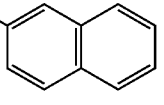 | 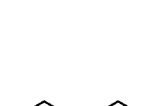 |
| 7-10 | 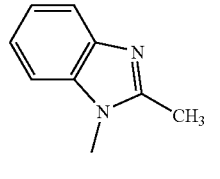 | 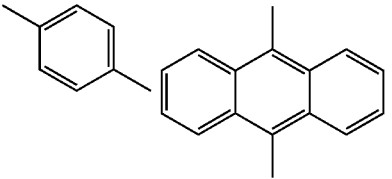 | 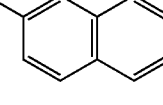 | 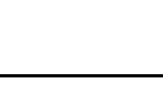 |
TABLE 12
| No. of Compound A | HAr-L-Ar¹-Ar² | | | |
|---|---|---|---|---|
| | HAr | L | Ar¹ | Ar² |
| 8-1 | 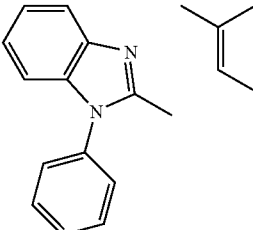 | 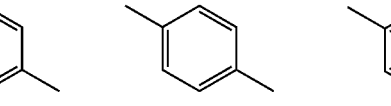 | 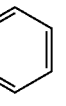 |  |
| 8-2 | 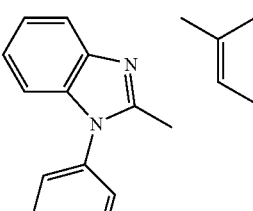 | 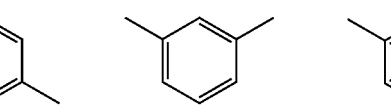 | 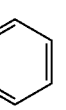 |  |

TABLE 12-continued
| No. of Compound A | HAr-L-Ar¹-Ar² | | | |
|---|---|---|---|---|
| | HAr | L | Ar¹ | Ar² |
| 8-3 | 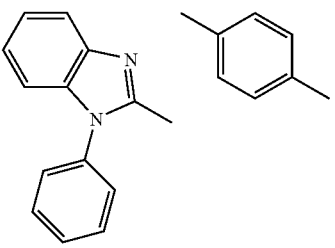 | 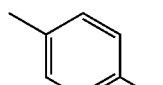 | 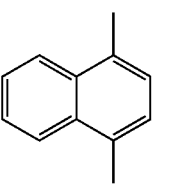 | 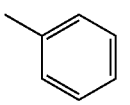 |
| 8-4 | 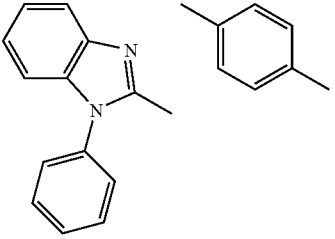 | 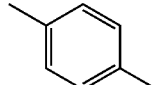 | 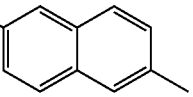 | 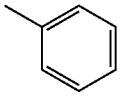 |
| 8-5 | 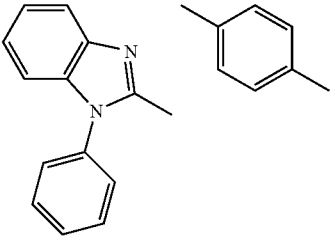 | 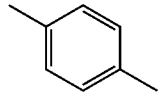 | 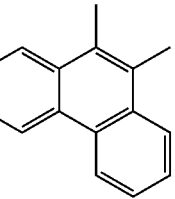 | 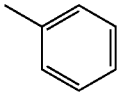 |
| 8-6 | 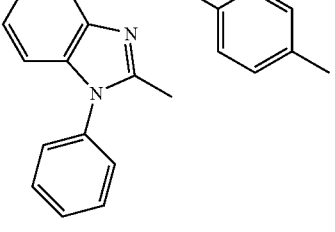 | 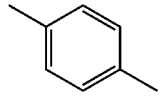 | 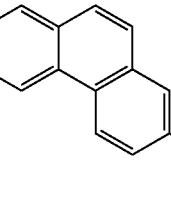 | 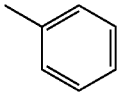 |
| 8-7 | 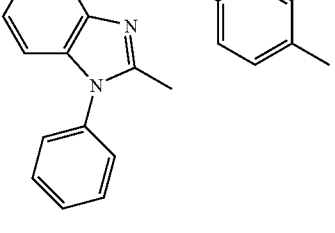 | 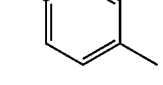 | 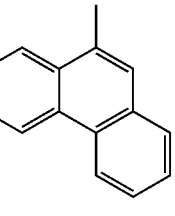 | 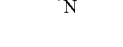 |
| 8-8 | 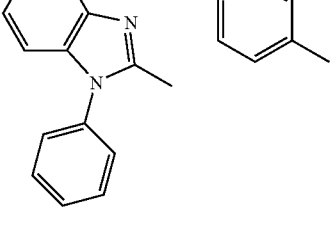 | 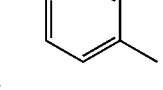 | 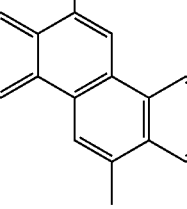 | 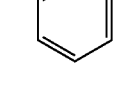 |

TABLE 12-continued
| No. of Compound A | HAr-L-Ar¹-Ar² | | | |
|---|---|---|---|---|
| | HAr | L | Ar¹ | Ar² |
| 8-9 | 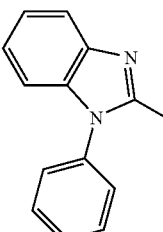 | 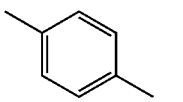 | 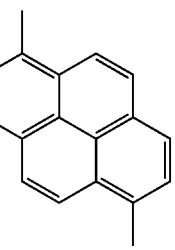 | 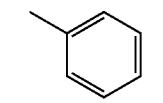 |
TABLE 13
| No. of Compound A | HAr-L-Ar¹-Ar² | | | |
|---|---|---|---|---|
| | HAr | L | Ar¹ | Ar² |
| 8-10 | 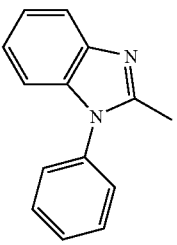 | 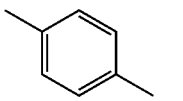 | 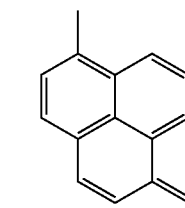 |  |
| 8-11 | 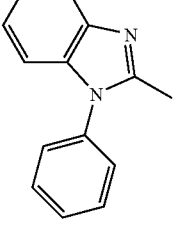 | 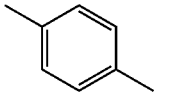 | 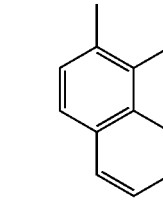 |  |
| 8-12 | 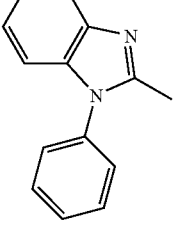 | 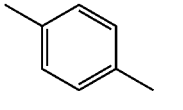 | 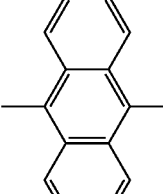 | 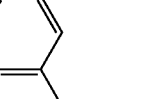 |
| 8-13 | 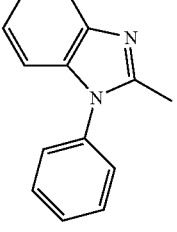 | 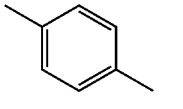 | 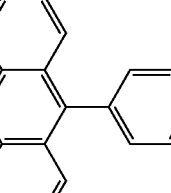 | 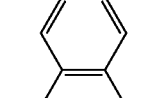 |

TABLE 14
| No. of Compound A | HAr-L-Ar¹-Ar² | | | |
|---|---|---|---|---|
| | HAr | L | Ar¹ | Ar² |
| 9-1 | 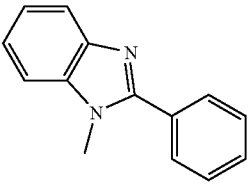 | 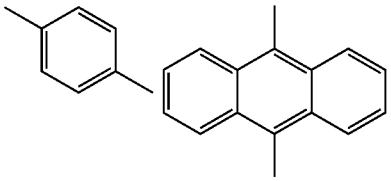 | 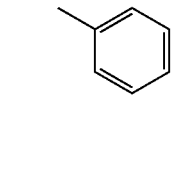 | 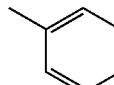 |
| 9-2 | 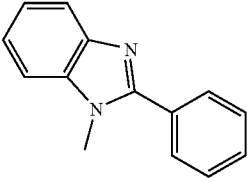 | 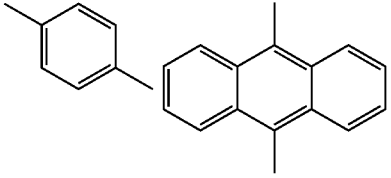 | 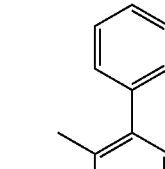 | 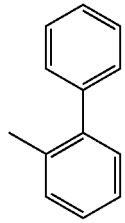 |
| 9-3 | 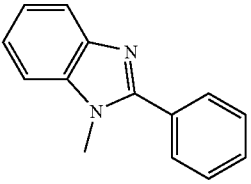 | 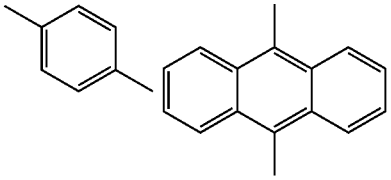 | 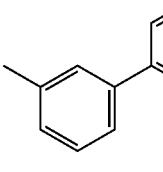 | 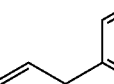 |
| 9-4 | 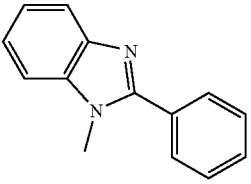 | 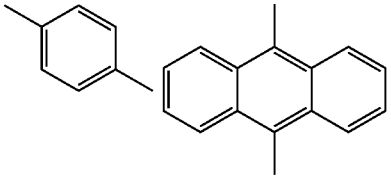 | 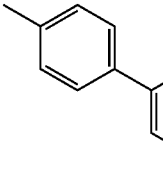 | 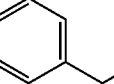 |
| 9-5 | 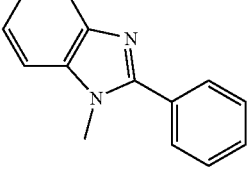 | 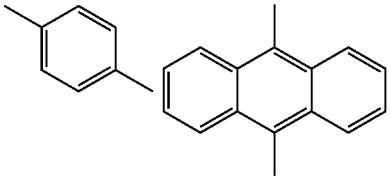 | 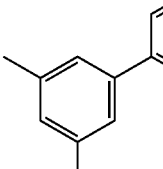 | 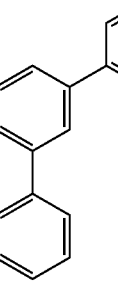 |
| 9-6 | 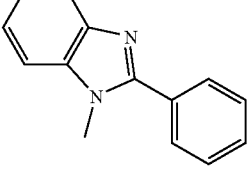 | 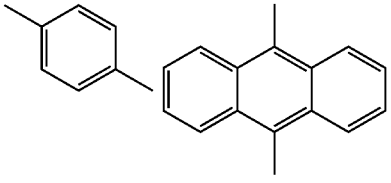 | 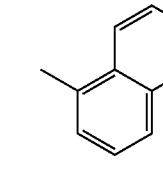 | 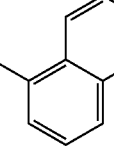 |
| 9-7 | 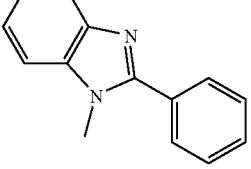 | 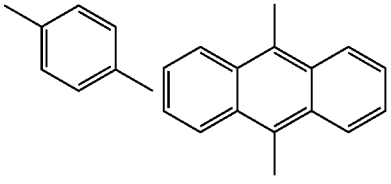 | 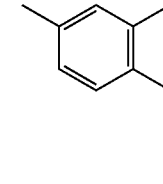 | 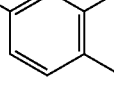 |

TABLE 14-continued

| No. of Compound A | HAr-L-Ar¹-Ar² | | | |
|---|---|---|---|---|
| | HAr | L | Ar¹ | Ar² |
| 9-8 | 1-methyl-2-phenyl-benzimidazole | p-phenylene | 9,10-dimethyl-anthracenyl | methyl-phenanthrenyl |
| 9-9 | 1-methyl-2-phenyl-benzimidazole | p-phenylene | 9,10-dimethyl-anthracenyl | fluoranthenyl |

TABLE 15

| No. of Compound A | HAr-L-Ar¹-Ar² | | | |
|---|---|---|---|---|
| | HAr | L | Ar¹ | Ar² |
| 9-10 | 1-methyl-2-phenyl-benzimidazole | p-phenylene | 9,10-dimethyl-anthracenyl | pyrenyl |
| 9-11 | 1-methyl-2-phenyl-benzimidazole | p-phenylene | 9,10-dimethyl-anthracenyl | 9,9-dimethylfluorenyl |
| 9-12 | 1-methyl-2-phenyl-benzimidazole | p-phenylene | 9,10-dimethyl-anthracenyl | 2-pyridyl |
| 9-13 | 1-methyl-2-phenyl-benzimidazole | p-phenylene | 9,10-dimethyl-anthracenyl | 3-pyridyl |
| 9-14 | 1-methyl-2-phenyl-benzimidazole | p-phenylene | 9,10-dimethyl-anthracenyl | 4-pyridyl |

TABLE 15-continued
| No. of Compound A | HAr-L-Ar¹-Ar² | | | |
|---|---|---|---|---|
| | HAr | L | Ar¹ | Ar² |
| 9-15 | 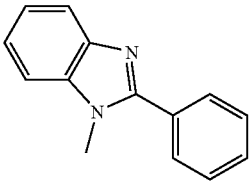 | 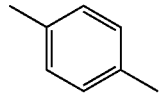 | 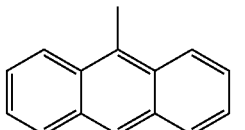 | 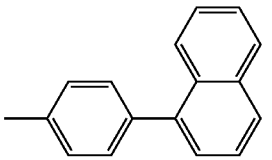 |
| 9-16 | 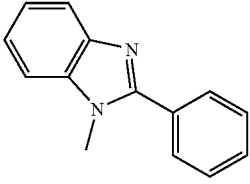 | 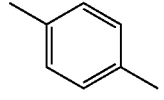 | 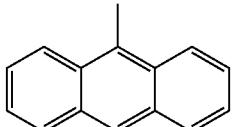 | 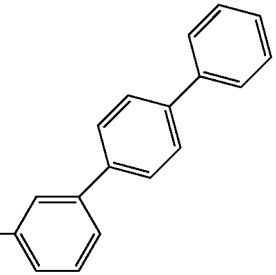 |
TABLE 16
| No. of Compound A | HAr-L-Ar¹-Ar² | | | |
|---|---|---|---|---|
| | HAr | L | Ar¹ | Ar² |
| 10-1 | 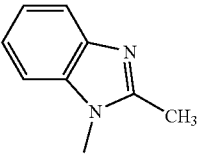 | 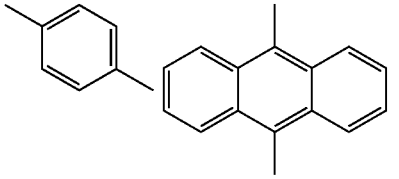 | 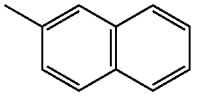 | 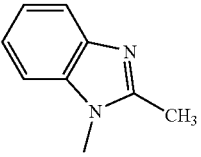 |
| 10-2 | 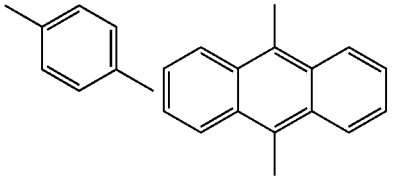 | 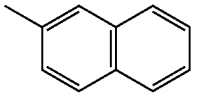 | 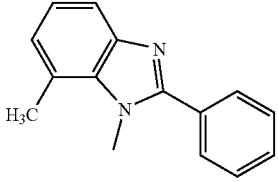 | 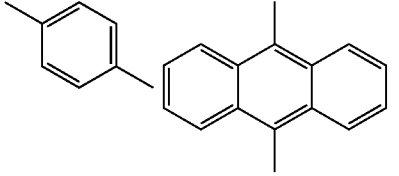 |
| 10-3 | 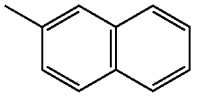 | | | |
| 10-4 | 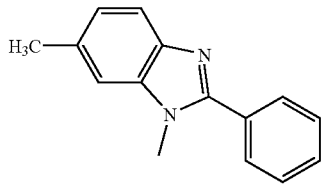 | 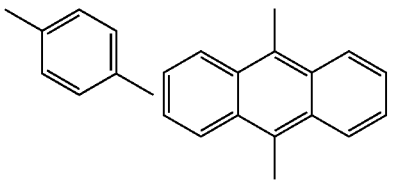 | 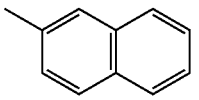 | |

TABLE 16-continued
| No. of Compound A | HAr | L | Ar¹ | Ar² |
|---|---|---|---|---|
| 10-5 | 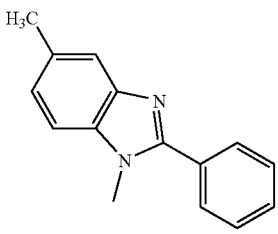 | 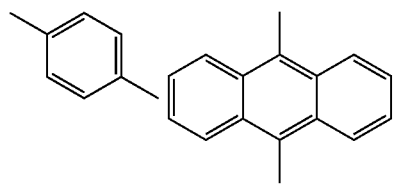 | 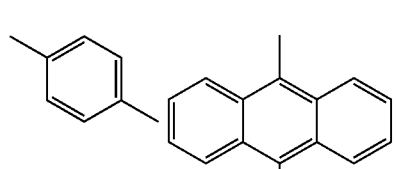 | 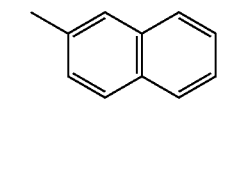 |
| 10-6 | 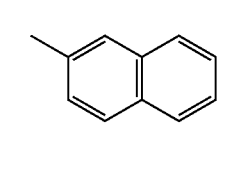 | 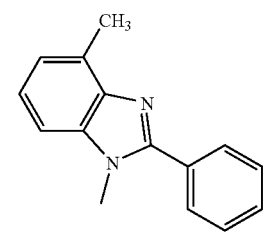 | 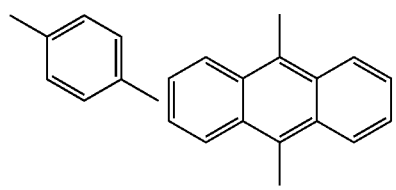 | 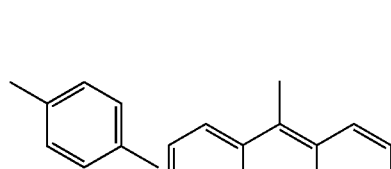 |
| 10-7 | 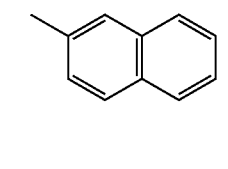 | 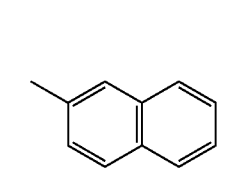 | 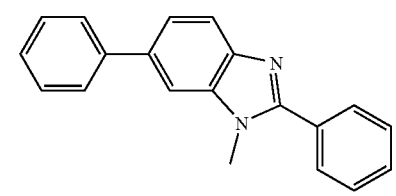 | 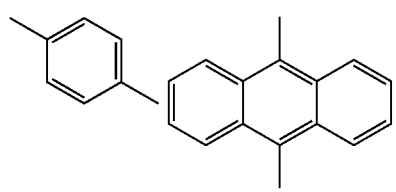 |
| 10-8 | 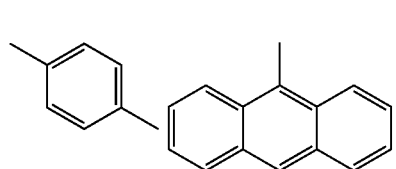 | 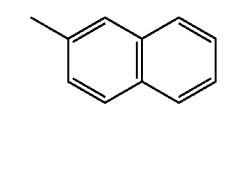 | 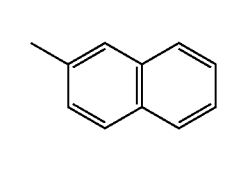 | 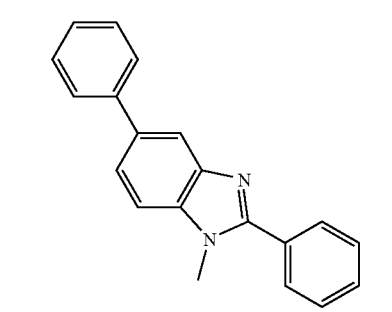 |
| 10-9 | 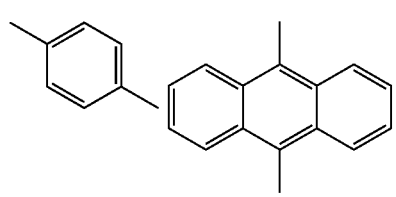 | 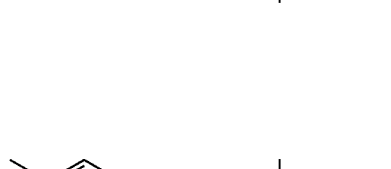 | 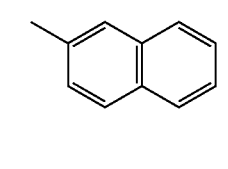 | 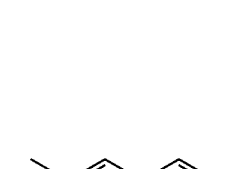 |
| 10-10 | 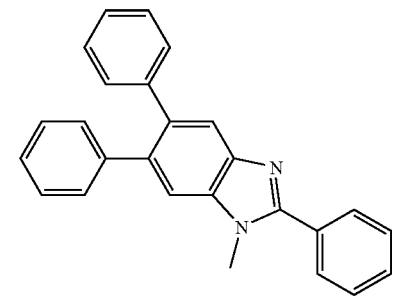 | 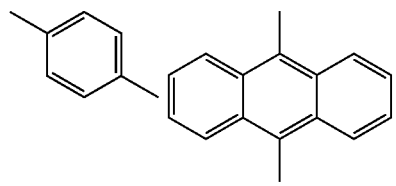 |  | 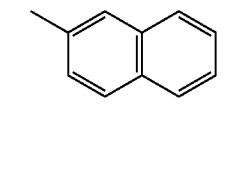 |

TABLE 17
| No. of Compound A | HAr-L-Ar¹-Ar² | | | |
|---|---|---|---|---|
| | HAr | L | Ar¹ | Ar² |
| 10-11 | 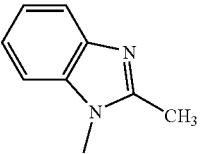 | 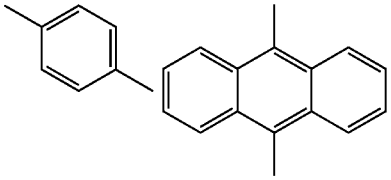 | 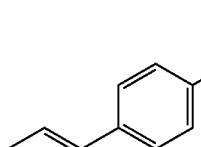 | 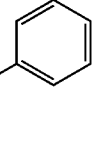 |
| 10-12 | 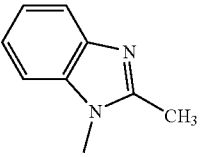 | 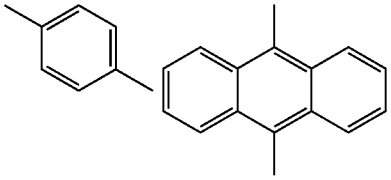 | 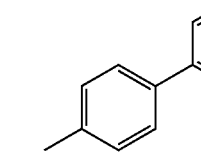 | 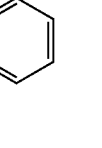 |
TABLE 18
| No. of Compound A | HAr-L-Ar¹—Ar² | | | |
|---|---|---|---|---|
| | HAr | L | Ar¹ | Ar² |
| 11-1 | 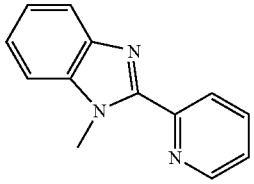 | 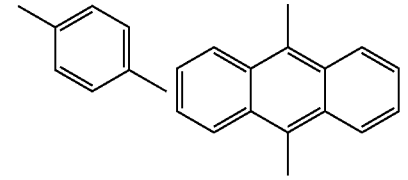 | 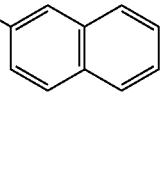 | 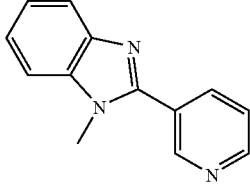 |
| 11-2 | 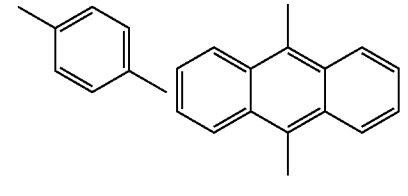 | 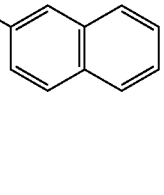 | 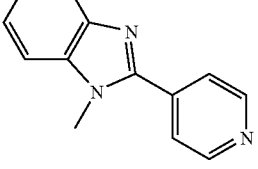 | 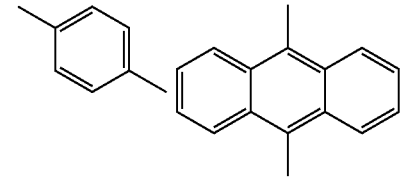 |
| 11-3 | 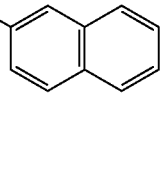 | | | |
| 11-4 | 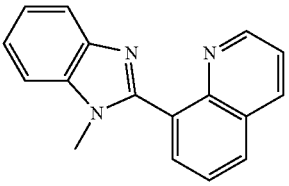 | 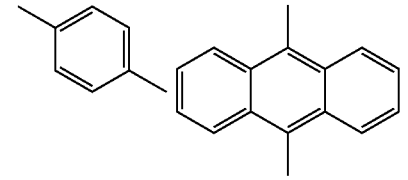 | 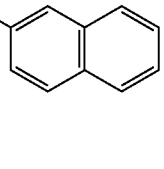 | |

TABLE 18-continued

| No. of Compound A | HAr | L | Ar¹ | Ar² |
|---|---|---|---|---|
| 11-5 | 1-methyl-2-(quinolin-2-yl)benzimidazole | 1,4-phenylene | 9,10-disubstituted anthracene | 2-naphthyl |
| 11-6 | 1-methyl-2-(quinolin-3-yl)benzimidazole | 1,4-phenylene | 9,10-disubstituted anthracene | 2-naphthyl |

TABLE 19

| No. of Compound A | HAr | L | Ar¹ | Ar² |
|---|---|---|---|---|
| 12-1 | 1-methyl-2-phenylbenzimidazole | — | 9,10-disubstituted anthracene | 2-naphthyl |
| 12-2 | 1-methyl-2-phenylbenzimidazole | 1,3-phenylene | 9,10-disubstituted anthracene | 2-naphthyl |
| 12-3 | 1-methyl-2-phenylbenzimidazole | 1,2-phenylene | 9,10-disubstituted anthracene | 2-naphthyl |
| 12-4 | 1-methyl-2-phenylbenzimidazole | 2,5-pyridinediyl | 9,10-disubstituted anthracene | 2-naphthyl |

TABLE 19-continued
| No. of Compound A | HAr | L | Ar¹ | Ar² |
|---|---|---|---|---|
| 12-5 | 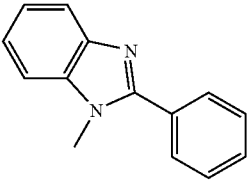 | 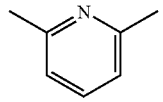 | 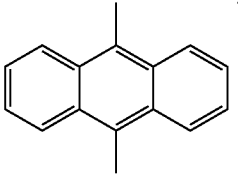 | 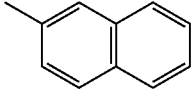 |
| 12-6 | 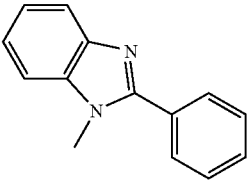 | 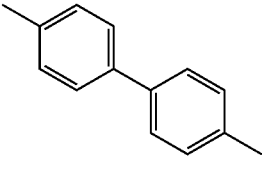 | 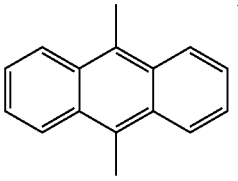 | 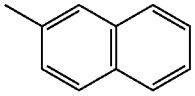 |
| 12-7 | 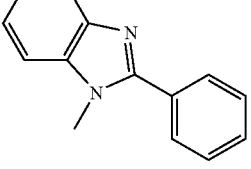 | 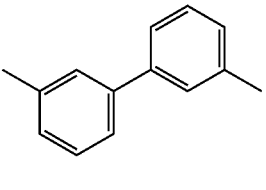 | 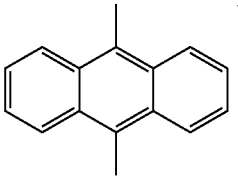 | 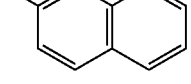 |
| 12-8 | 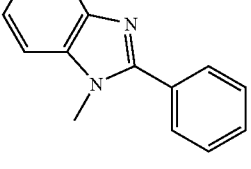 | 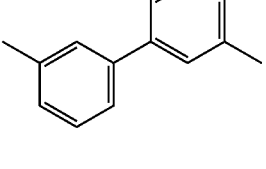 | 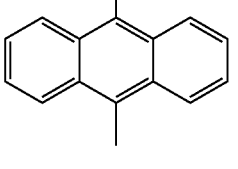 | 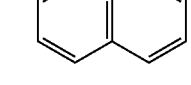 |
| 12-9 | 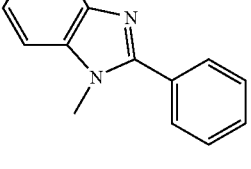 | 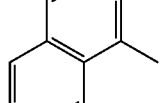 | 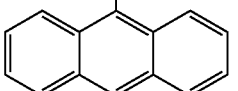 | 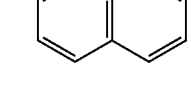 |
| 12-10 | 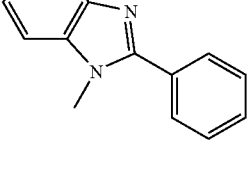 | 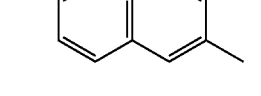 | 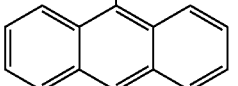 | 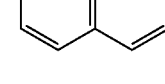 |
| 12-11 | 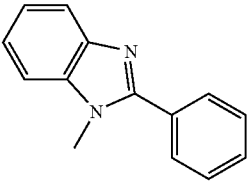 | 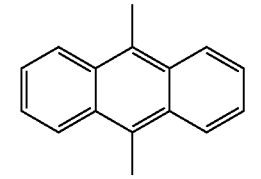 | 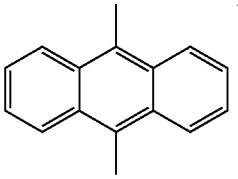 | 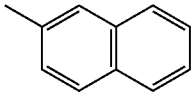 |

TABLE 20
| No. of Compound A | HAr-L-Ar¹—Ar² | | | |
|---|---|---|---|---|
| | HAr | L | Ar¹ | Ar² |
| 13-1 | 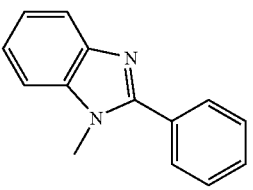 | 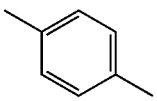 | 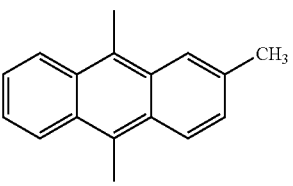 | 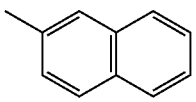 |
| 13-2 | 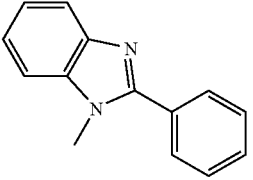 | 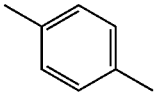 | 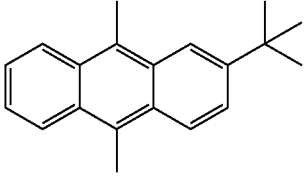 | 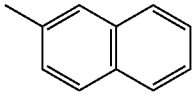 |
| 13-3 | 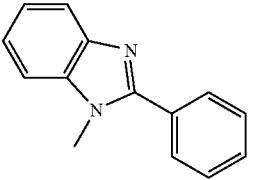 | 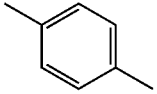 | 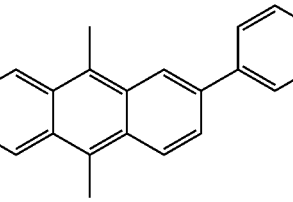 | 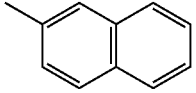 |
| 13-4 | 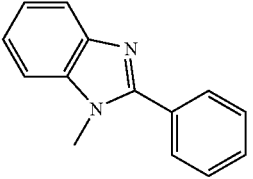 | 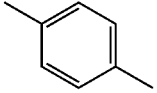 | 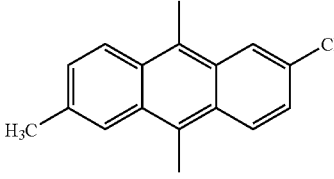 | 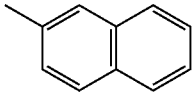 |
| 13-5 | 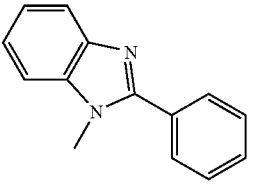 | 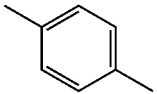 | 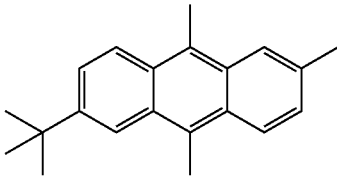 | 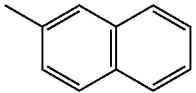 |
| 13-6 | 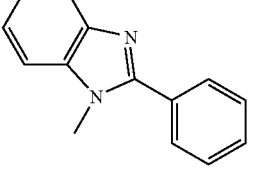 | 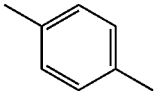 | 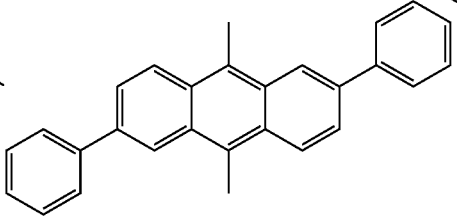 | 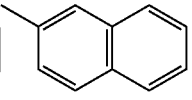 |

TABLE 21

| No. of Compound A | HAr | L | Ar¹ | Ar² |
|---|---|---|---|---|
| 14-1 | 1-methyl-2-phenyl-benzimidazole | 1,4-phenylene | 5,12-dimethyl-tetracene | phenyl |
| 14-2 | 1-methyl-2-phenyl-benzimidazole | 1,4-phenylene | 5,11-dimethyl-tetracene | phenyl |
| 14-3 | 1-methyl-2-phenyl-benzimidazole | 1,4-phenylene | 5-phenyl-7,12-dimethyl-tetracene | phenyl |
| 14-4 | 1-methyl-2-phenyl-benzimidazole | 1,4-phenylene | phenyl-dimethyl-fluoranthene derivative | phenyl |
| 14-5 | 1-methyl-2-phenyl-benzimidazole | 1,4-phenylene | phenyl-dimethyl-fluoranthene derivative | phenyl |

TABLE 22

| No. of Compound A | HAr | L | Ar¹ | Ar² |
|---|---|---|---|---|
| 15-1 | 5-methyl-1-phenyl-2-phenyl-benzimidazole | — | 9,10-dimethyl-anthracene | 3-methyl-naphthalen-2-yl |

TABLE 22-continued

| No. of Compound A | HAr | L | Ar¹ | Ar² |
|---|---|---|---|---|
| 15-2 | (5-methyl-1,2-diphenyl-benzimidazole) | — | 9,10-dimethylanthracene | 2-methylnaphthalene |
| 15-3 | (4-methyl-1,2-diphenyl-benzimidazole) | — | 9,10-dimethylanthracene | 2-methylnaphthalene |
| 15-4 | (7-methyl-1,2-diphenyl-benzimidazole) | — | 9,10-dimethylanthracene | 2-methylnaphthalene |
| 15-5 | (5,6-dimethyl-2-methyl-1-phenyl-benzimidazole) | — | 9,10-dimethylanthracene | 2-methylnaphthalene |
| 15-6 | (5,6-dimethyl-1-methyl-2-phenyl-benzimidazole) | — | 9,10-dimethylanthracene | 2-methylnaphthalene |
| 15-7 | (5-methyl-2-methyl-1-phenyl-benzimidazole) | — | 9,10-dimethylanthracene | 2-methylnaphthalene |

TABLE 22-continued

| No. of Compound A | HAr | L | Ar¹ | Ar² |
|---|---|---|---|---|
| 15-8 | | | | |
| 15-9 | | | | |
| 15-10 | | | | |

TABLE 23

| No. of Compound A | HAr | L | Ar¹ | Ar² |
|---|---|---|---|---|
| 16-1 | | | | |
| 16-2 | | | | |

TABLE 23-continued

| No. of Compound A | HAr | L | Ar¹ | Ar² |
|---|---|---|---|---|
| 16-3 | 6-methyl-1-phenyl-2-(pyridin-3-yl)benzimidazole | — | 9,10-disubstituted anthracene | 2-naphthyl |
| 16-4 | 5-methyl-1-phenyl-2-(pyridin-3-yl)benzimidazole | — | 9,10-disubstituted anthracene | 2-naphthyl |
| 16-5 | 6-methyl-1-phenyl-2-(pyridin-4-yl)benzimidazole | — | 9,10-disubstituted anthracene | 2-naphthyl |
| 16-6 | 5-methyl-1-phenyl-2-(pyridin-4-yl)benzimidazole | — | 9,10-disubstituted anthracene | 2-naphthyl |
| 16-7 | 1,2,6-trimethylbenzimidazole | — | 9,10-disubstituted anthracene | 2-naphthyl |
| 16-8 | 1,2,5-trimethylbenzimidazole | — | 9,10-disubstituted anthracene | 2-naphthyl |

TABLE 24

| No. of Compound A | HAr | L | Ar¹ | Ar² |
|---|---|---|---|---|
| 17-1 | | | | |
| 17-2 | | | | |
| 17-3 | | | | |
| 17-4 | | | | |
| 17-5 | | | | |

TABLE 24-continued
| No. of Compound A | HAr | L | Ar¹ | Ar² |
|---|---|---|---|---|
| 17-6 | 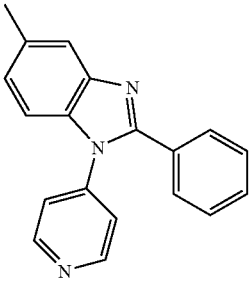 | 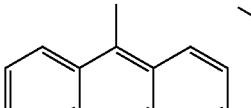 | 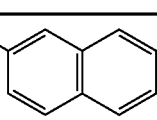 |  |
| 17-7 | 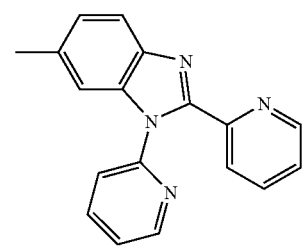 | 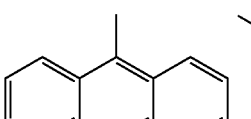 | 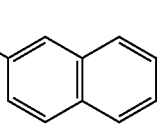 |  |
| 17-8 | 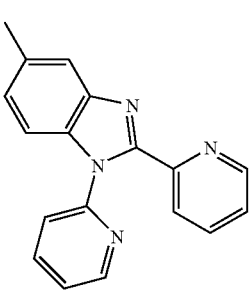 | 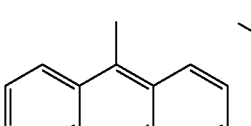 | 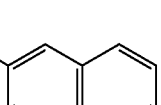 |  |
TABLE 25
| Comp'd No. | Structural formula |
|---|---|
| B-1 | 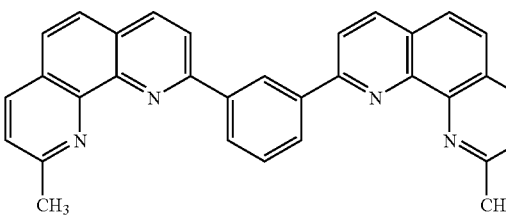 |
| B-2 | 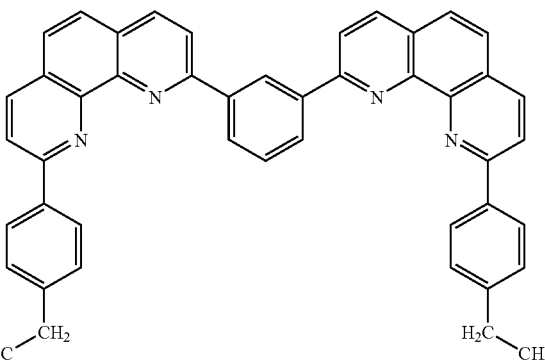 |

TABLE 25-continued
| Comp'd No. | Structural formula |
|---|---|
| B-3 | 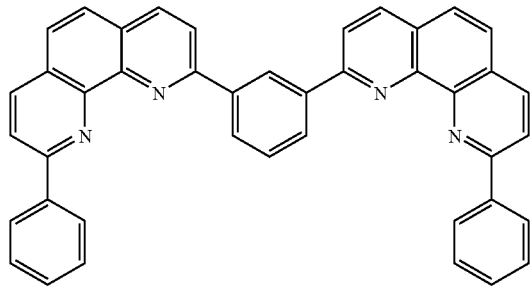 [SMILES: c1ccc(-c2ccc3ccc4ccc(-c5cccc(-c6ccc7ccc8ccc(-c9ccccc9)nc8c7n6)c5)nc4c3n2)cc1] |
| B-4 | 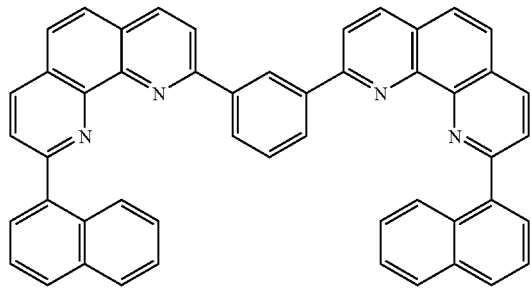 [SMILES: c1cc(-c2ccc3ccc4ccc(-c5cccc6ccccc56)nc4c3n2)cc(-c2ccc3ccc4ccc(-c5cccc6ccccc56)nc4c3n2)c1] |
| B-5 | 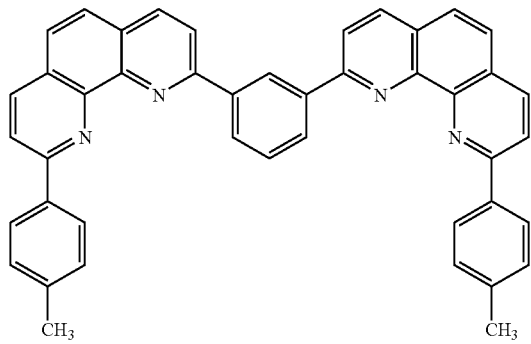 [SMILES: Cc1ccc(-c2ccc3ccc4ccc(-c5cccc(-c6ccc7ccc8ccc(-c9ccc(C)cc9)nc8c7n6)c5)nc4c3n2)cc1] |
| B-6 | 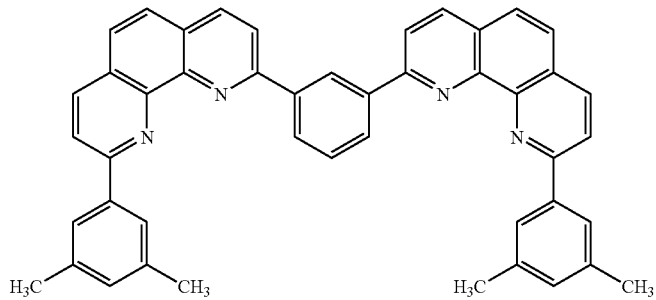 |

TABLE 25-continued

| Comp'd No. | Structural formula |
|---|---|
| B-7 | (structure) |
| B-8 | (structure) |

It is to be noted that the electron transport layer 14d can be a single layer consisting of a layer that contains a nitrogen-containing heterocycle derivative, can be a mixed layer containing two or more nitrogen-containing heterocycle derivatives, or can be a mixed layer of a nitrogen-containing heterocycle derivative and another compound. This another compound can be at least one compound selected from alkali metals, alkaline earth metals, rare earth metals, and their oxides, complex oxides, fluorides and carbonates. As an alternative, the electron transport layer 14d can be formed by stacking a plurality of layers, which contain nitrogen-containing heterocycle compounds, one over the other, or can be in a stacked structure of a layer with a nitrogen-containing heterocycle derivative contained therein and another layer containing a compound other than the nitrogen-containing heterocycle derivative. In this stacked structure, the layer of the compound other than the nitrogen-containing heterocycle derivative can be arranged on one side of the layer with the nitrogen-containing heterocycle derivative contained therein, said one side being on the side of the anode 13, or on the other side of the layer with the nitrogen-containing heterocycle derivative contained therein, said other side being on the side of the cathode 15.

A description will next be made about the configuration of the layers other than the electron transport layer 14d in the organic layer 14. As mentioned above, the electron supply layer composed of the electron transport layer 14d is formed thicker than the hole supply layer composed of the hole injection layer 14a and hole transport layer 14b. To balance the hole supply ability with the electron supply ability of the above-mentioned electron transport layer 14d, the hole injection layer 14a and hole transport layer 14b may preferably arranged with a total thickness of 60 nm or smaller.

As the hole injection layer 14a and hole transport layer 14b, general materials may be used. However, the use of compounds represented by the following formula (4), (5), (6) and (7) as hole-injecting and/or hole-transporting materials for the formation of these layers is preferred, because the supply of holes to the light-emitting layer 14c can be optimized relative to the supply of electrons to the above-mentioned electron transport layer 14d. Although these compounds can be used in one or both of the hole injection layer 14a and the hole transport layer 14b, the use of a compound of a composition having, a high nitrogen (N) content as the hole injection layer 14a is preferred because the barrier against the injection of holes from the anode 13 can be reduced. Since the injection of electrons is intensified in the configuration of the present invention, it is still more preferred to use an azatriphenylene derivative of high hole injection property at the interface with the anode from the standpoint of providing a good carrier balance.

Formula (4)

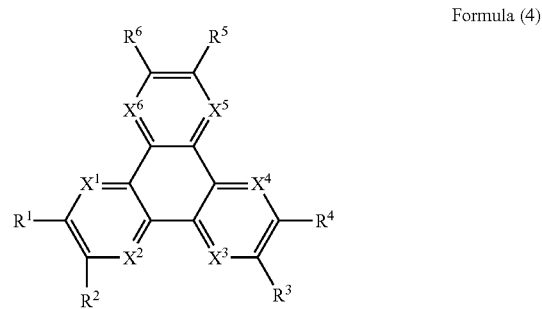

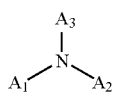

Formula (5)

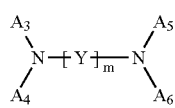

Formula (6)

In the formula (4) representing an azatriphenylene derivative, R1 to R6 each independently represent a hydrogen atom, or a substituent selected from halogen atoms, hydroxyl group, amino group, arylamino groups, substituted or unsubstituted carbonyl groups having 20 or fewer carbon atoms, substituted or unsubstituted carbonyl ester groups having 20 to fewer carbon atoms, substituted or unsubstituted alkyl groups having 20 or fewer carbon atoms, substituted or unsubstituted alkenyl groups having 20 or fewer carbon atoms, substituted or unsubstituted alkoxyl groups having 20 or fewer carbon atoms, substituted or unsubstituted aryl groups having 30 or fewer carbon atoms, substituted or unsubstituted heterocyclic groups having 30 or fewer carbon atoms, nitryl group, cyano group, nitro group and silyl group, and the adjacent Rms (m=1 to 6) may be fused together via the corresponding ring structures, respectively. Further, X1 to X6 each independently represent a carbon or nitrogen (N) atom. Especially when Xs are N atoms, these compounds have high N contents, and therefore, can be suitably used as the hole injection layer 14a.

Specific examples of the azatriphenylene derivatives include hexanitrylazatriphenylene represented by the following structural formula (1):

Structural Formula (1)

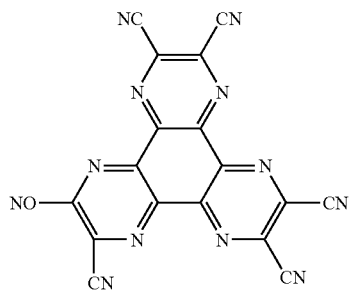

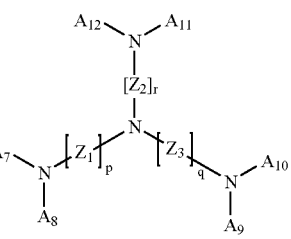

Formula (7)

In the formula (5) representing an amine derivative, A0 to A2 each independently represent a monovalent C6-30 aromatic hydrocarbon group, which may be unsubstituted or may have one or more substituents. These substituents can each be selected from a halogen atom or a hydroxyl, aldehyde, carbonyl, carbonyl ester, alkyl, alkenyl, cycloalkyl, alkoxy, aryl, amino, heterocyclic, cyano, nitryl, nitro or silyl group.

Specific examples of the amine derivative include the compounds C shown in Table 26 to Table 27.

TABLE 26

Compound No. C-1

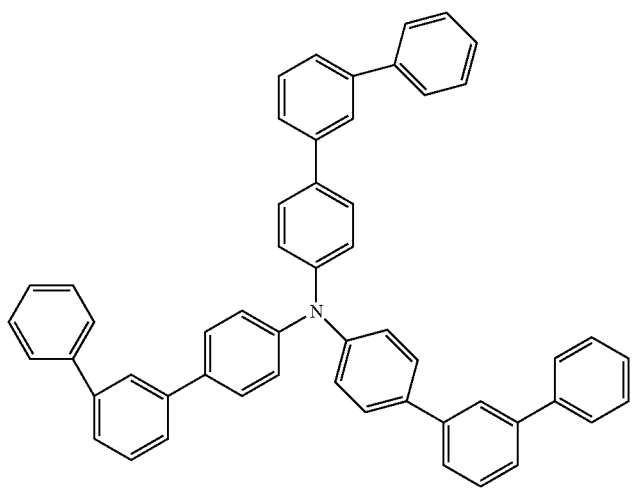 [SMILES: c1ccc(-c2cccc(-c3ccc(N(c4ccc(-c5cccc(-c6ccccc6)c5)cc4)c4ccc(-c5cccc(-c6ccccc6)c5)cc4)cc3)c2)cc1]

TABLE 26-continued
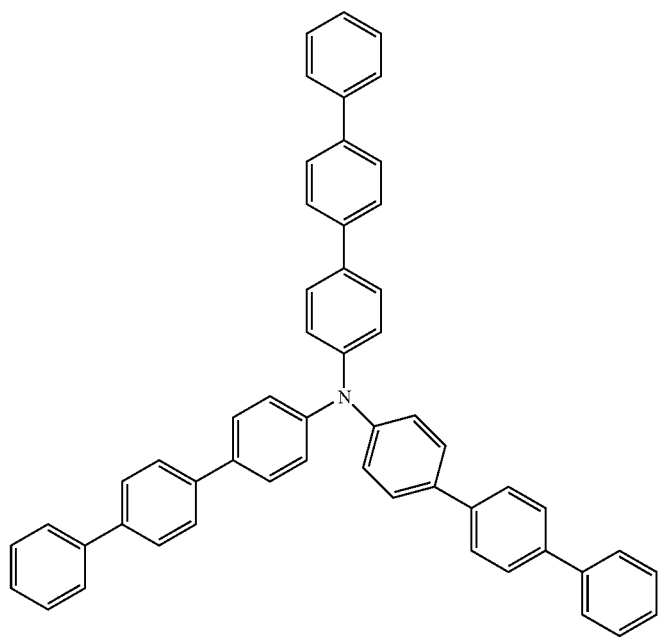 [SMILES: c1ccc(-c2ccc(-c3ccc(N(c4ccc(-c5ccc(-c6ccccc6)cc5)cc4)c4ccc(-c5ccc(-c6ccccc6)cc5)cc4)cc3)cc2)cc1]
C-2
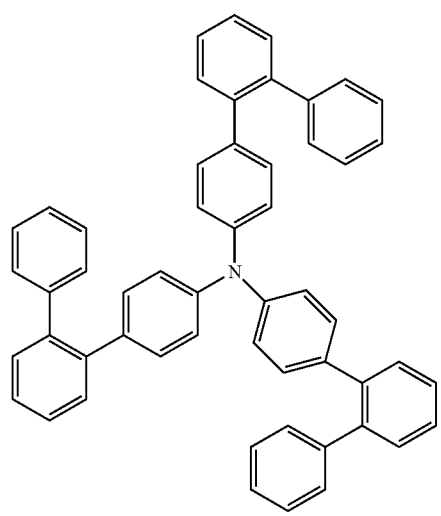 [SMILES: c1ccc(-c2ccccc2-c2ccc(N(c3ccc(-c4ccccc4-c4ccccc4)cc3)c3ccc(-c4ccccc4-c4ccccc4)cc3)cc2)cc1]
C-3

TABLE 26-continued
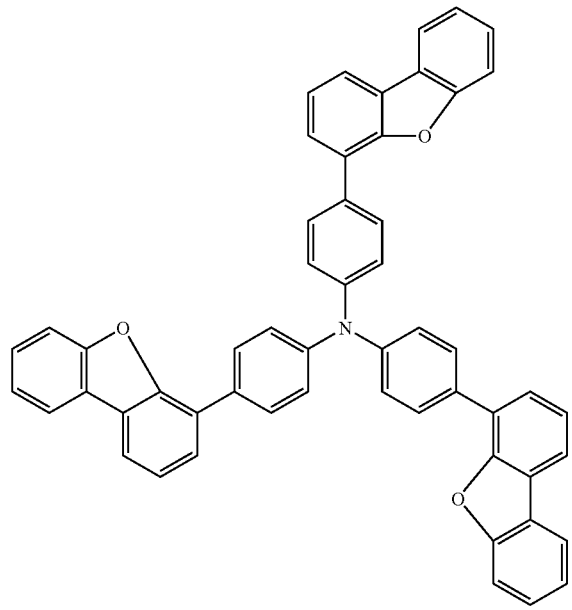 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]
C-4
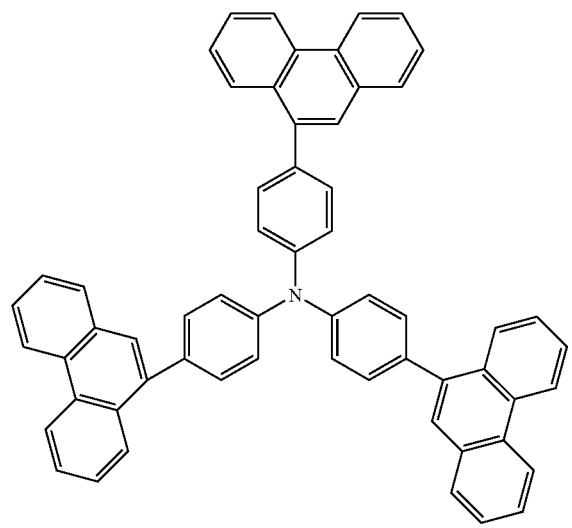 [SMILES: c1ccc2c(c1)cc(-c1ccc(N(c3ccc(-c4cc5ccccc5c5ccccc45)cc3)c3ccc(-c4cc5ccccc5c5ccccc45)cc3)cc1)c1ccccc12]
C-5

TABLE 26-continued
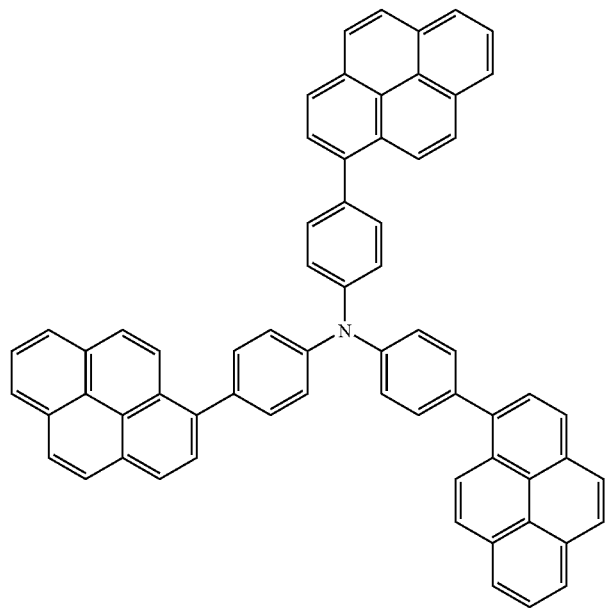 [SMILES: c1cc2ccc3ccc(-c4ccc(N(c5ccc(-c6ccc7ccc8cccc9ccc6c7c89)cc5)c5ccc(-c6ccc7ccc8cccc9ccc6c7c89)cc5)cc4)c4ccc(c1)c2c34]
C-6
TABLE 27
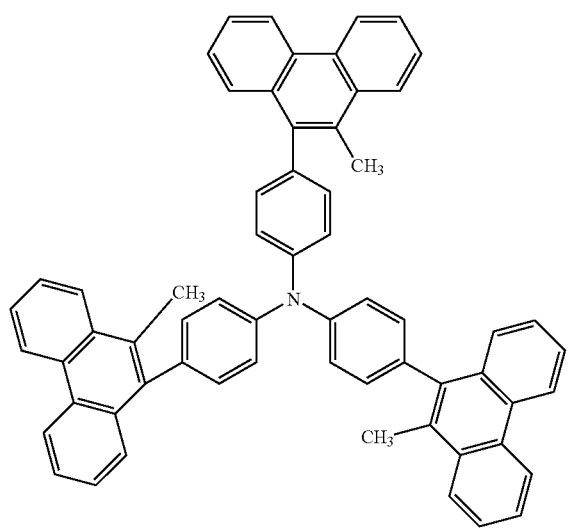 [SMILES: Cc1c(-c2ccc(N(c3ccc(-c4c(C)c5ccccc5c5ccccc45)cc3)c3ccc(-c4c(C)c5ccccc5c5ccccc45)cc3)cc2)c2ccccc2c2ccccc12]
Compound No. C-7

TABLE 27-continued

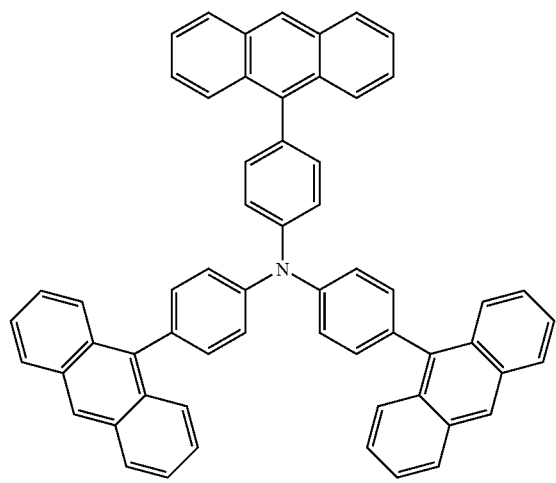 [SMILES: c1ccc2c(-c3ccc(N(c4ccc(-c5c6ccccc6cc6ccccc56)cc4)c4ccc(-c5c6ccccc6cc6ccccc56)cc4)cc3)c3ccccc3cc2c1]

C-8

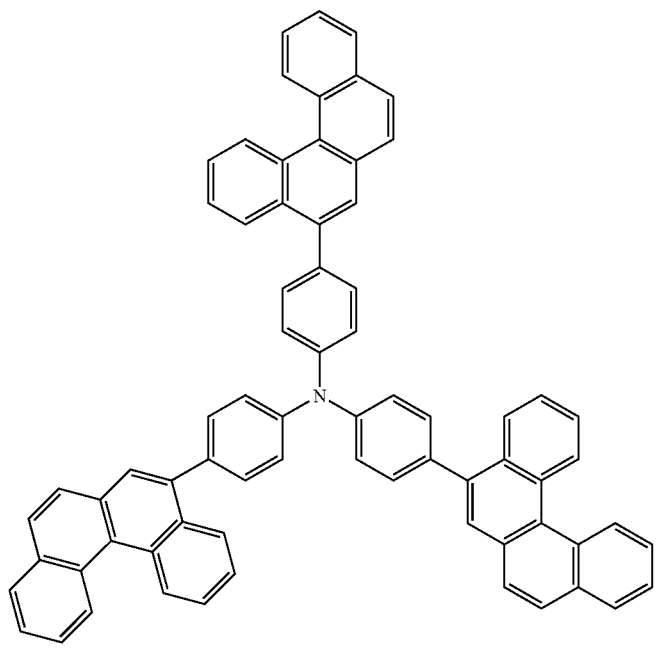

C-9

In the formula (6) representing a diamine derivative, A3 to A6 each independently represent a $C_6$-$C_{20}$ aromatic hydrocarbon group, which may be unsubstituted or may have one or more substituents. These substituents can each be selected from a halogen atom or a hydroxyl, aldehyde, carbonyl, carbonyl ester, alkyl, alkenyl, cycloalkyl, alkoxy, aryl, amino, heterocyclic, cyano, nitryl, nitro or silyl group. Further, A3 and A4 and A5 and A6 may be bonded together via connecting groups, respectively. Y represents a divalent aromatic hydrocarbon group, and may be selected from a phenylene, naphthylene, anthracenylene, phenanthrenylene, naphthacenylene, fluoranthenylene or perylenylene group, and m stands for an integer of 1 or greater. At one or more positions other than the N-bonding positions, Y may have a like number of substituents. These substituents can each be selected from a halogen atom or a hydroxyl, aldehyde, carbonyl, carbonyl ester, alkyl, alkenyl, cycloalkyl, alkoxy, aryl, amino, heterocyclic, cyano, nitryl, nitro or silyl group.

Usable specific examples of the diamine derivative include the compounds D shown in Table 28 to Table 31.

TABLE 28
Compound No. D-1
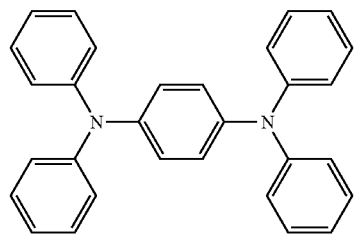 [SMILES: c1ccc(N(c2ccccc2)c2ccc(N(c3ccccc3)c3ccccc3)cc2)cc1]
D-2
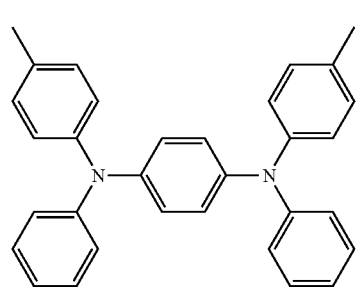 [SMILES: Cc1ccc(N(c2ccccc2)c2ccc(N(c3ccccc3)c3ccc(C)cc3)cc2)cc1]
D-3
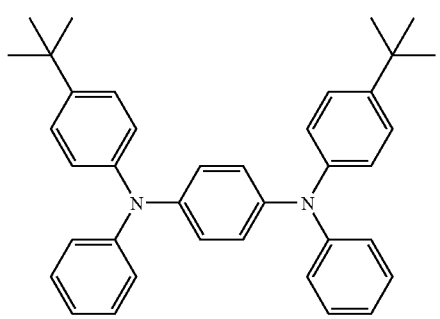 [SMILES: CC(C)(C)c1ccc(N(c2ccccc2)c2ccc(N(c3ccccc3)c3ccc(C(C)(C)C)cc3)cc2)cc1]
D-4
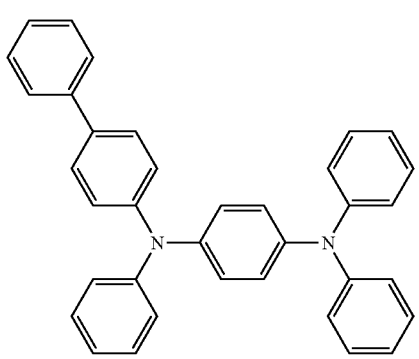 [SMILES: c1ccc(-c2ccc(N(c3ccccc3)c3ccc(N(c4ccccc4)c4ccccc4)cc3)cc2)cc1]
D-5
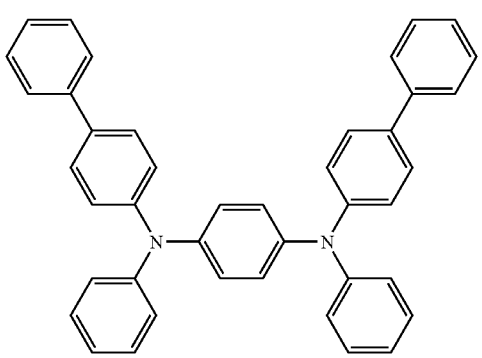 [SMILES: c1ccc(-c2ccc(N(c3ccccc3)c3ccc(N(c4ccccc4)c4ccc(-c5ccccc5)cc4)cc3)cc2)cc1]

TABLE 28-continued
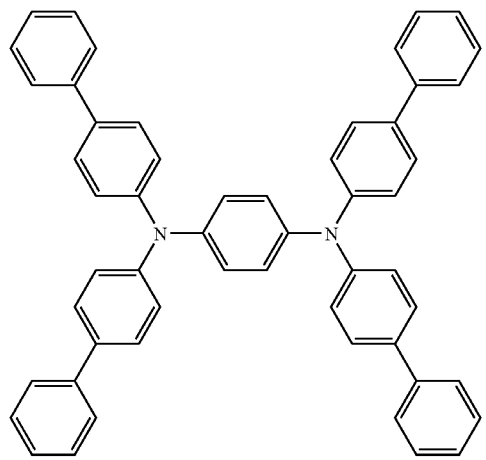 [SMILES: c1ccc(-c2ccc(N(c3ccc(-c4ccccc4)cc3)c3ccc(N(c4ccc(-c5ccccc5)cc4)c4ccc(-c5ccccc5)cc4)cc3)cc2)cc1]
D-6
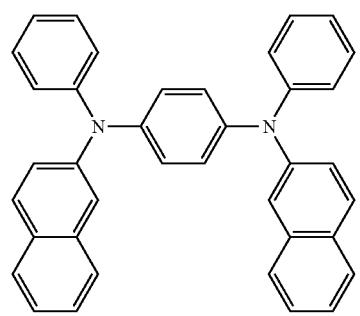 [SMILES: c1ccc(N(c2ccc(N(c3ccccc3)c3ccc4ccccc4c3)cc2)c2ccc3ccccc3c2)cc1]
D-7
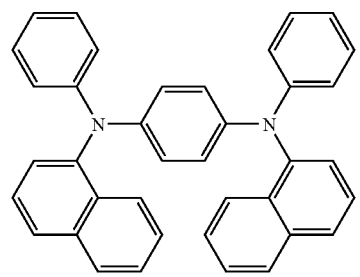 [SMILES: c1ccc(N(c2ccc(N(c3ccccc3)c3cccc4ccccc34)cc2)c2cccc3ccccc23)cc1]
D-8
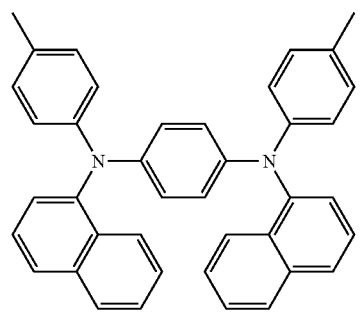 [SMILES: Cc1ccc(N(c2ccc(N(c3ccc(C)cc3)c3cccc4ccccc34)cc2)c2cccc3ccccc23)cc1]
D-9

TABLE 28-continued
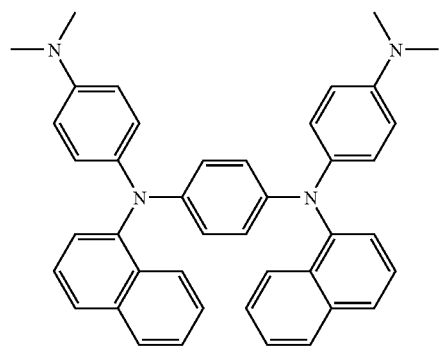
D-10
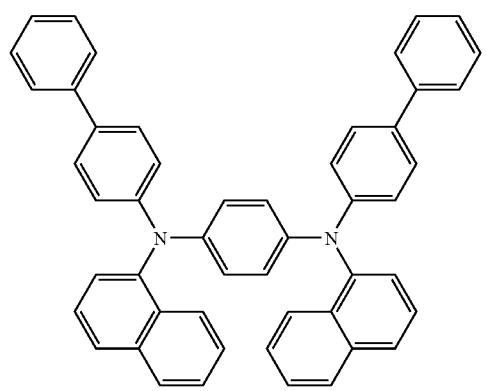 [SMILES: c1ccc(-c2ccc(N(c3ccc(N(c4ccc(-c5ccccc5)cc4)c4cccc5ccccc45)cc3)c3cccc4ccccc34)cc2)cc1]
D-11
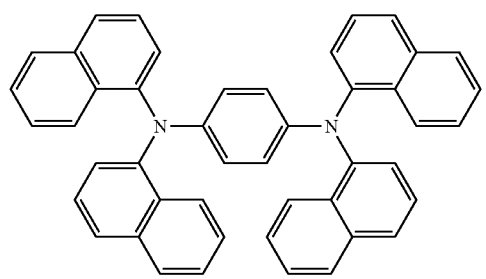 [SMILES: c1ccc2c(N(c3ccc(N(c4cccc5ccccc45)c4cccc5ccccc45)cc3)c3cccc4ccccc34)cccc2c1]
D-12
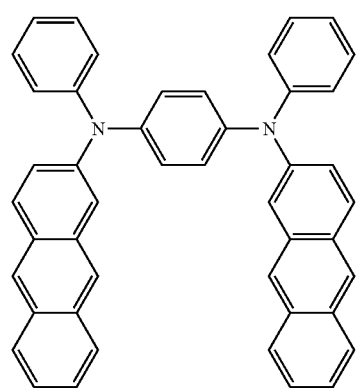 [SMILES: c1ccc(N(c2ccc(N(c3ccccc3)c3ccc4cc5ccccc5cc4c3)cc2)c2ccc3cc4ccccc4cc3c2)cc1]
D-13

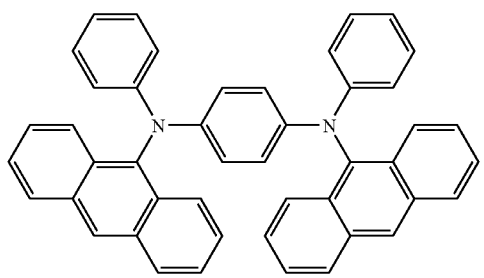 [SMILES: c1ccc(N(c2ccc(N(c3ccccc3)c3c4ccccc4cc4ccccc34)cc2)c2c3ccccc3cc3ccccc23)cc1]
D-14
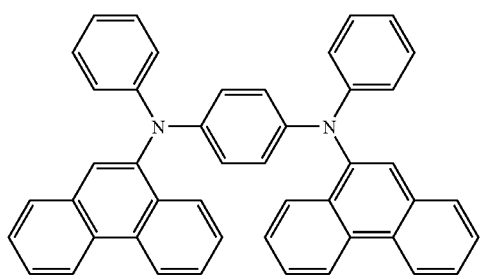 [SMILES: c1ccc(N(c2ccc(N(c3ccccc3)c3cc4ccccc4c4ccccc34)cc2)c2cc3ccccc3c3ccccc23)cc1]
D-15
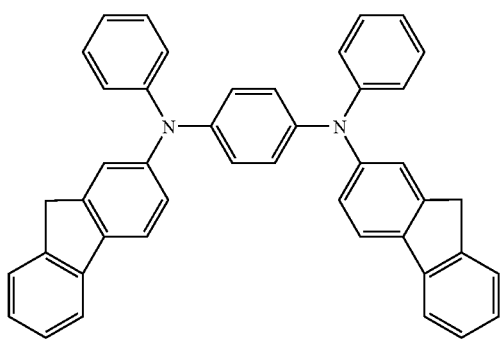 [SMILES: c1ccc(N(c2ccc(N(c3ccccc3)c3ccc4c(c3)Cc3ccccc3-4)cc2)c2ccc3c(c2)Cc2ccccc2-3)cc1]
D-16
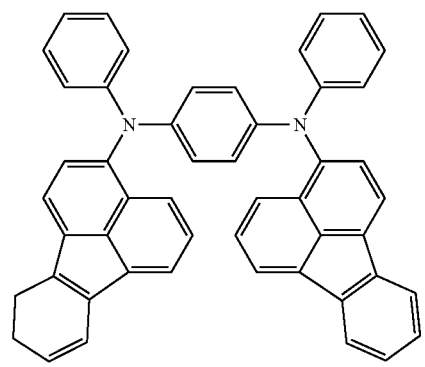 [SMILES: C1=CC2=C(CC1)c1ccc(N(c3ccccc3)c3ccc(N(c4ccccc4)c4ccc5c6c(cccc46)-c4ccccc4-5)cc3)c3cccc2c13]
D-17

TABLE 28-continued
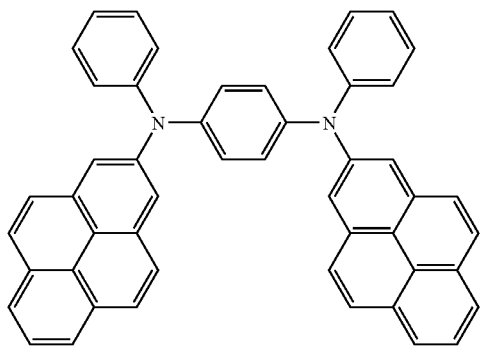 [SMILES: c1ccc(N(c2ccc(N(c3ccccc3)c3cc4ccc5cccc6ccc(c3)c4c56)cc2)c2cc3ccc4cccc5ccc(c2)c3c45)cc1]
D-18
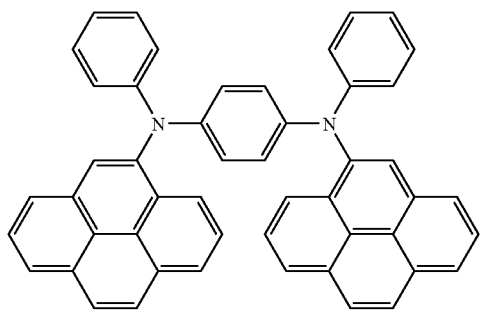 [SMILES: c1ccc(N(c2ccc(N(c3ccccc3)c3cc4cccc5ccc6cccc3c6c54)cc2)c2cc3cccc4ccc5cccc2c5c43)cc1]
D-19
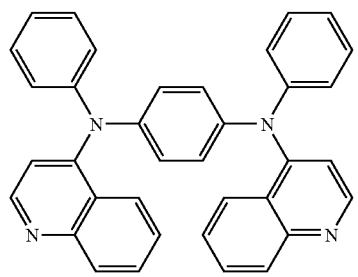 [SMILES: c1ccc(N(c2ccc(N(c3ccccc3)c3ccnc4ccccc34)cc2)c2ccnc3ccccc23)cc1]
D-20
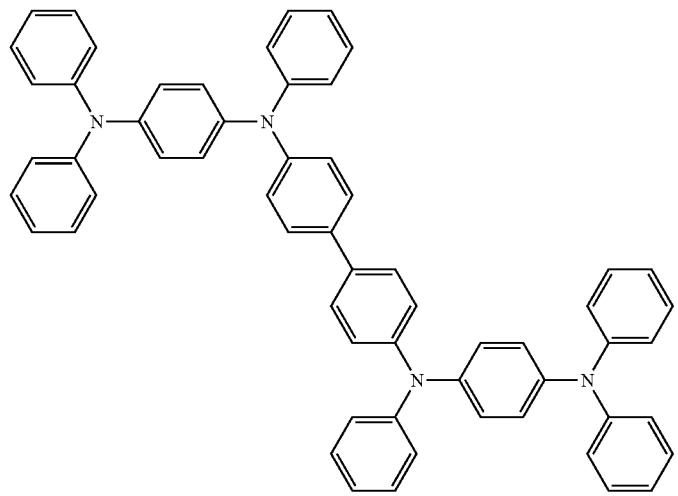 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]
D-21

TABLE 28-continued
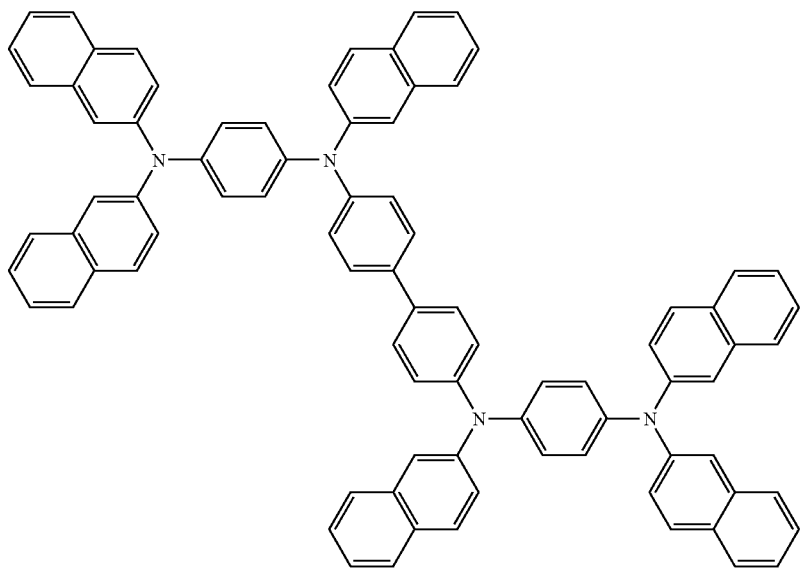 [SMILES: c1ccc2cc(N(c3ccc(-c4ccc(N(c5ccc(N(c6ccc7ccccc7c6)c6ccc7ccccc7c6)cc5)c5ccc6ccccc6c5)cc4)cc3)c3ccc(N(c4ccc5ccccc5c4)c4ccc5ccccc5c4)cc3)ccc2c1]
D-22
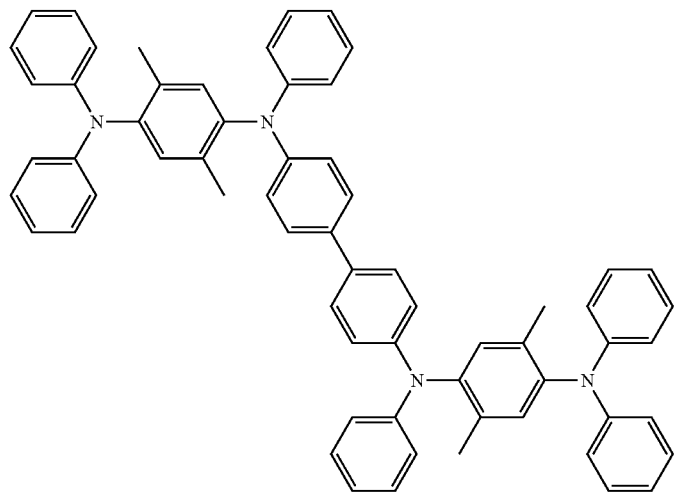 [SMILES: Cc1cc(N(c2ccccc2)c2ccc(-c3ccc(N(c4ccccc4)c4cc(C)c(N(c5ccccc5)c5ccccc5)cc4C)cc3)cc2)c(C)cc1N(c1ccccc1)c1ccccc1]
D-23
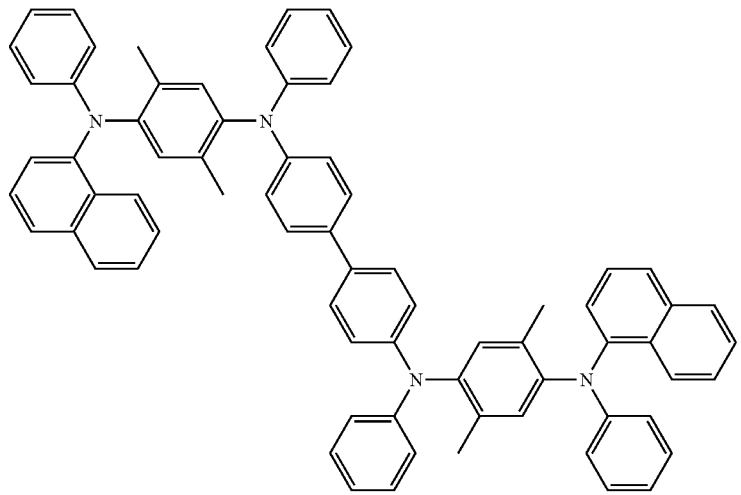 [SMILES: Cc1cc(N(c2ccccc2)c2cccc3ccccc23)c(C)cc1N(c1ccccc1)c1ccc(-c2ccc(N(c3ccccc3)c3cc(C)c(N(c4ccccc4)c4cccc5ccccc45)cc3C)cc2)cc1]
D-24

TABLE 29
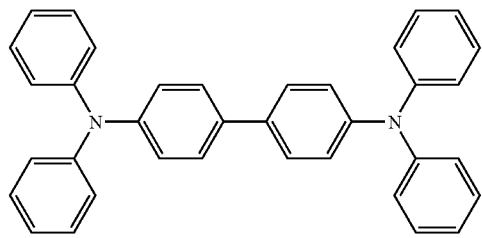 [SMILES: c1ccc(N(c2ccccc2)c2ccc(-c3ccc(N(c4ccccc4)c4ccccc4)cc3)cc2)cc1]
D-25
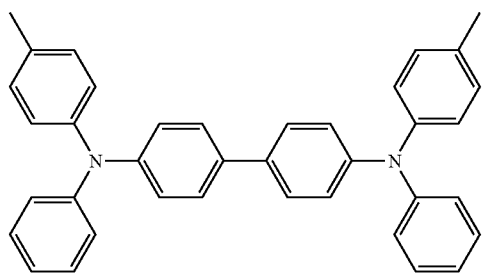 [SMILES: Cc1ccc(N(c2ccccc2)c2ccc(-c3ccc(N(c4ccccc4)c4ccc(C)cc4)cc3)cc2)cc1]
D-26
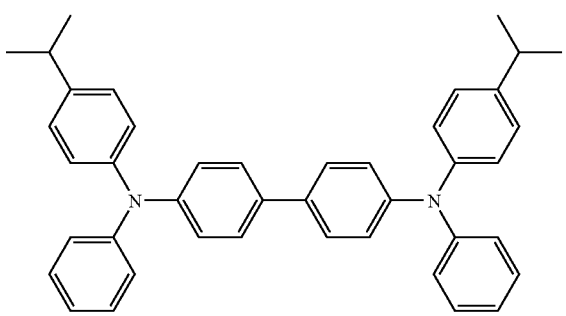 [SMILES: CC(C)c1ccc(N(c2ccccc2)c2ccc(-c3ccc(N(c4ccccc4)c4ccc(C(C)C)cc4)cc3)cc2)cc1]
D-27
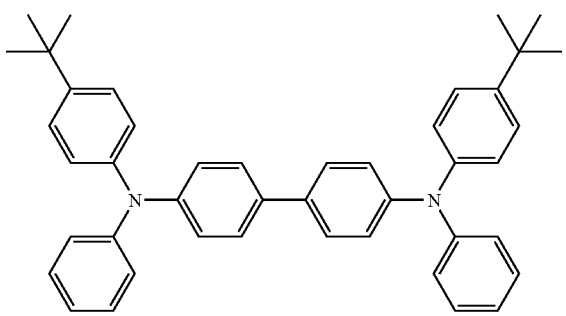 [SMILES: CC(C)(C)c1ccc(N(c2ccccc2)c2ccc(-c3ccc(N(c4ccccc4)c4ccc(C(C)(C)C)cc4)cc3)cc2)cc1]
D-28
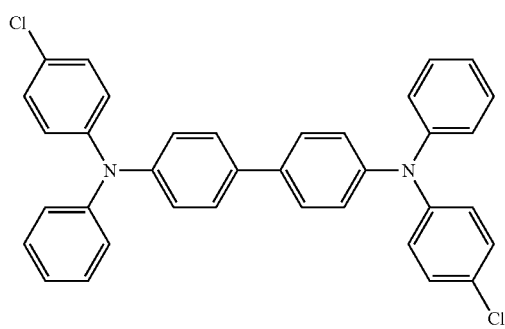 [SMILES: Clc1ccc(N(c2ccccc2)c2ccc(-c3ccc(N(c4ccccc4)c4ccc(Cl)cc4)cc3)cc2)cc1]
D-29

TABLE 29-continued
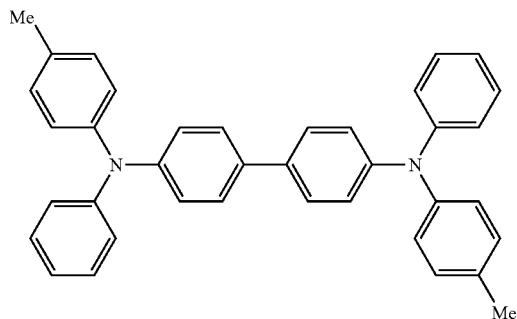 [SMILES: Cc1ccc(N(c2ccccc2)c2ccc(-c3ccc(N(c4ccccc4)c4ccc(C)cc4)cc3)cc2)cc1]
D-30
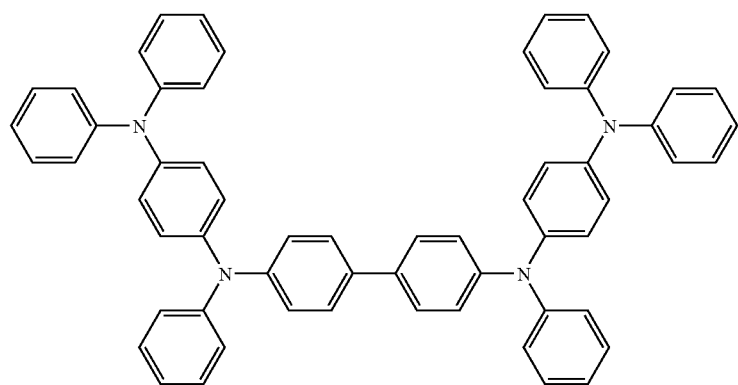 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]
D-31
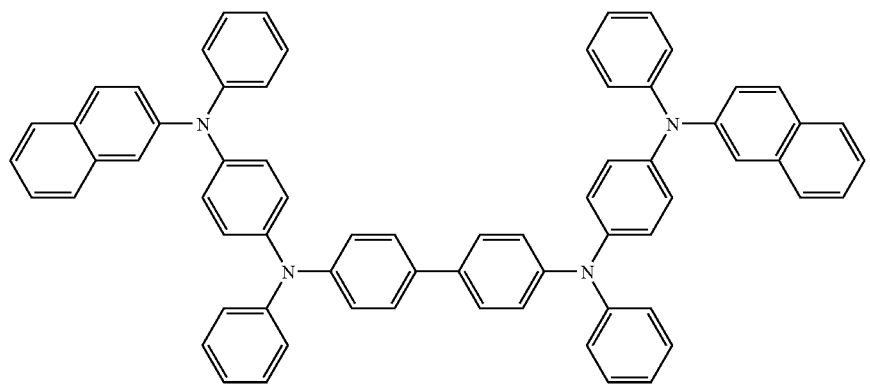 [SMILES: c1ccc(N(c2ccc(-c3ccc(N(c4ccccc4)c4ccc(N(c5ccccc5)c5ccc6ccccc6c5)cc4)cc3)cc2)c2ccc(N(c3ccccc3)c3ccc4ccccc4c3)cc2)cc1]
D-32
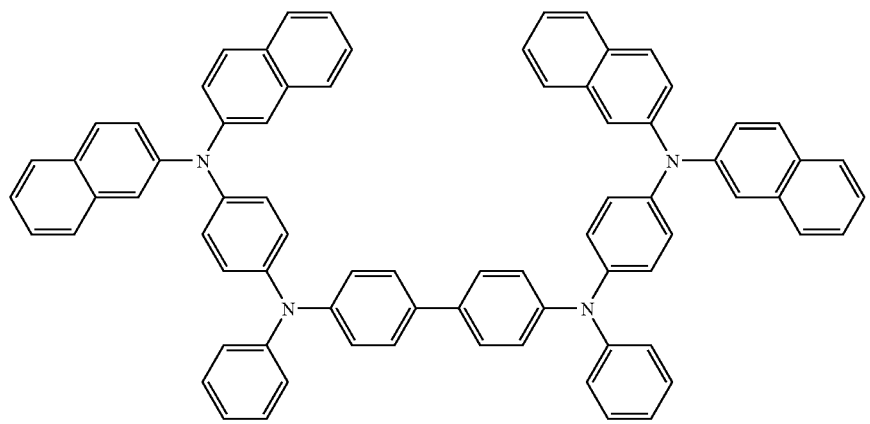 [SMILES: c1ccc(N(c2ccc(-c3ccc(N(c4ccccc4)c4ccc(N(c5ccc6ccccc6c5)c5ccc6ccccc6c5)cc4)cc3)cc2)c2ccc(N(c3ccc4ccccc4c3)c3ccc4ccccc4c3)cc2)cc1]
D-33

TABLE 29-continued
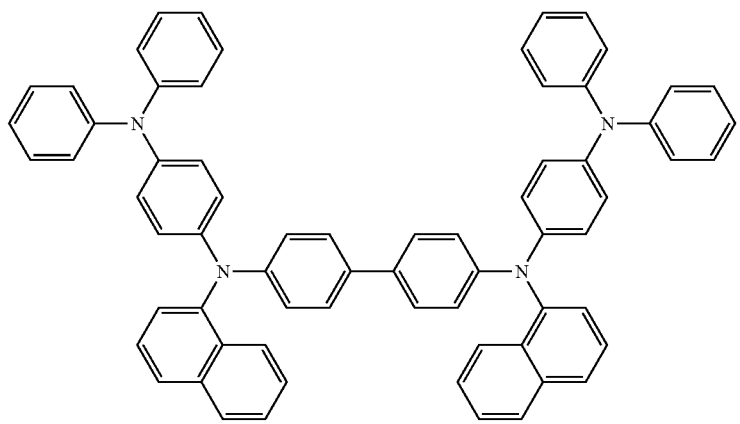 [SMILES: c1ccc(N(c2ccccc2)c2ccc(N(c3ccc(-c4ccc(N(c5ccc(N(c6ccccc6)c6ccccc6)cc5)c5cccc6ccccc56)cc4)cc3)c3cccc4ccccc34)cc2)cc1]
D-34
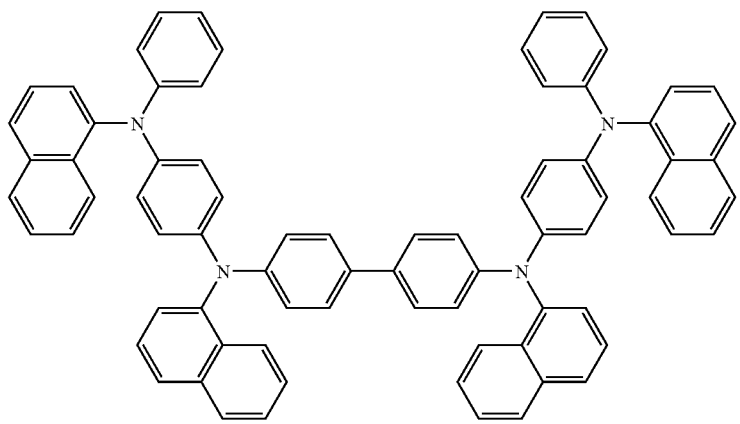 [SMILES: c1ccc(N(c2ccc(N(c3ccc(-c4ccc(N(c5ccc(N(c6ccccc6)c6cccc7ccccc67)cc5)c5cccc6ccccc56)cc4)cc3)c3cccc4ccccc34)cc2)c2cccc3ccccc23)cc1]
D-35
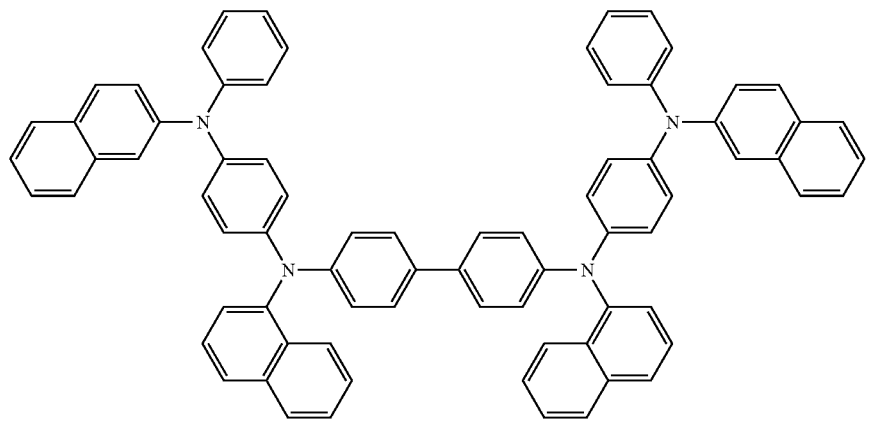 [SMILES: c1ccc(N(c2ccc(N(c3ccc(-c4ccc(N(c5ccc(N(c6ccccc6)c6ccc7ccccc7c6)cc5)c5cccc6ccccc56)cc4)cc3)c3cccc4ccccc34)cc2)c2ccc3ccccc3c2)cc1]
D-36
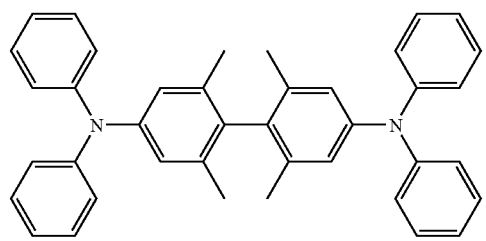 [SMILES: Cc1cc(N(c2ccccc2)c2ccccc2)cc(C)c1-c1c(C)cc(N(c2ccccc2)c2ccccc2)cc1C]
D-37

TABLE 29-continued
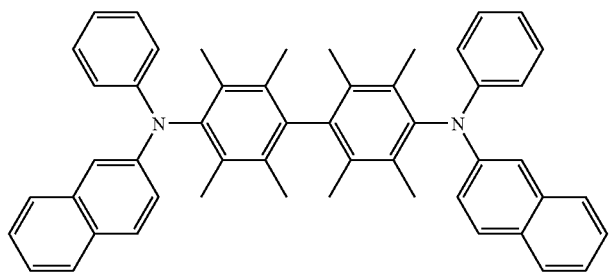 [SMILES: Cc1c(C)c(N(c2ccccc2)c2ccc3ccccc3c2)c(C)c(C)c1-c1c(C)c(C)c(N(c2ccccc2)c2ccc3ccccc3c2)c(C)c1C]
D-38
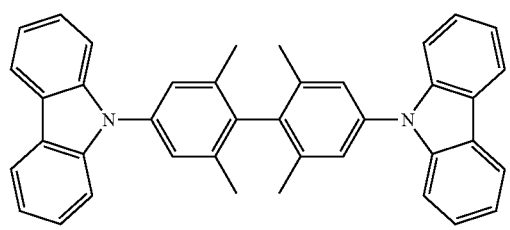 [SMILES: Cc1cc(-n2c3ccccc3c3ccccc32)cc(C)c1-c1c(C)cc(-n2c3ccccc3c3ccccc32)cc1C]
D-39
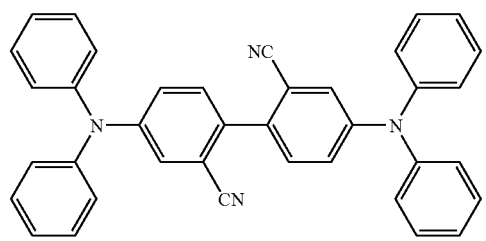
D-40
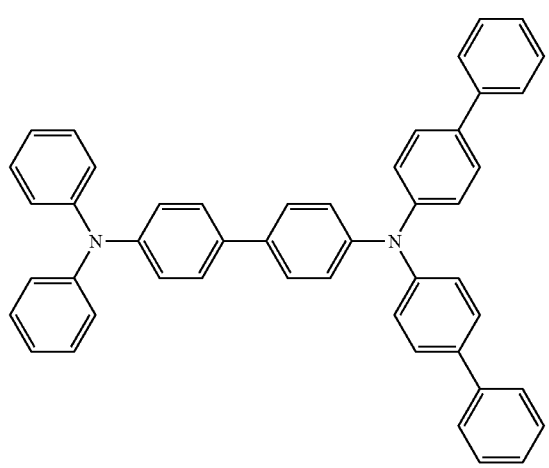 [SMILES: c1ccc(-c2ccc(N(c3ccc(-c4ccccc4)cc3)c3ccc(-c4ccc(N(c5ccccc5)c5ccccc5)cc4)cc3)cc2)cc1]
D-41

TABLE 29-continued
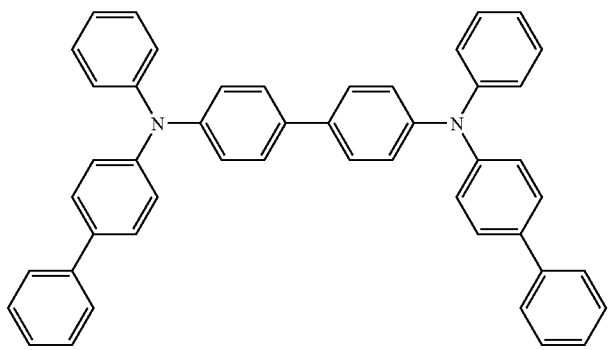 [SMILES: c1ccc(-c2ccc(N(c3ccccc3)c3ccc(-c4ccc(N(c5ccccc5)c5ccc(-c6ccccc6)cc5)cc4)cc3)cc2)cc1]
D-42
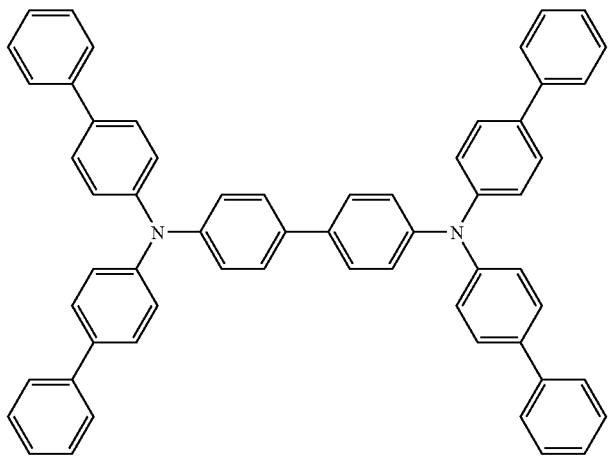 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]
D-43
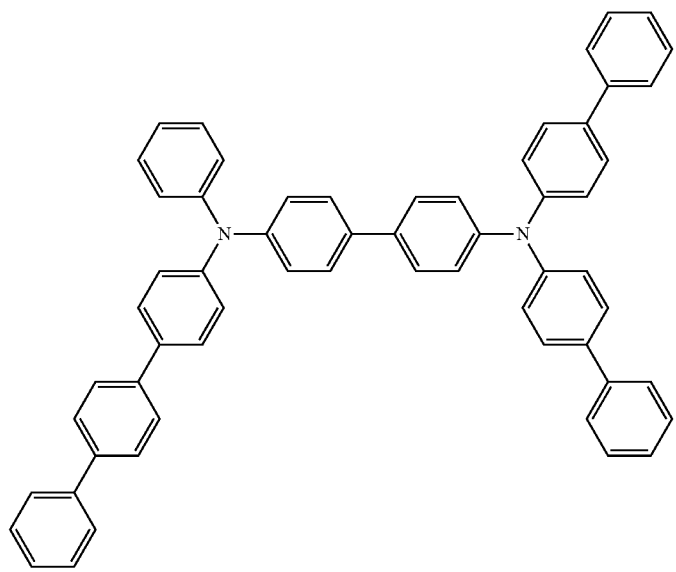 [SMILES: c1ccc(-c2ccc(-c3ccc(N(c4ccccc4)c4ccc(-c5ccc(N(c6ccc(-c7ccccc7)cc6)c6ccc(-c7ccccc7)cc6)cc5)cc4)cc3)cc2)cc1]
D-44

TABLE 29-continued
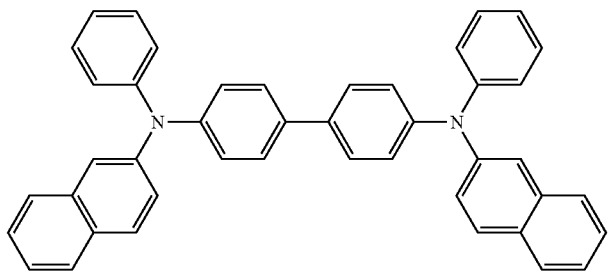 [SMILES: c1ccc(N(c2ccc(-c3ccc(N(c4ccccc4)c4ccc5ccccc5c4)cc3)cc2)c2ccc3ccccc3c2)cc1]
D-45
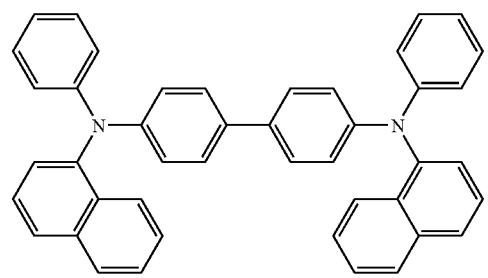 [SMILES: c1ccc(N(c2ccc(-c3ccc(N(c4ccccc4)c4cccc5ccccc45)cc3)cc2)c2cccc3ccccc23)cc1]
D-46
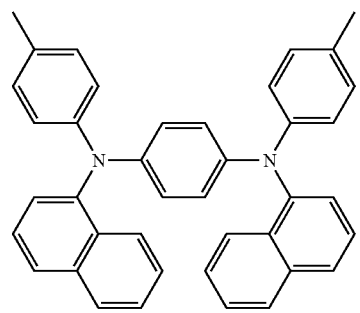 [SMILES: Cc1ccc(N(c2ccc(N(c3ccc(C)cc3)c3cccc4ccccc34)cc2)c2cccc3ccccc23)cc1]
D-47
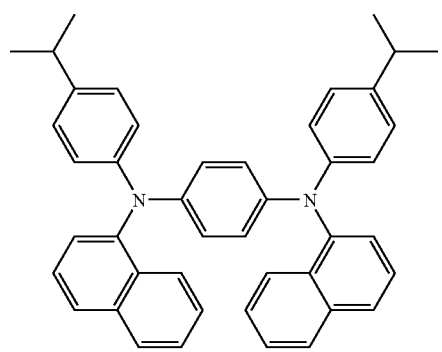 [SMILES: CC(C)c1ccc(N(c2ccc(N(c3ccc(C(C)C)cc3)c3cccc4ccccc34)cc2)c2cccc3ccccc23)cc1]
D-48
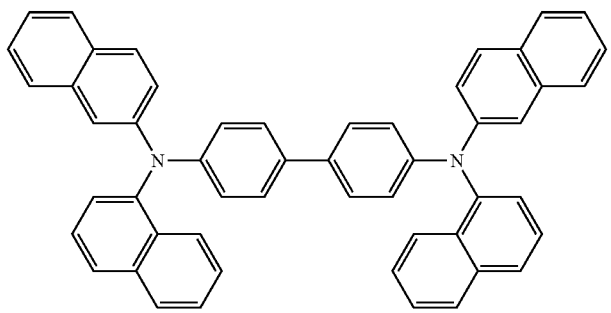 [SMILES: c1ccc2cc(N(c3ccc(-c4ccc(N(c5ccc6ccccc6c5)c5cccc6ccccc56)cc4)cc3)c3cccc4ccccc34)ccc2c1]
D-49

TABLE 29-continued
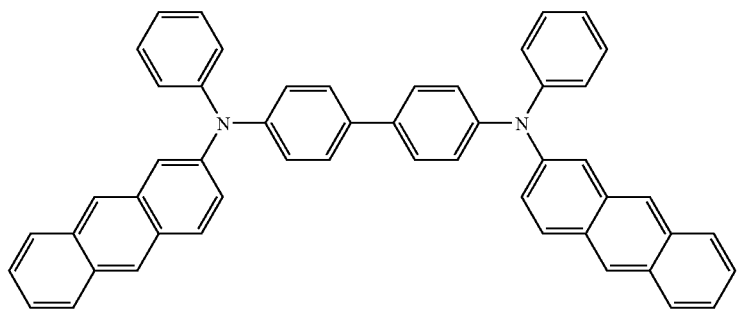 [SMILES: c1ccc(N(c2ccc(-c3ccc(N(c4ccccc4)c4ccc5cc6ccccc6cc5c4)cc3)cc2)c2ccc3cc4ccccc4cc3c2)cc1]
D-50
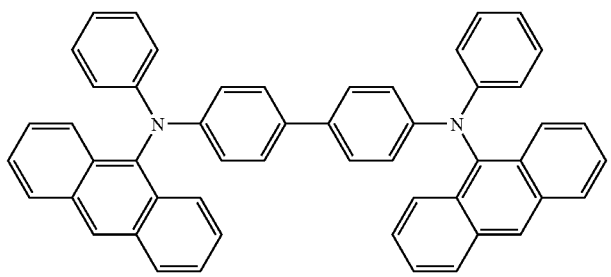 [SMILES: c1ccc(N(c2ccc(-c3ccc(N(c4ccccc4)c4c5ccccc5cc5ccccc45)cc3)cc2)c2c3ccccc3cc3ccccc23)cc1]
D-51
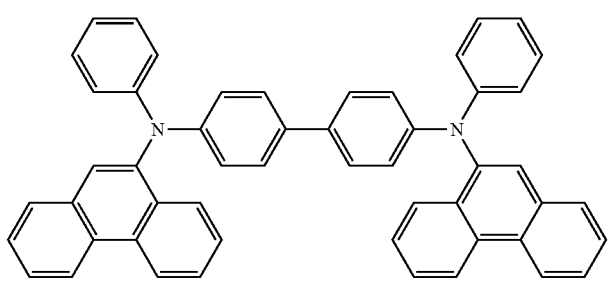 [SMILES: c1ccc(N(c2ccc(-c3ccc(N(c4ccccc4)c4cc5ccccc5c5ccccc45)cc3)cc2)c2cc3ccccc3c3ccccc23)cc1]
D-52
TABLE 30
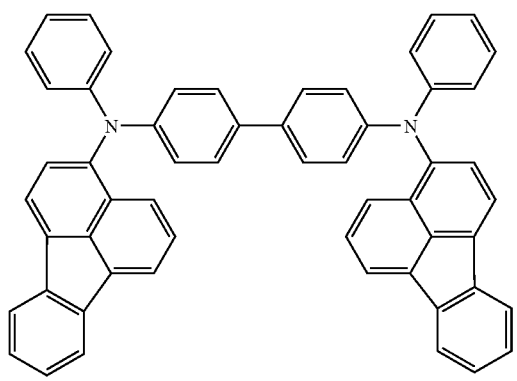 [SMILES: c1ccc(N(c2ccc(-c3ccc(N(c4ccccc4)c4ccc5c6c(cccc46)-c4ccccc4-5)cc3)cc2)c2ccc3c4c(cccc24)-c2ccccc2-3)cc1]
D-53

TABLE 30-continued
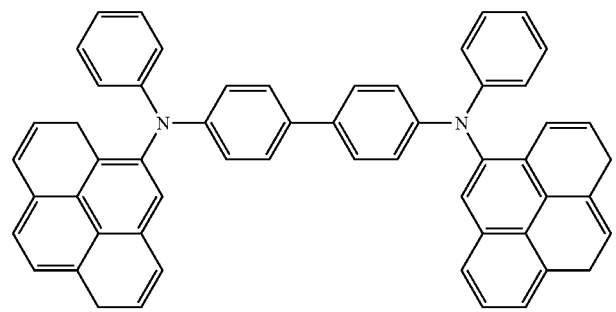 [SMILES: C1=Cc2c(N(c3ccccc3)c3ccc(-c4ccc(N(c5ccccc5)c5cc6c7c(ccc8c7c5CC=C8)CC=C6)cc4)cc3)cc3cccc4c3c2C(=CC4)C1]
D-54
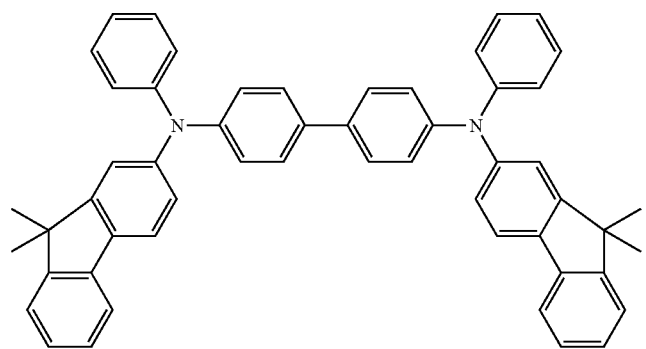
D-55
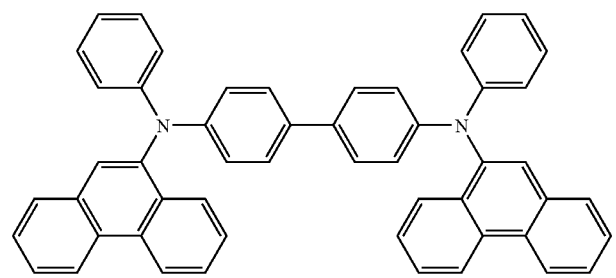 [SMILES: c1ccc(N(c2ccc(-c3ccc(N(c4ccccc4)c4cc5ccccc5c5ccccc45)cc3)cc2)c2cc3ccccc3c3ccccc23)cc1]
D-56
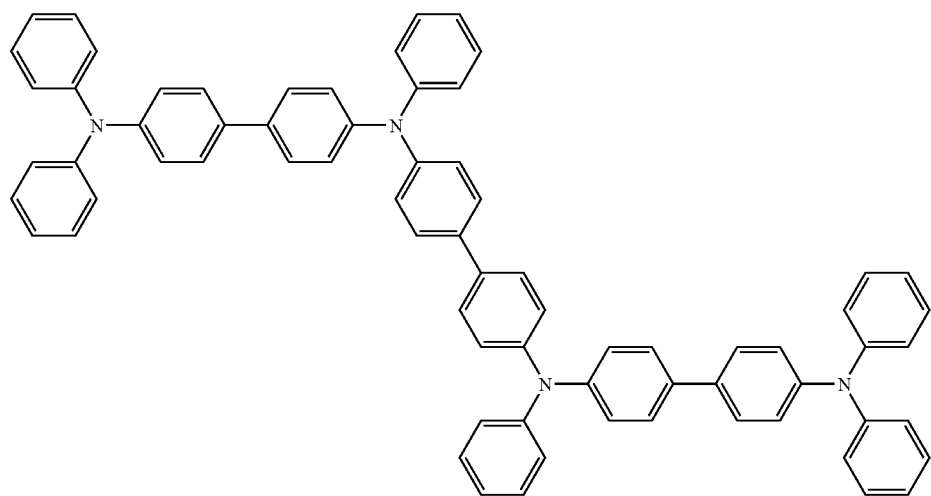 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1]
D-57

TABLE 30-continued
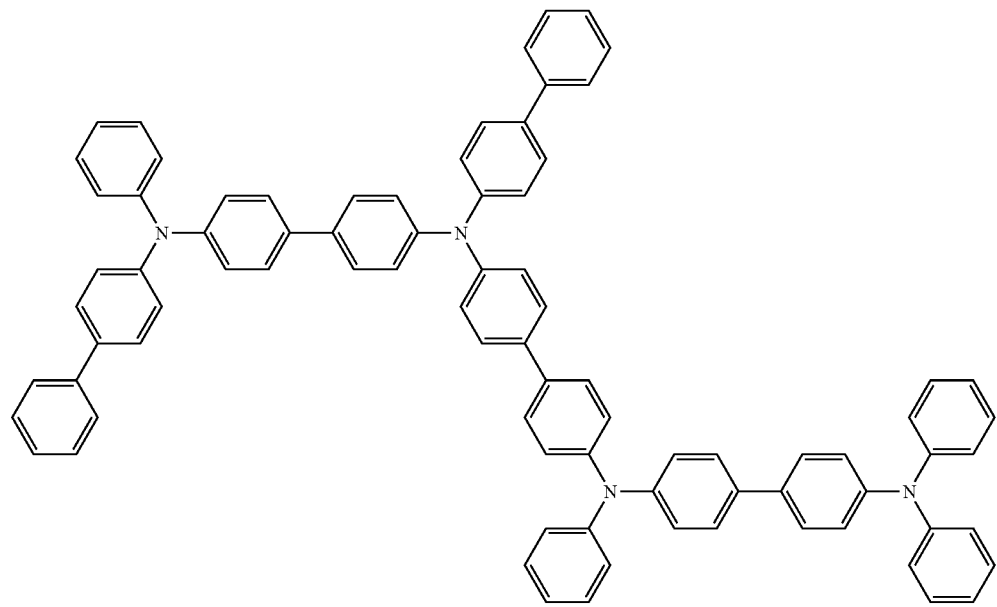 [SMILES: c1ccc(-c2ccc(N(c3ccccc3)c3ccc(-c4ccc(N(c5ccc(-c6ccccc6)cc5)c5ccc(-c6ccc(N(c7ccccc7)c7ccc(-c8ccc(N(c9ccccc9)c9ccccc9)cc8)cc7)cc6)cc5)cc4)cc3)cc2)cc1]
D-58
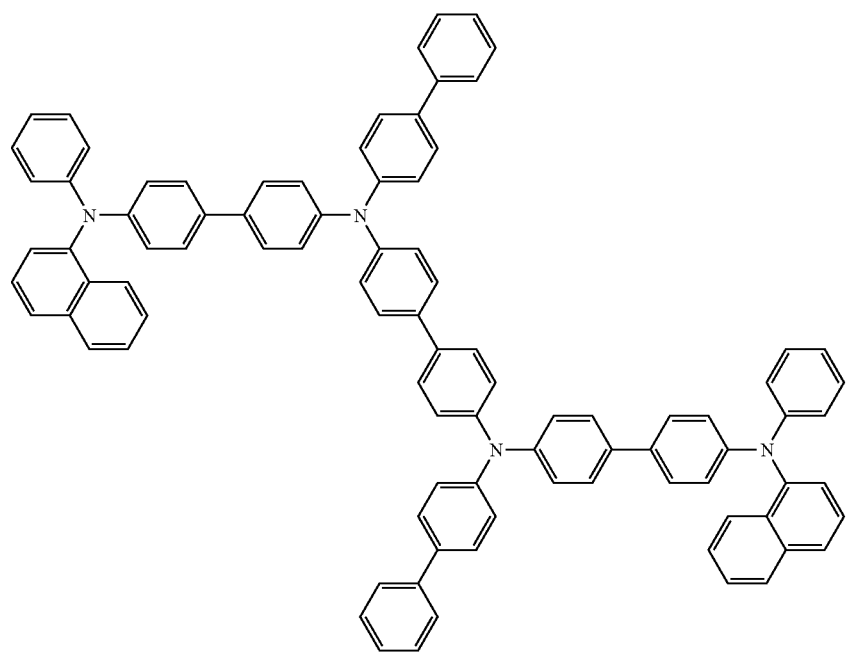 [SMILES: c1ccc(-c2ccc(N(c3ccc(-c4ccc(N(c5ccc(-c6ccccc6)cc5)c5ccc(-c6ccc(N(c7ccccc7)c7cccc8ccccc78)cc6)cc5)cc4)cc3)c3ccc(-c4ccc(N(c5ccccc5)c5cccc6ccccc56)cc4)cc3)cc2)cc1]
D-59

TABLE 30-continued
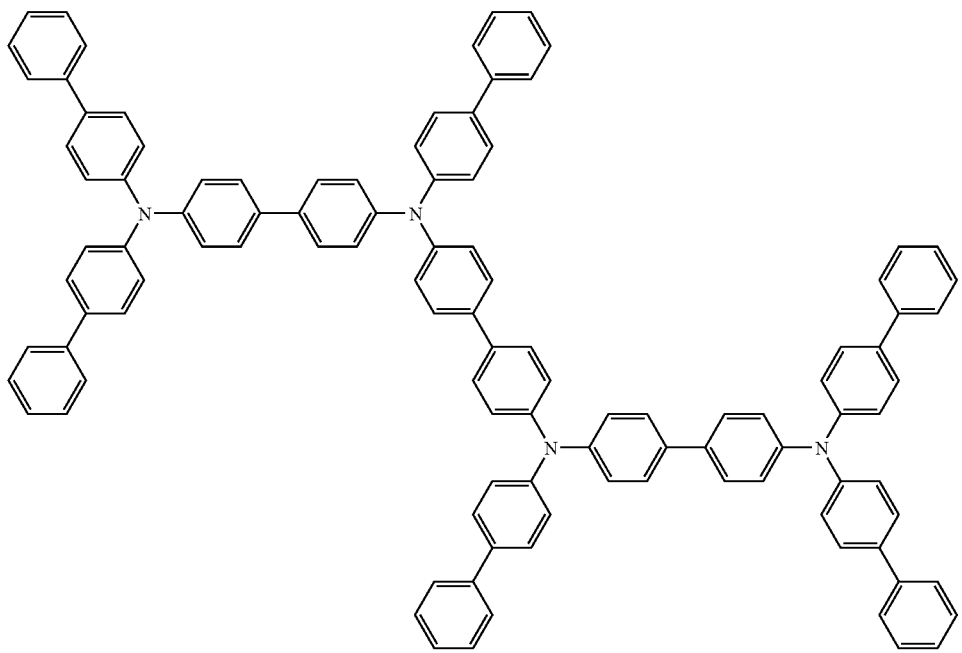 [SMILES: c1ccc(-c2ccc(N(c3ccc(-c4ccccc4)cc3)c3ccc(-c4ccc(N(c5ccc(-c6ccccc6)cc5)c5ccc(-c6ccc(N(c7ccc(-c8ccccc8)cc7)c7ccc(-c8ccc(N(c9ccc(-c%10ccccc%10)cc9)c9ccc(-c%10ccccc%10)cc9)cc8)cc7)cc6)cc5)cc4)cc3)cc2)cc1]
D-60
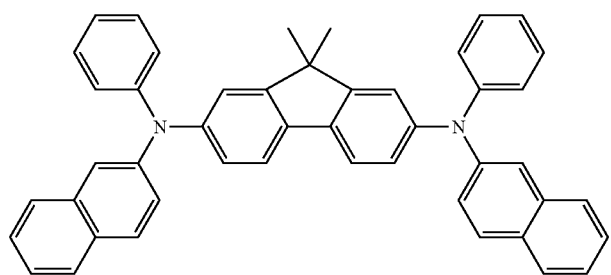 [SMILES: CC1(C)c2cc(N(c3ccccc3)c3ccc4ccccc4c3)ccc2-c2ccc(N(c3ccccc3)c3ccc4ccccc4c3)cc21]
D-61
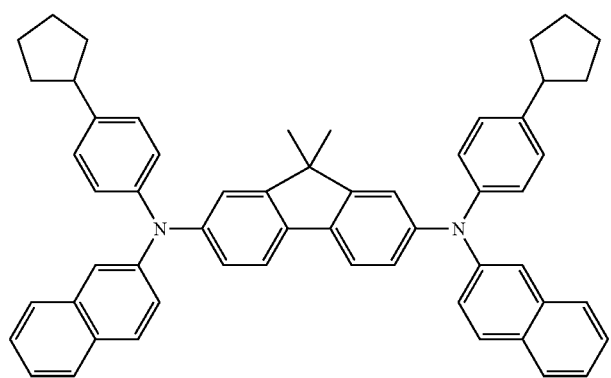 [SMILES: CC1(C)c2cc(N(c3ccc(C4CCCC4)cc3)c3ccc4ccccc4c3)ccc2-c2ccc(N(c3ccc(C4CCCC4)cc3)c3ccc4ccccc4c3)cc21]
D-62

TABLE 30-continued
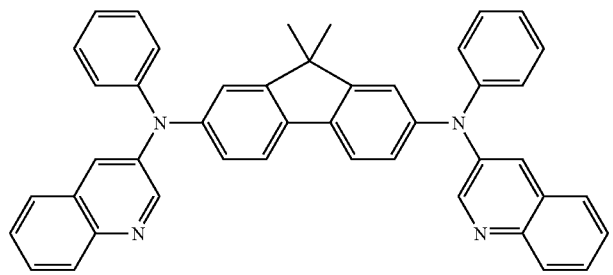 [SMILES: CC1(C)c2cc(N(c3ccccc3)c3cnc4ccccc4c3)ccc2-c2ccc(N(c3ccccc3)c3cnc4ccccc4c3)cc21]
D-63
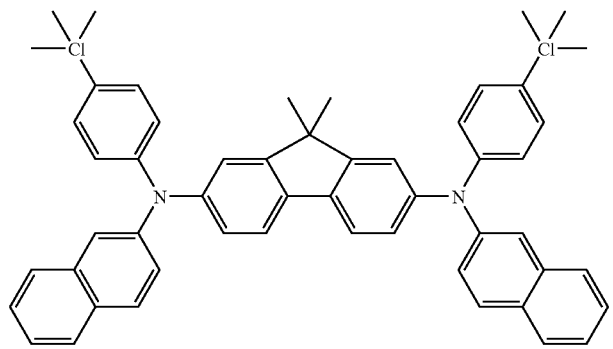
D-64
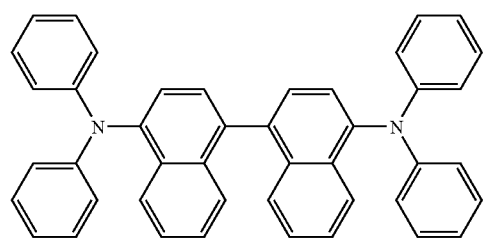 [SMILES: c1ccc(N(c2ccccc2)c2ccc(-c3ccc(N(c4ccccc4)c4ccccc4)c4ccccc34)c3ccccc23)cc1]
D-65
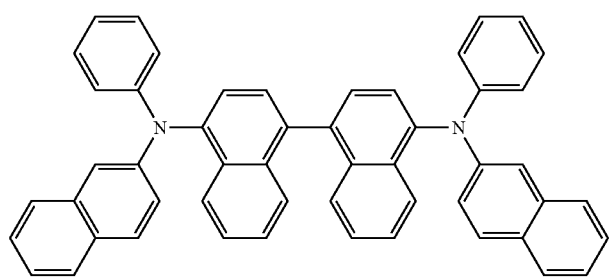 [SMILES: c1ccc(N(c2ccc3ccccc3c2)c2ccc(-c3ccc(N(c4ccccc4)c4ccc5ccccc5c4)c4ccccc34)c3ccccc23)cc1]
D-66
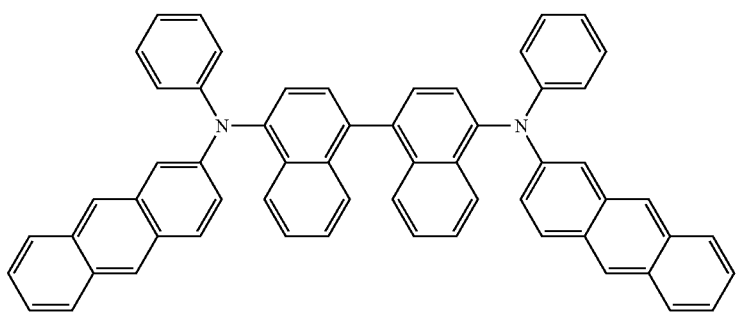 [SMILES: c1ccc(N(c2ccc3cc4ccccc4cc3c2)c2ccc(-c3ccc(N(c4ccccc4)c4ccc5cc6ccccc6cc5c4)c4ccccc34)c3ccccc23)cc1]
D-67

TABLE 30-continued
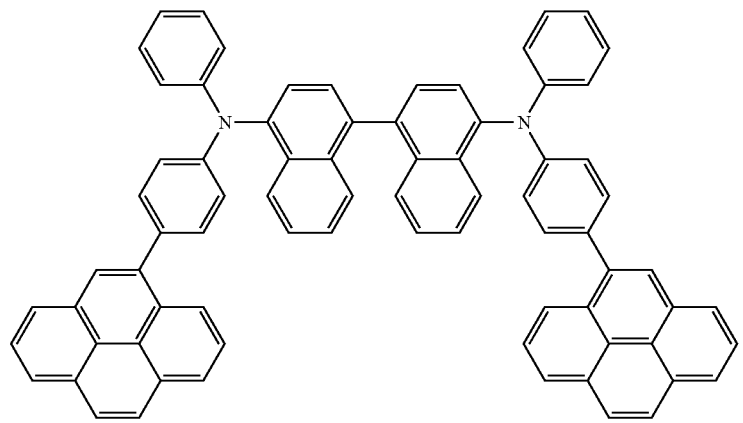 [SMILES: c1ccc(N(c2ccc(-c3cc4cccc5ccc6cccc3c6c54)cc2)c2ccc(-c3ccc(N(c4ccccc4)c4ccc(-c5cc6cccc7ccc8cccc5c8c76)cc4)c4ccccc34)c3ccccc23)cc1]
D-68
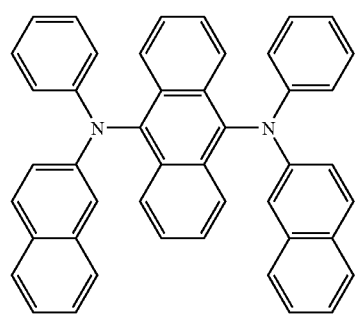 [SMILES: c1ccc(N(c2ccc3ccccc3c2)c2c3ccccc3c(N(c3ccccc3)c3ccc4ccccc4c3)c3ccccc23)cc1]
D-69
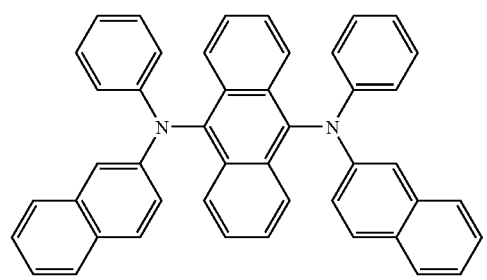 [SMILES: c1ccc(N(c2ccc3ccccc3c2)c2c3ccccc3c(N(c3ccccc3)c3ccc4ccccc4c3)c3ccccc23)cc1]
D-70
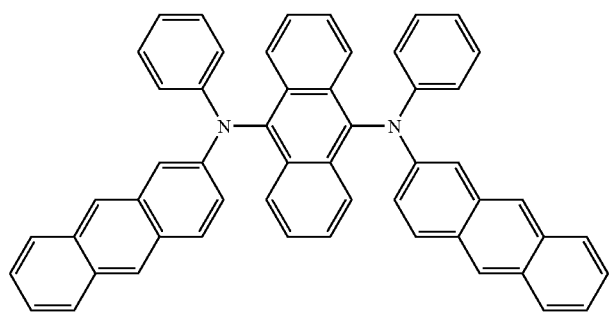 [SMILES: c1ccc(N(c2ccc3cc4ccccc4cc3c2)c2c3ccccc3c(N(c3ccccc3)c3ccc4cc5ccccc5cc4c3)c3ccccc23)cc1]
D-71

TABLE 30-continued
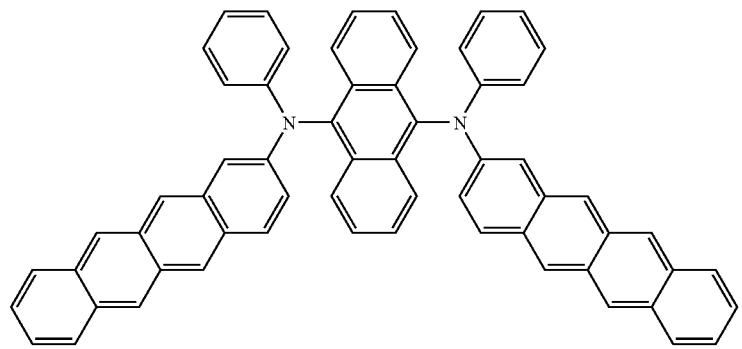 [SMILES: c1ccc(N(c2ccc3cc4cc5ccccc5cc4cc3c2)c2c3ccccc3c(N(c3ccccc3)c3ccc4cc5cc6ccccc6cc5cc4c3)c3ccccc23)cc1]
D-72
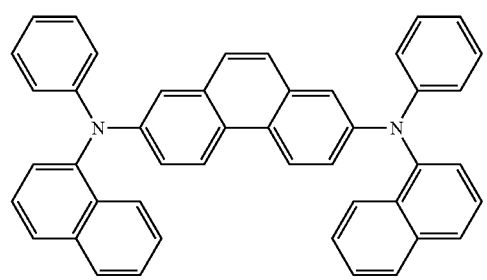 [SMILES: c1ccc(N(c2ccc3c(ccc4cc(N(c5ccccc5)c5cccc6ccccc56)ccc43)c2)c2cccc3ccccc23)cc1]
D-73
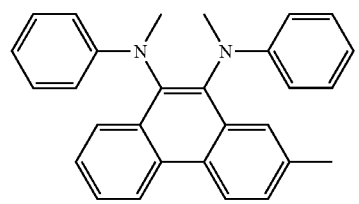 [SMILES: Cc1ccc2c(c1)c(N(C)c1ccccc1)c(N(C)c1ccccc1)c1ccccc12]
D-74
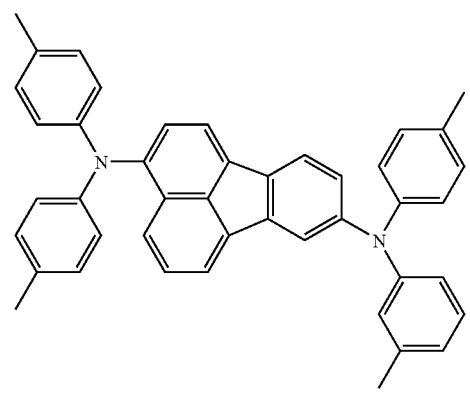 [SMILES: Cc1ccc(N(c2cccc(C)c2)c2ccc3c(c2)-c2cccc4c(N(c5ccc(C)cc5)c5ccc(C)cc5)ccc-3c24)cc1]
D-75

TABLE 30-continued
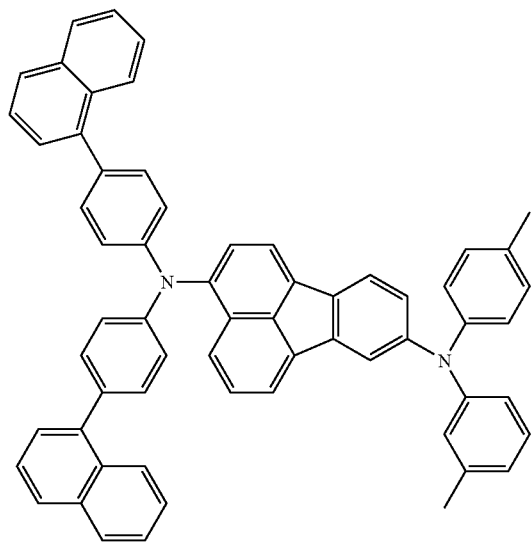 [SMILES: Cc1ccc(N(c2cccc(C)c2)c2ccc3c(c2)-c2cccc4c(N(c5ccc(-c6cccc7ccccc67)cc5)c5ccc(-c6cccc7ccccc67)cc5)ccc-3c24)cc1]
D-76
TABLE 31
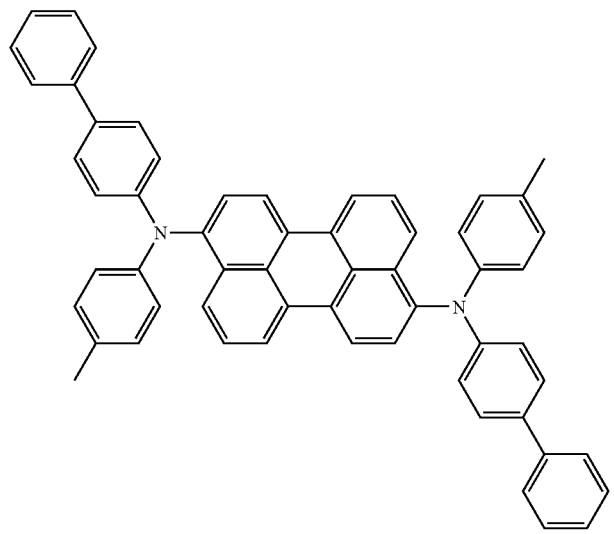 [SMILES: Cc1ccc(N(c2ccc(-c3ccccc3)cc2)c2ccc3c4cccc5c(N(c6ccc(C)cc6)c6ccc(-c7ccccc7)cc6)ccc(c6cccc2c63)c54)cc1]
D-77
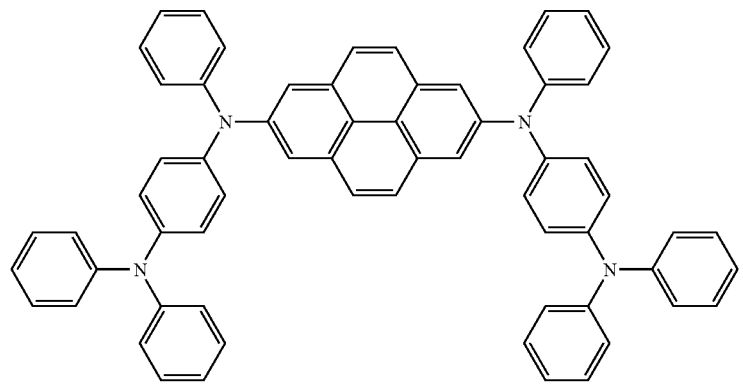 [SMILES: c1ccc(N(c2ccccc2)c2ccc(N(c3ccccc3)c3cc4ccc5cc(N(c6ccccc6)c6ccc(N(c7ccccc7)c7ccccc7)cc6)cc6ccc(c3)c4c56)cc2)cc1]
D-78

TABLE 31-continued
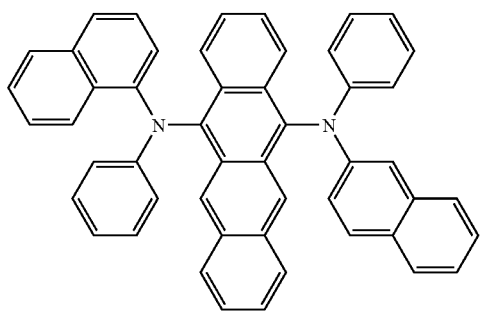 [SMILES: c1ccc(N(c2ccc3ccccc3c2)c2c3ccccc3c(N(c3ccccc3)c3cccc4ccccc34)c3cc4ccccc4cc23)cc1]
D-79
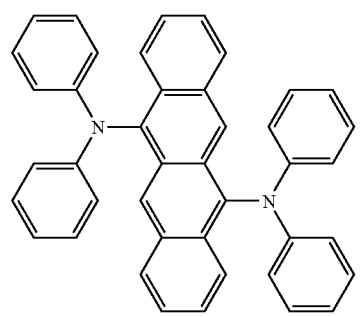 [SMILES: c1ccc(N(c2ccccc2)c2c3ccccc3cc3c(N(c4ccccc4)c4ccccc4)c4ccccc4cc23)cc1]
D-80
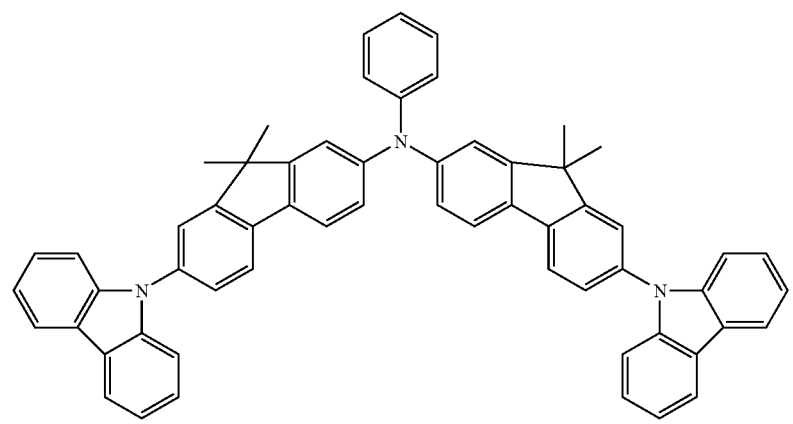 [SMILES: CC1(C)c2cc(N(c3ccccc3)c3ccc4c(c3)C(C)(C)c3cc(-n5c6ccccc6c6ccccc65)ccc3-4)ccc2-c2ccc(-n3c4ccccc4c4ccccc43)cc21]
D-81

TABLE 31-continued

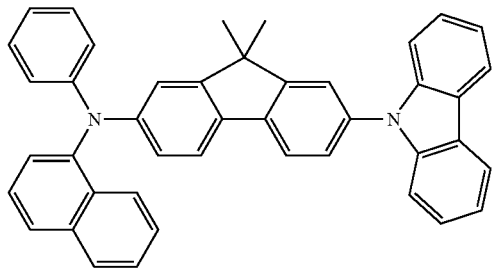 [SMILES: CC1(C)c2cc(N(c3ccccc3)c3cccc4ccccc34)ccc2-c2ccc(-n3c4ccccc4c4ccccc43)cc21]

D-82

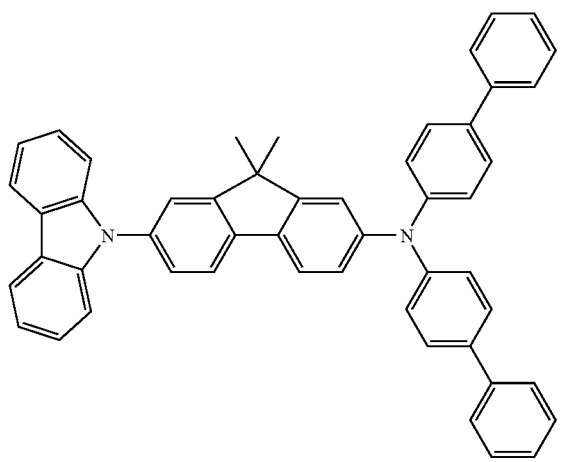 [SMILES: CC1(C)c2cc(N(c3ccc(-c4ccccc4)cc3)c3ccc(-c4ccccc4)cc3)ccc2-c2ccc(-n3c4ccccc4c4ccccc43)cc21]

D-83

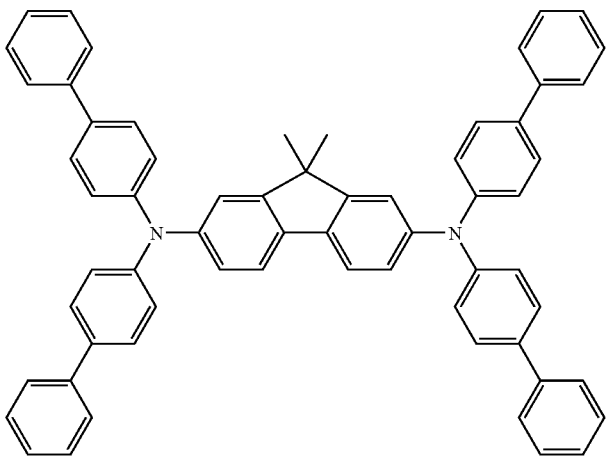 [SMILES: CC1(C)c2cc(N(c3ccc(-c4ccccc4)cc3)c3ccc(-c4ccccc4)cc3)ccc2-c2ccc(N(c3ccc(-c4ccccc4)cc3)c3ccc(-c4ccccc4)cc3)cc21]

D-84

In the formula (7) representing a triarylamine multimer, $A_7$ to $A_{12}$ each independently represent a $C_6$-$C_{20}$ aromatic hydrocarbon group, which may be unsubstituted or may have one or more substituents. These substituents can each be selected from a halogen atom or a hydroxyl, aldehyde, carbonyl, carbonyl ester, alkyl, alkenyl, cycloalkyl, alkoxy, aryl, amino, heterocyclic, cyano, nitryl, nitro or silyl group. $Z_1$ to $Z_3$ each independently represent a divalent aromatic hydrocarbon group, and may be selected from a phenylene, naphthylene, anthracenylene, phenanthrenylene, naphthacenylene, fluoranthenylene or perylenylene group, and p, q and r each independently stand for an integer of 1 or greater. Further, $A_7$ and $A_8$, $A_9$ and $A_{10}$, and $A_{11}$ and $A_{12}$ may be bonded together via connecting groups, respectively. At one or more positions other than the N-bonding positions, $Z_1$ to $Z_3$ may each have a like number of substituents. These substituents can each be selected from a halogen atom or a hydroxyl, aldehyde, carbonyl, carbonyl ester, alkyl, alkenyl, cycloalkyl, alkoxy, aryl, amino, heterocyclic, cyano, nitryl, nitro or silyl group.

Specific examples of the triarylamine multimer include the compounds E shown in Table 32.

TABLE 32
Compound No. E-1
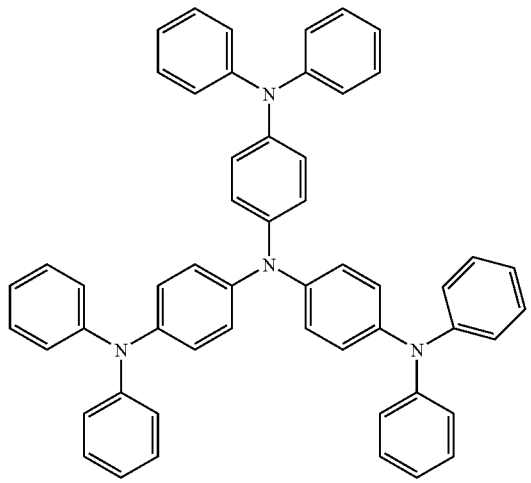 [SMILES: c1ccc(N(c2ccccc2)c2ccc(N(c3ccc(N(c4ccccc4)c4ccccc4)cc3)c3ccc(N(c4ccccc4)c4ccccc4)cc3)cc2)cc1]
E-2
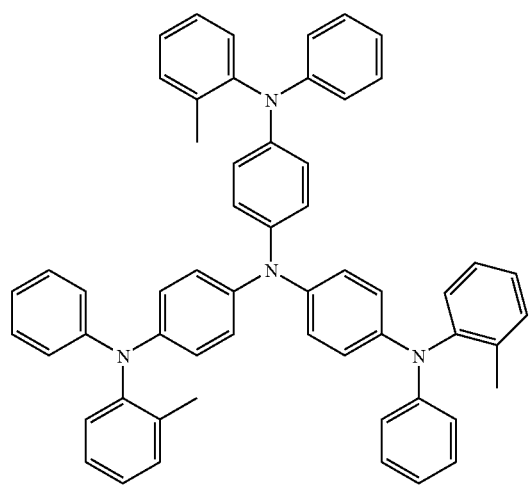 [SMILES: Cc1ccccc1N(c1ccccc1)c1ccc(N(c2ccc(N(c3ccccc3)c3ccccc3C)cc2)c2ccc(N(c3ccccc3)c3ccccc3C)cc2)cc1]
E-3
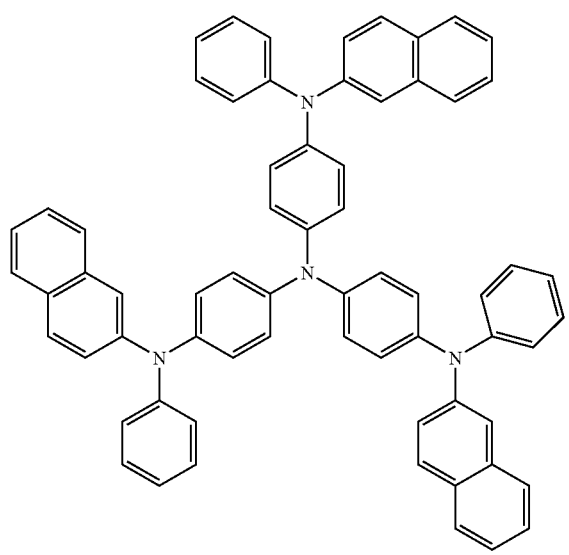 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

TABLE 32-continued
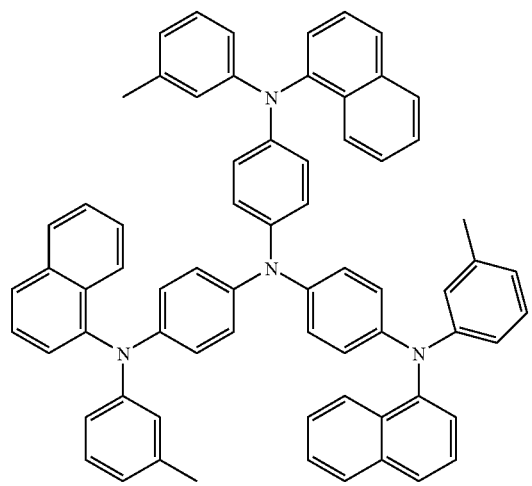 [SMILES: Cc1cccc(N(c2ccc(N(c3ccc(N(c4cccc(C)c4)c4cccc5ccccc45)cc3)c3ccc(N(c4cccc(C)c4)c4cccc5ccccc45)cc3)cc2)c2cccc3ccccc23)c1]
E-4
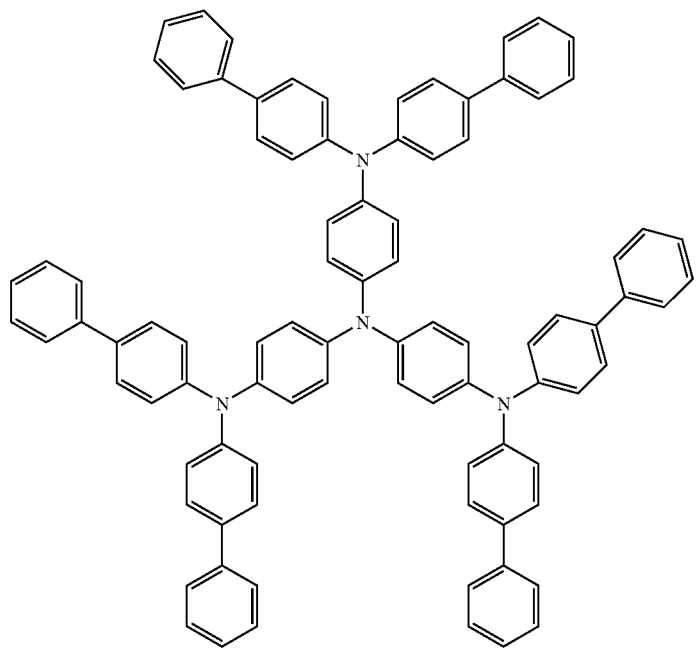 [SMILES: c1ccc(-c2ccc(N(c3ccc(-c4ccccc4)cc3)c3ccc(N(c4ccc(N(c5ccc(-c6ccccc6)cc5)c5ccc(-c6ccccc6)cc5)cc4)c4ccc(N(c5ccc(-c6ccccc6)cc5)c5ccc(-c6ccccc6)cc5)cc4)cc3)cc2)cc1]
E-5

TABLE 32-continued
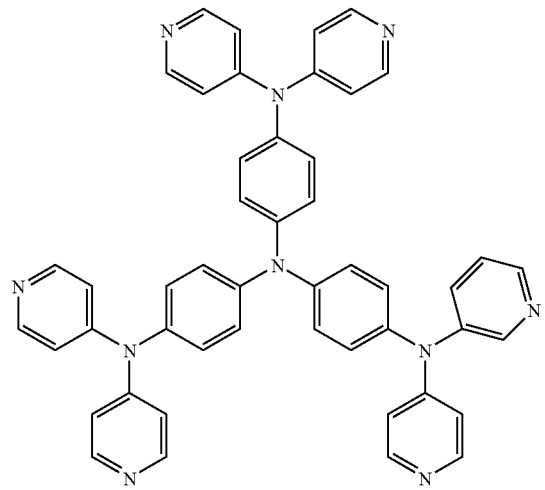 [SMILES: c1cncc(N(c2ccncc2)c2ccc(N(c3ccc(N(c4ccncc4)c4ccncc4)cc3)c3ccc(N(c4ccncc4)c4ccncc4)cc3)cc2)c1]
E-6
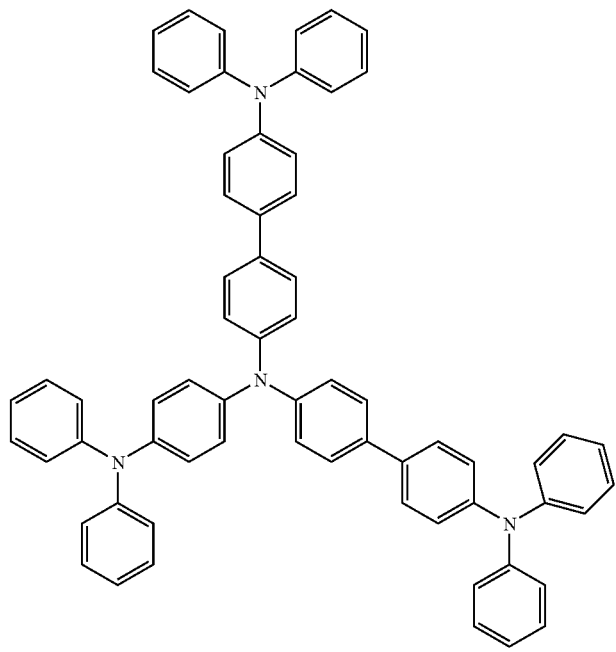 [SMILES: c1ccc(N(c2ccccc2)c2ccc(-c3ccc(N(c4ccc(-c5ccc(N(c6ccccc6)c6ccccc6)cc5)cc4)c4ccc(N(c5ccccc5)c5ccccc5)cc4)cc3)cc2)cc1]
E-7

TABLE 32-continued
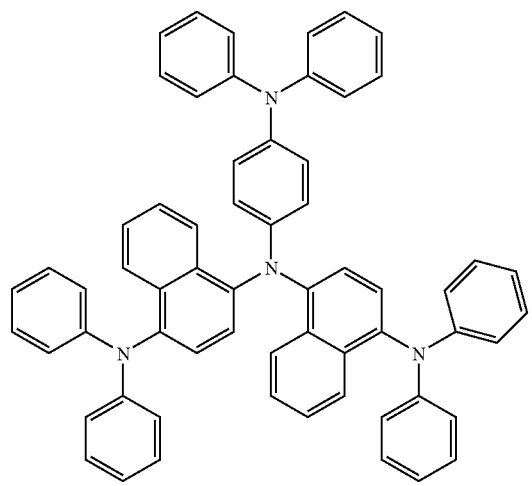 [SMILES: c1ccc(N(c2ccccc2)c2ccc(N(c3ccc(N(c4ccccc4)c4ccccc4)c4ccccc34)c3ccc(N(c4ccccc4)c4ccccc4)c4ccccc34)cc2)cc1]
E-8
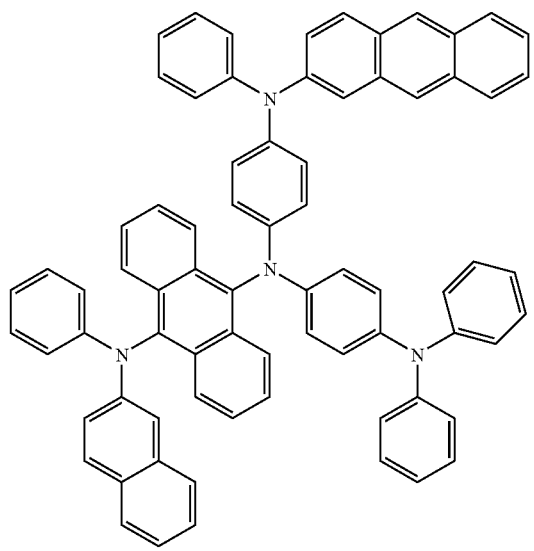 [SMILES: c1ccc(N(c2ccccc2)c2ccc(N(c3ccc(N(c4ccccc4)c4ccc5cc6ccccc6cc5c4)cc3)c3c4ccccc4c(N(c4ccccc4)c4ccc5ccccc5c4)c4ccccc34)cc2)cc1]
E-9

TABLE 32-continued
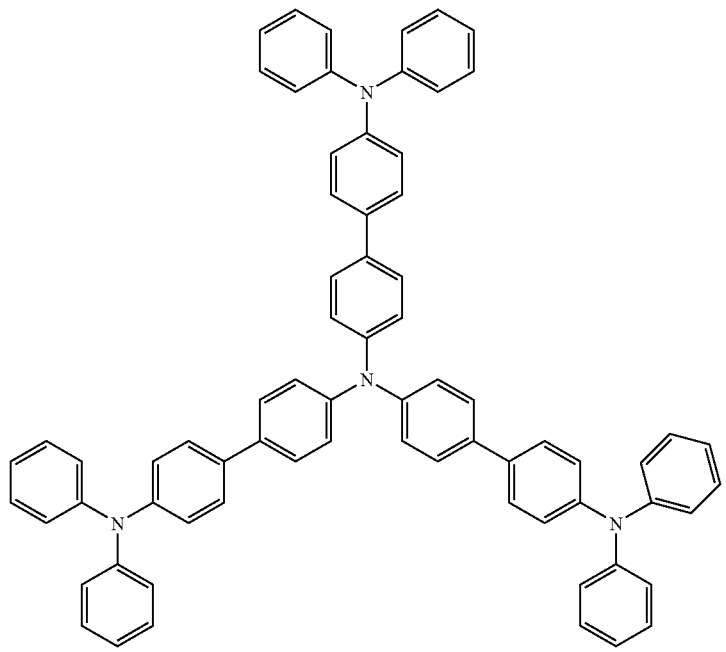 [SMILES: c1ccc(N(c2ccccc2)c2ccc(-c3ccc(N(c4ccc(-c5ccc(N(c6ccccc6)c6ccccc6)cc5)cc4)c4ccc(-c5ccc(N(c6ccccc6)c6ccccc6)cc5)cc4)cc3)cc2)cc1]
E-10
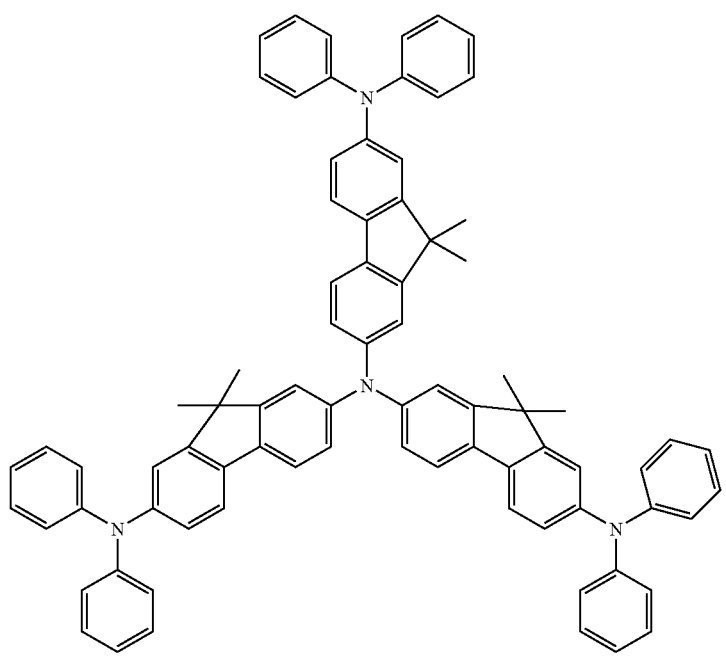 [SMILES: CC1(C)c2cc(N(c3ccccc3)c3ccccc3)ccc2-c2ccc(N(c3ccc4c(c3)C(C)(C)c3cc(N(c5ccccc5)c5ccccc5)ccc3-4)c3ccc4c(c3)C(C)(C)c3cc(N(c5ccccc5)c5ccccc5)ccc3-4)cc21]
E-11

TABLE 32-continued
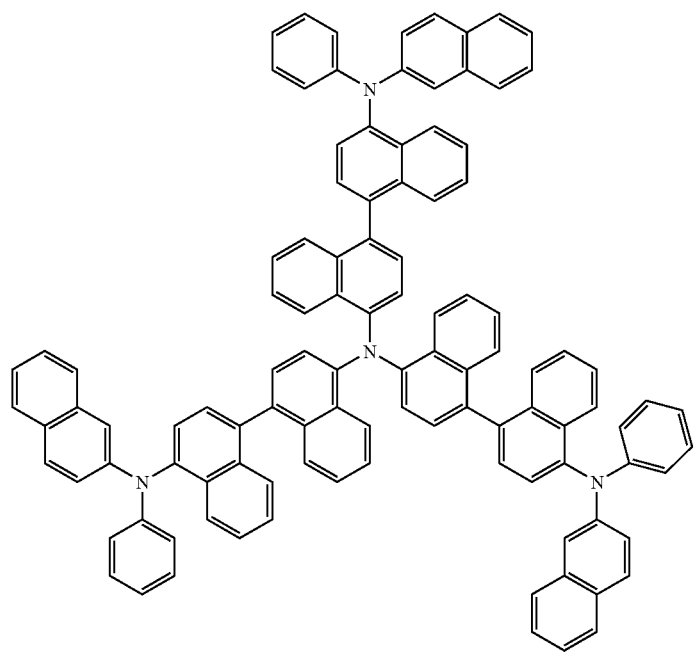 [SMILES: c1ccc(N(c2ccc3ccccc3c2)c2ccc(-c3ccc(N(c4ccc(-c5ccc(N(c6ccccc6)c6ccc7ccccc7c6)c6ccccc56)c5ccccc45)c4ccc(-c5ccc(N(c6ccccc6)c6ccc7ccccc7c6)c6ccccc56)c5ccccc45)c4ccccc34)c3ccccc23)cc1]
E-12
E-13

TABLE 32-continued

E-14

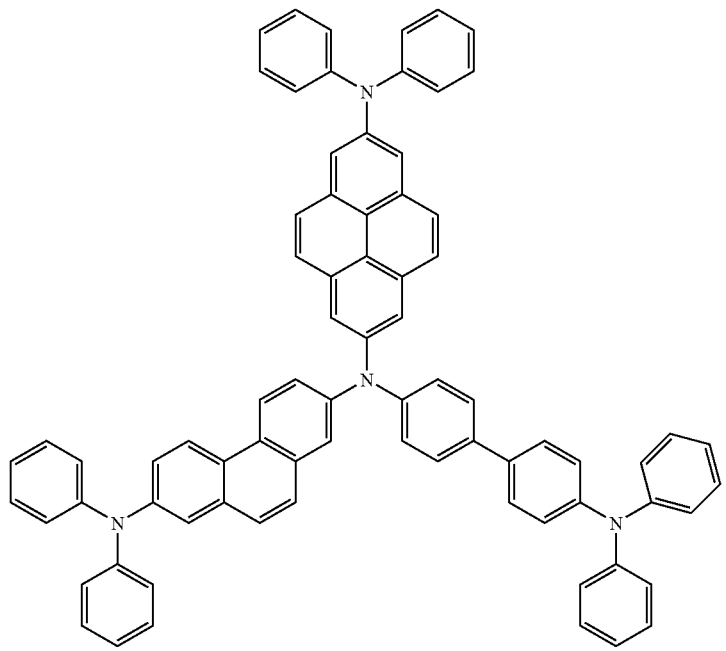 [SMILES: c1ccc(N(c2ccccc2)c2ccc(-c3ccc(N(c4ccc5c(ccc6cc(N(c7ccccc7)c7ccccc7)ccc65)c4)c4cc5ccc6cc(N(c7ccccc7)c7ccccc7)cc7ccc(c4)c5c67)cc3)cc2)cc1]

E-15

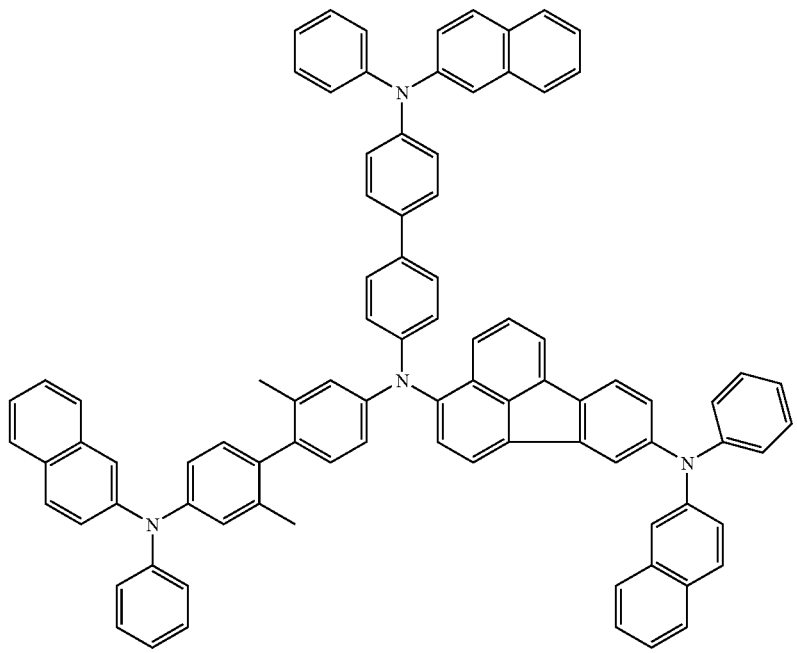 [SMILES: Cc1cc(N(c2ccccc2)c2ccc3ccccc3c2)ccc1-c1ccc(N(c2ccc(-c3ccc(N(c4ccccc4)c4ccc5ccccc5c4)cc3)cc2)c2ccc3c4c(cccc24)-c2ccc(N(c4ccccc4)c4ccc5ccccc5c4)cc2-3)cc1C]

As the material making up the light-emitting layer 14c, it is desired to have not only a function to inject charges (a function that enable to inject holes from a anode or a hole injection layer while enabling injection of electrons from a cathode layer or an electron injection layer, both upon application of an electric field) but also a function to transport (a function that causes the injected holes and electrons to move under the force of the electric field) and a function to emit, light (a function that provides a place of recombination for electrons and holes to induce the emission of light). As a host, for example, such a material can be a styryl derivative, anthracene derivative, naphthacene derivative or aromatic amine. Particularly preferred as the styryl derivative is at least one styryl derivative selected from distyryl derivatives, tristyryl derivatives, tetrastyryl derivatives and styrylamine derivatives. Preferred as the anthracene derivative is an asymmetric anthracene compound. Preferred as the aromatic amine is a compound containing 2 to 4 aromatically-substituted nitrogen atoms.

The material may also contain a fluorescent dye as a luminescent dopant. As the luminescent dopant, it is possible to selectively use, for example, one of fluorescent materials such as laser dyes, e.g., styrylbenzene dyes, oxazole dyes, perylene dyes, coumarine dyes and acridine dyes, polyaromatic hydrocarbon materials, e.g., anthracene derivatives, naphthacene derivatives, pentacene derivatives and chrysene derivatives, pyrromethene skeleton compounds and pyrromethene metal complexes, quinacridone derivatives, cyanomethylenepyrane derivatives (DCM, DCJTB), benzothiazole compounds, benzimidazole compounds, and metal-chelated oxynoid compounds, as desired. The dope concentrations of these fluorescent materials may each preferably be 0.5% or higher but not higher than 15% based the film thickness.

The respective layers 14a to 14d, which make up the organic layer 14, may be provided with other features or functions. The respective layers respective layers 14a to 14d may each have a stacked structure. For example, the light-emitting layer 14c may be formed of a stacked structure consisting of a blue-light emitting layer, a green-light emitting layer and a red-light emitting layer to fabricate an organic electroluminescent device that emits white light.

With reference to the schematic configuration diagram of FIG. 2A and the pixel-circuit configuration diagram of FIG. 2B, a description will next be made about, an illustrative active-matrix display device 20 with such organic electroluminescent devices 11 formed in an array on a substrate 12.

Figure 2A:
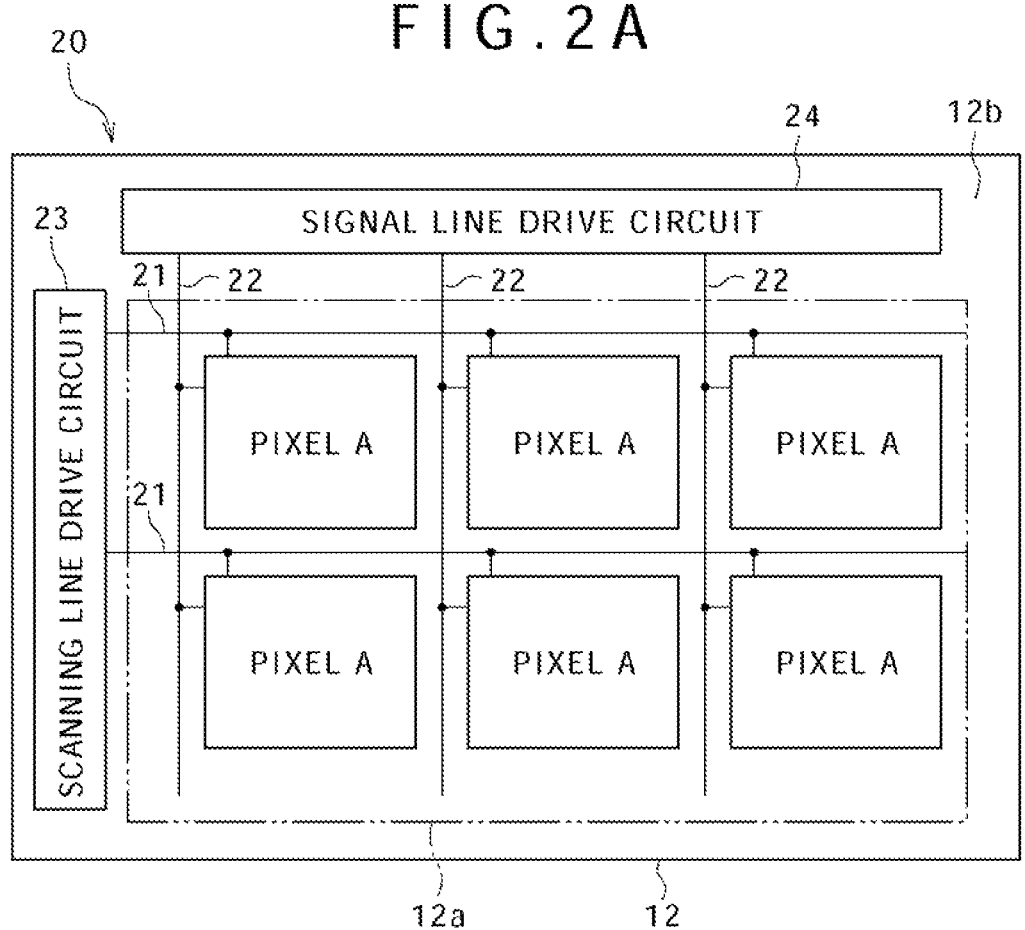
FIGS. 2A and 2B are circuit configuration diagrams showing a display device according to another embodiment.

As illustrated in FIG. 2A, a display area 12a and its peripheral area 12b are set on the substrate 12 of the display device 20. In the display area 12a, plural scanning lines 21 and plural signal lines 22 are formed horizontally and vertically, respectively, and corresponding to their intersections, pixels A are arranged, respectively, so that the display area 12a is constructed as a pixel array area. These pixels A are provided with the organic electroluminescent devices, respectively. Arranged in the peripheral area 12b, on the other hand, are a scanning line drive circuit 23 for scanning drive the scanning lines 21 and a signal line drive circuit 24 for providing, the signal line 22 with video signals (in other words, input signals) in correspondence to brightness information.

Figure 2B:
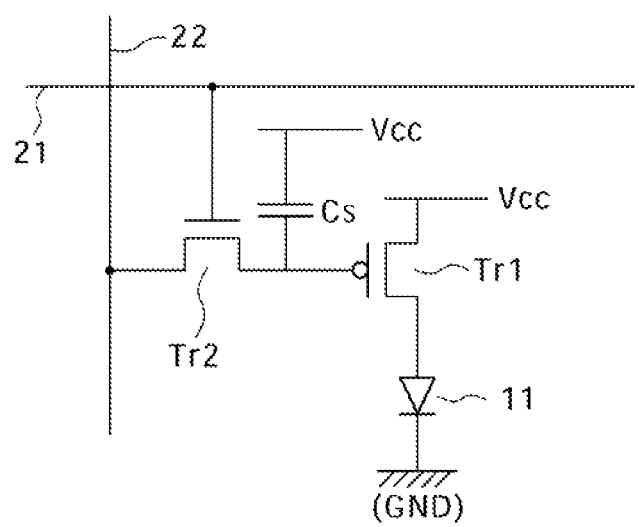

As depicted in FIG. 2B, the pixel circuit arranged at each pixel A is composed, for example, of the organic electroluminescent device 11, a drive transistor Tr1, a write transistor (sampling transistor) Tr2, and a retention capacitor Cs. Each video signal, which has been written from the signal line 22 via the write transistor Tr2 based on a drive by the scanning line drive circuit 23, is retained in the retention capacitor Cs, a current corresponding to the retained signal intensity is fed to the organic electroluminescent device 11, and the organic electroluminescent device 11 emits light at a brightness corresponding to die value of the current.

It is to be noted that the above-described pixel circuit configuration is merely illustrative. It is, therefore, possible to arrange a capacitor in the pixel circuit as needed, and to configure the pixel circuit with plural transistors. Further, one or more drive circuits can be added further to the peripheral area 12b as needed depending on the modifications to the pixel circuit.

Figure 3:
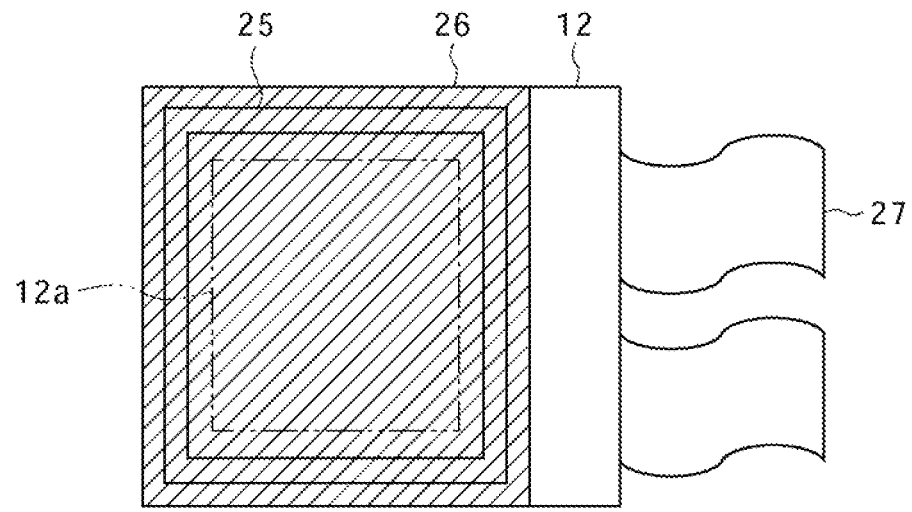
FIG. 3 is a configuration diagram depicting a modularized display device of a sealed configuration, to which one embodiment can be applied.

The display device according to an embodiment can also he in the form of a module of sealed configuration as shown in FIG. 3. For example, a sealing part 25 is arranged such that it surrounds the display area 12a as the pixel array area. Forming this sealing part 25 with an adhesive, the substrate 12 is bonded on an opposing element (sealing substrate 26) made of transparent glass or the like to fabricate a display module. This transparent sealing substrate 26 may be provided with a color filter, a protective film, a light-shielding film and/or the like. It is to be noted that the substrate 12 as a display module with the display area 12a formed thereon is provided with flexible printed substrates 27 for inputting/outputting signals or the like to the display area 12a (pixel array area) from the outside.

In such organic electroluminescent device and display device as described above, the electron transport layer 14d contains the nitrogen-containing heterocycle derivative, which has high electron supply ability. Despite the formation of the electron supply layer 14d at the thickness greater than the total thickness of the hole injection layer 14a and hole transport layer 14b, the electron supply layer 14d can, therefore, provide the light-emitting layer 14c with electrons necessary and sufficient to achieve a higher efficiency at a low drive voltage. Further, the formation of the hole injection layer 14a and hole transport layer 14b with a total thickness smaller than the electron transport layer 14d makes it possible to increase the supply of holes. It is, therefore, possible to achieve a carrier balance with just enough holes and electrons while assuring a sufficiently large supply quantify of carriers, and therefore, to obtain high luminescence efficiency. As holes and electrons are neither too much nor too little, the carrier balance is hardly disrupted, thereby making it possible to reduce a deterioration in drive and to lengthen the light-emitting life. It is, accordingly, possible to realize a display of low power consumption and excellent long-term reliability.

In the organic electroluminescent device and display device according to an embodiment, the electron transport layer 14d is formed thick so that the recombination region of carriers in the light-emitting layer 14c can be arranged at a position remote from the cathode 15. It is, therefore, possible to avoid a damage to the recombination region, which would otherwise takes place upon formation of the cathode 15 by sputtering or the like.

It is to be noted that the organic electroluminescent device according to an embodiment is not limited to an organic electroluminescent device, which makes use of a TFT substrate and is useful in active matrix display device, but is applicable as an organic electroluminescent device for use in a passive display device and can bring about similar advantageous effects. When applied to a passive display device, one of the cathode 15 and anode 13 is configured as a signal line and the other is configured as a scanning line.

In the above embodiment the description was made of the "top-emitting" design that generated light is outputted from the side of the cathode 15 arranged on the side opposite to the substrate 12. However, the present invention can also be applied to a "bottom-emitting" organic electroluminescent device, in which emitted light is outputted from the side of the substrate 12, by forming the substrate 12 with a transparent material. In this case, in the stacked structured described with reference to FIG. 1, the anode 13 on die substrate 12 formed of the transparent material is configured with a transparent electrode material having a large work function such as, for example, ITO. In this configuration, generated light can be outputted from both of the side of the substrate 12 and the side opposite to the substrate 12. The configuration of die cathode 15 with a reflecting material in such a configuration makes it possible to output generated light only from the side of the substrate 12. In this case, a sealing electrode of AuGe, Au, Pt or the like can be applied to the uppermost layer of the cathode 15.

A "transmissive" organic electroluminescent device in which generated light is outputted from the side of the substrate 12 can also be configured by modifying the stacked structure, which has been described with reference to FIG. 1, into a configuration that the respective layers are inversely stacked from the side of the substrate 12 formed of the transparent material and the anode 13 is arranged as an upper electrode. In this case, the replacement of the anode 13 as the upper electrode by a transparent electrode makes it possible to output generated light from both of the side of the substrate 12 and the side opposite to the substrate 12.

The present application, which has been described above based on the embodiment, can also be applied to a stacked organic electroluminescent device configured by stacking units, each of which is formed of an organic layer including a light-emitting layer, one over another. The term "stacked organic electroluminescent device" as used herein means an organic electroluminescent tandem device. For example. JP-A-11-329748 discloses a device characterized in that plural organic electroluminescent devices is electrically connected in series via intermediate conductive layers, respectively.

Further, JP-A-2003-45676 and JP-A-2003-272860 disclose device configurations for realizing tandem devices and contain detailed working examples. These patent publications describe that the current efficiency (cd/A) can be increased two-fold ideally without changing the luminescence efficiency (lm/W) when two units each of which includes an organic layer are stacked one over the other and that the current efficiency (cd/A) can be increased three-fold ideally without changing the luminescence efficiency (lm/W) when three units each of which includes an organic layer are stacked one over another.

The application of the present application to a tandem device can provide a device of extremely long life owing to the synergistic effects of the longer life inherently available from the configuration of the tandem device and the life-prolonging effect of the present application.

Application Examples

The above-described display device according to an embodiment can be applied as a display device in electronic equipment in various fields which display, as a picture image or video image, video signals inputted in the electronic equipment or video signals generated in the electronic equipment, such as various electronic equipment depicted in FIGS. 4 to 8G, for example, digital cameras, notebook-size personal computers, mobile terminal equipment such as cellar phones, and video cameras. A description will hereinafter be made about examples of the electronic equipment to which the present invention can be applied.

Figure 4:
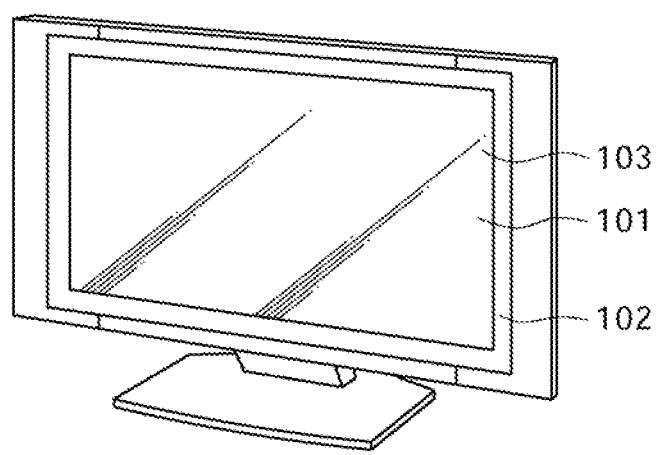
FIG. 4 is a perspective view showing a television set to which one embodiment can be applied.

FIG. 4 is a perspective view of a television set to which an embodiment can be applied. The television set according to this application example includes an image display screen 101 constructed of a front panel 102, a filter glass 103, etc., and cat) be manufactured by using the display device according to the present invention as the image display screen 101.

Figure 5A:
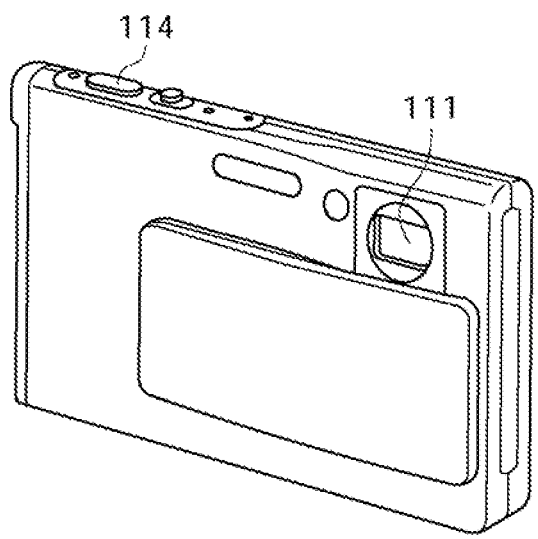
FIG. 5A is a perspective view illustrating a digital camera, to which one embodiment of the present invention can be applied, as viewed from a front side.
Figure 5B:
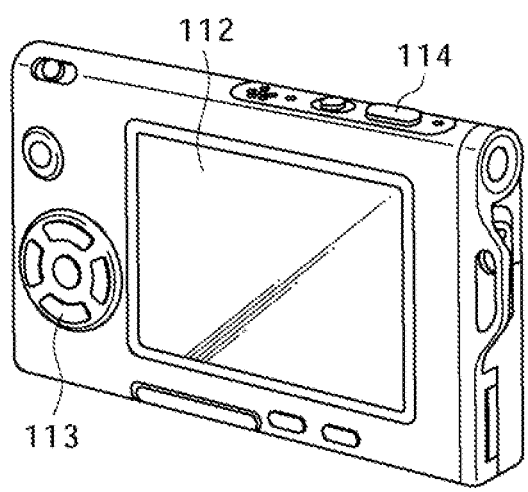
FIG. 5B is a perspective view of the digital camera as viewed from a back side.

FIGS. 5A and 5B are perspective view of a digital camera to which an embodiment can be applied. FIG. 5A is a perspective view as viewed from the front side, while FIG. 5B is a perspective view as viewed from the back side. The digital camera according to this application example includes a light-emitting unit 111 for flash light, a display 112, a menu selector 113, a shutter button 114, etc., and can be manufactured by using the display device according to the present invention as the display 112.

Figure 6:
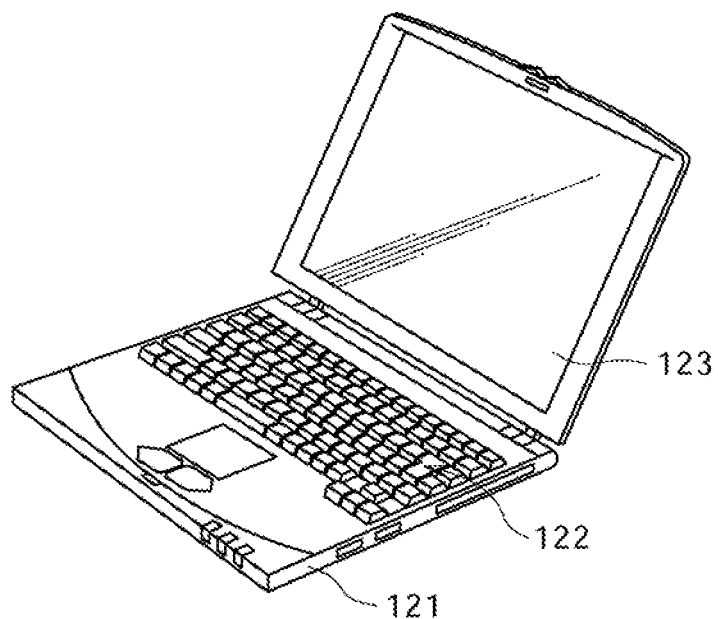
FIG. 6 is a perspective view depicting a notebook-size personal computer to which one embodiment can be applied.

FIG. 6 is a perspective view showing a notebook-size personal computer to which an embodiment can be applied. The notebook-size personal computer according to tins application example includes a main body 121, a keyboard 122 to be operated upon inputting characters and the like, a display 123 for displaying images, etc., and can be manufactured by using the display device according to an embodiment as the display 123.

Figure 7:
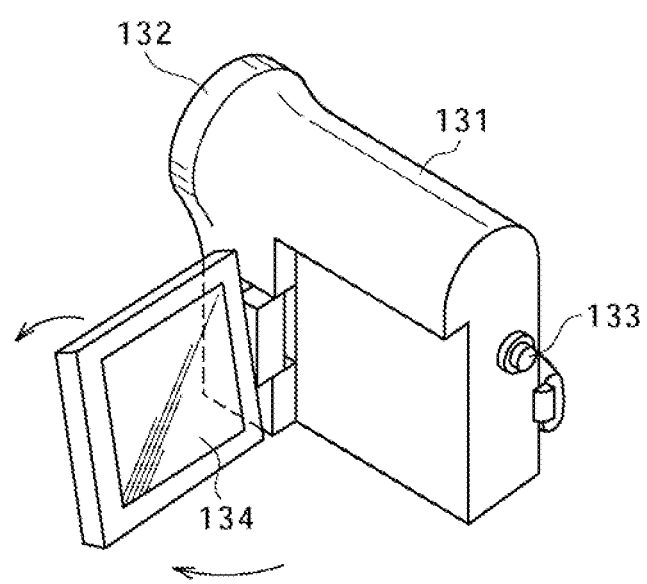
FIG. 7 is a perspective view depicting a video camera to which one embodiment can be applied.

FIG. 7 is a perspective view showing a video camera to which the present invention can be applied. The video camera according to this application example includes a main body 131, an object-shooting lens 132 in a front side, a start/stop switch 133 employed upon shooting, a display 134, etc., and can be manufactured by using the display device according to an embodiment as the display 134.

Figure 8E:
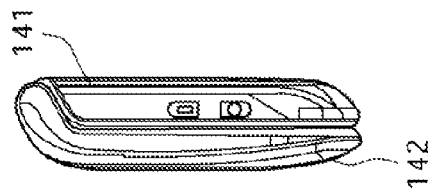
FIG. 8E is a right side view of the cellular phone in the closed state.
Figure 8F:
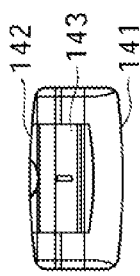
FIG. 8F is a top view of the cellular phone in the closed state.
Figure 8C:
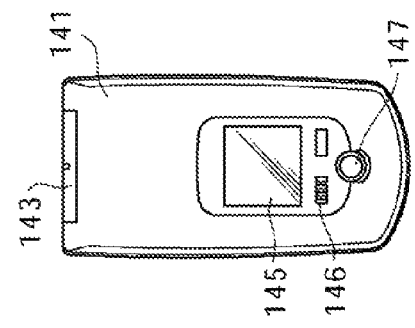
FIG. 8C is a front view of the cellular phone in a closed state.
Figure 8G:
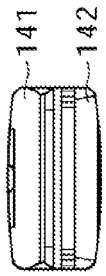
FIG. 8G is a bottom view of the cellular phone in the closed state.
Figure 8D:
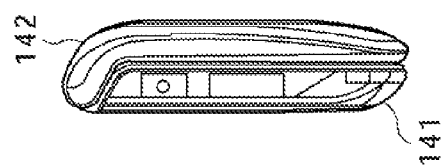
FIG. 8D is a left side view of the cellular phone in the closed state.
Figures 8A, 8B:
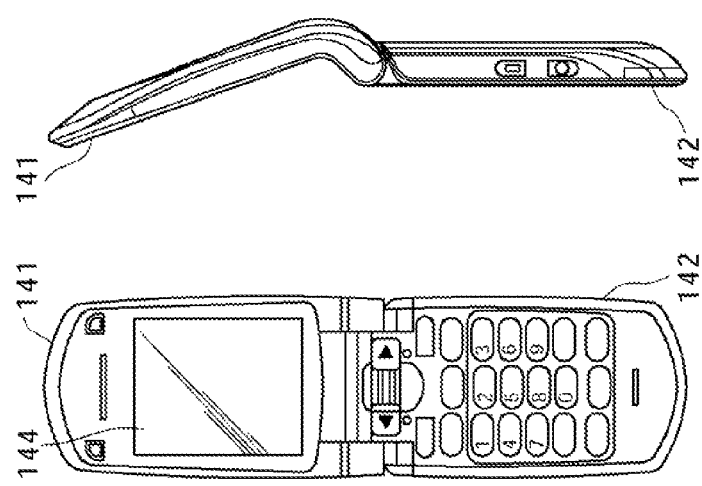
FIG. 8A is a front view of a cellular phone as one example of mobile terminal equipment, to which the present application can be applied, in an opened state.
FIG. 8B is a side view of the cellular phone in the opened state.

FIGS. 8A through 8E illustrate a mobile terminal equipment, specifically a cellar phone to which an embodiment can be applied, in which FIG. 8A is its front view in an opened state, FIG. 8B is its side view, FIG. 8C is its front view in a closed state, FIG. 8D is its left side view, FIG. 8E is its right side view, FIG. 8F is its top view, and FIG. 8G is its bottom view. The cellular phone according to this application example includes an upper casing 141, a lower casing 142, a connecting portion (hinge in this example) 143, a display 144, a sub-display 145, a picture light 146, a camera 147, etc., and can be manufactured by using the display device according to an embodiment as the display 144 or the sub-display 145.

EXAMPLES

A description will next be made of fabrication procedures of organic electroluminescent devices as specific examples of an embodiment and comparative examples to these examples.

Example 1

Organic electroluminescent devices 11 of the configuration described above with reference to FIG. 1 were formed. In this example, each organic electroluminescent device 11 was formed as atop-emitting organic electroluminescent device 11 configured in a resonator structure that light emitted upon recombination of holes, which have been injected from an anode 13, and electrons, which have been injected from a cathode 15, in a light-emitting layer 14c is caused to resonate between the anode 13 and the cathode 15 and is outputted from the side of the cathode 15 located on the side opposite to the substrate 12. The configurations of respective layers are shown in Table 33, in which as to the configurations common to the examples and comparative examples to be described subsequently herein, their description is omitted. The fabrication procedure of the organic electroluminescent device 11 will hereinafter be described.

TABLE 33

|  | Anode | Hole injection layer | Hole transport layer | Electron transport layer | Current efficiency (cd/A) | Voltage (V) | Time (h) | Voltage increase width (ΔV) |
| --- | --- | --- | --- | --- | --- | --- | --- | --- |
| Example 1 | Ag/ITO (200 nm/ 10 nm) | D-57 (10 nm) | D-43 (30 nm) | A9-4 (120 nm) | 7.8 | 5.2 | 300 | 0.2 |
| Example 2 | Ag/ITO | D-57 | D-43 | A9-15 (120 nm) | 7.6 | 5.3 | 305 | 0.2 |
| Example 3 | Ag/ITO | D-57 | D-43 | A9-16 (120 nm) | 7.0 | 5.4 | 280 | 0.1 |

TABLE 33-continued

| | Anode | Hole injection layer | Hole transport layer | Electron transport layer | Current efficiency (cd/A) | Voltage (V) | Time (h) | Voltage increase width (ΔV) |
|---|---|---|---|---|---|---|---|---|
| Example 4 | Ag/ITO | D-57 | D-43 | A10-10 (120 nm) | 8.0 | 5.5 | 300 | 0.3 |
| Example 5 | Ag/ITO | D-57 | D-43 | B-3 (120 nm) | 6.0 | 10.5 | 200 | 0.6 |
| Example 6 | Ag/ITO | D-57 | D-43 | A9-15 (50%) + A9-16 (50%) (120 nm) | 7.3 | 5.8 | 300 | 0.1 |
| Example 7 | Ag/ITO | D-57 | D-43 | A9-2 (60 nm)/ A9-4 (60 nm) | 7.0 | 6.1 | 302 | 0.2 |
| Example 8 | Ag/ITO | D-57 | D-43 | DPA (10 nm)/ A9-4 (110 nm) | 7.8 | 6.0 | 300 | 0.2 |
| Example 9 | Ag/ITO | D-57 | D-43 | A9-16 (100 nm)/ Bphen (20 nm) + Cs (5%) | 7.7 | 5.1 | 250 | 0.1 |
| Example 10 | Al—Nd (10%) (120 nm) | Structural formula (1) (10 nm) | D-42/D-82 (10 nm/10 nm) | A9-4 (120 nm) | 8.8 | 7.0 | 300 | 0.2 |
| Example 11 | Al—Nd (10%) | Structural formula (1) | D-82 (20 nm) | A9-4 (120 nm) | 7.0 | 7.0 | 300 | 0.2 |
| Example 12 | Al—Nd (10%) | D-58 (60%) + F4TCNQ (40%) (10 nm) | D-82 | A9-4 (120 nm) | 6.5 | 9.0 | 250 | 0.5 |
| Example 13 | Al—Nd (10%) | Structural formula (1) | D-82 | A1-6 (120 nm) | 6.8 | 9.0 | 600 | 0.1 |
| Example 14 | Al—Nd (10%) | Structural formula (1) | D-83 (20 nm) | A1-15 (120 nm) | 6.7 | 9.2 | 800 | 0.1 |
| Comp. Ex. 1 | Ag/ITO | D-57 | D-43 | DPA | 0 | >20 V | i.m. | i.m. |
| Comp. Ex. 2 | Ag/ITO | D-57 | D-43 | Alq3 | 3.0 | 7.3 | 200 | 0.2 |
| Comp. Ex. 3 | Ag/ITO | D-57 | D-43 | A9-4 | 4.0 | 5.5 | 5 | 0.2 | i.m.: Incapable of measurement

As an anode 13, an Ag layer was firstly formed with a thickness of 200 nm on a substrate 12 made of a 30 mm×30 mm glass plate, and on the Ag layer, an ITO layer was then formed with a thickness of 10 nm. In this case, an end face of the Ag layer in the anode 13, said end face being on the side of an organic layer 14, would act as a first end portion P1 in the resulting resonator structure. By $SiO_2$ evaporation, the substrate 12 was then masked with an insulating film (not shown in the figure) except for a 2 mm×2 mm light-emitting area to fabricate a cell for an organic electroluminescent device.

A diamine derivative, which was the compound D-57 shown in Table 30, was then formed as a hole injection layer 14a with a thickness of 10 nm (deposition rate: 0.2 to 0.4 nm/sec) on the anode 13 by vacuum evaporation.

On the hole injection layer 14a, the compound D-43 shown in Table 29 was then formed as a hole transport layer 14b with a thickness of 30 nm (deposition rate: 0.2 to 0.4 nm/sec) by vacuum evaporation. The compound D-43 is a hole transporting material. As a result, the hole injection layer 14a and the hole transport layer 14b gave a total thickness of 40 nm.

Using 9-(2-naphthyl)-10-[4-(1-naphthyl)phenyl]anthracene (host A) as a host and N,N,N',N'-tetra(2-naphthyl)-4,4'-diaminostilbene, a blue-light emitting dopant, compound, as a dopant (dopant B), a light-emitting layer 14c was formed further with a thickness of 36 nm on the hole transport layer 14b by vacuum evaporation such that the dopant concentration became 5% based on the film thickness.

On the light-emitting layer 14c, a benzimidazole derivative, which consisted of the compound A9-4 shown in Table 14, was then formed as an electron transport layer 14d with a thickness of 120 nm, which was greater than the total thickness (40 nm) of the hole injection layer 14a and the hole transport layer 14b, by vacuum evaporation.

After the organic layer 14 ranging from the hole injection layer 14a to the electron transport layer 14d had been formed as described above, LiF was formed as a first layer 15a of a cathode 15 with a thickness of about 0.3 nm (deposition rate: up to 0.01 nm/sec) by vacuum evaporation. As a second layer 15b, MgAg was then formed with a thickness of 10 nm by vacuum evaporation to arrange the cathode 15 in the form of a double-layer structure. In this case, a face of the second layer 15b. said face being on the side of the organic layer 14, would become a second end portion P2 of the resulting resonator structure.

The organic electroluminescent device 11 was fabricated as described above.

Example 2

An organic electroluminescent device 11 was fabricated in a similar manner as in Example 1 except that as an electron transport layer 14d, a benzimidazole derivative consisting of the compound A9-15 shown in Table 15 was formed with a thickness of 120 nm.

Example 3

An organic electroluminescent device 11 was fabricated in a similar manner as in Example 1 except that as an electron transport layer 14d, a benzimidazole derivative consisting of the compound A9-16 shown in Table 15 was formed with a thickness of 120 nm.

Example 4

An organic electroluminescent device 11 was fabricated in a similar manner as in Example 1 except that as an electron transport layer 14d, a benzimidazole derivative consisting of the compound A10-10 shown in Table 16 was formed with a thickness of 120 nm.

Example 5

An organic electroluminescent device 11 was fabricated in a similar manner as in Example 1 except that as an electron transport layer 14d, a phenanthroline derivative consisting of the compound B-3 shown in Table 25 was formed with a thickness of 120 nm.

Example 6

An organic electroluminescent device 11 was fabricated in a similar manner as in Example 1 except that as an electron transport layer 14d, a layer of a mixture of a benzimidazole derivative consisting of the compound A9-15 shown in Table 15 and another benzimidazole consisting of the compound A10-1 shown in Table 16 was formed with a thickness of 120 nm.

Example 7

An organic electroluminescent device 11 was fabricated in a similar manner as in Example 1 except that as an electron transport layer 14d, benzimidazole derivatives consisting of the compound A9-2 and compound A9-4 shown in Table 14 were formed and stacked in this order with a thickness of 60 nm each to give a total thickness of 120 nm.

Example 8

An organic electroluminescent device 11 was fabricated in a similar manner as in Example 1 except that as an electron transport layer 14d, diphenylanthracene (DPA) represented by the below-described structural formula (2) and a benzimidazole derivative consisting of the compound A9-4 in Table 14 were stacked in this order with thicknesses of 10 nm and 110 nm, respectively.

Structural Formula (2)

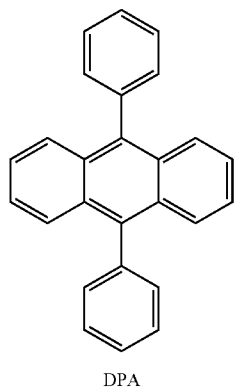

DPA

Example 9

An organic electroluminescent device 11 was fabricated in a similar manner as in Example 1 except that as an electron transport layer 14d, a benzimidazole derivative consisting of the compound A9-16 shown in Table 15 and a film of bathophenanthroline doped with 5% of metal cesium were stacked in this order with thicknesses of 100 nm and 20 nm, respectively.

Example 10

An organic electroluminescent device 11 was fabricated in a similar manner as in Example 1 except that a layer of an Al—Nd alloy containing 10 wt % of Nd was formed as an anode 13 with a thickness of 120 nm, hexanitrylazatriphenylene represented by the structural formula (1) was formed as a hole injection layer 14a with a thickness of 10 nm, and a diamine derivative consisting of the compound D-42 shown in Table 29 and another diamine derivative consisting of the compound D-82 shown in Table 31 were stacked in this order as a hole transport layer 14b with thicknesses of 10 nm and 10 nm, respectively.

Example 11

An organic electroluminescent device 11 was fabricated in a similar manner as in Example 10 except that as a hole transport layer 14b, a diamine derivative consisting of the compound D-82 shown in Table 31 was formed with a thickness of 20 nm.

Example 12

An organic electroluminescent device 11 was fabricated in a similar manner as in Example 10 except that as a hole injection layer 14a, a film of the compound D-58 shown in Table 30 doped with 40% of F4TCNQ was formed with a thickness of 10 nm.

Example 13

An organic electroluminescent device 11 was fabricated in a similar manner as in Example 10 except that a diamine derivative consisting of the compound D-82 shown in Table 31 was formed as a hole transport layer 14b with a thickness of 20 nm and a benzimidazole derivative consisting of the compound A1-6 shown in Table 1 was formed as an electron transport layer 14d with a thickness of 120 nm.

Example 14

An organic electroluminescent device 11 was fabricated in a similar maimer as in Example 10 except that a diamine derivative consisting of the compound D-83 shown in Table 31 was formed as a hole transport layer 14b with a thickness of 20 nm and a benzimidazole derivative consisting of the compound A1-15 shown in Table 2 was formed as an electron transport layer 14d with a thickness of 120 nm.

Comparative Example 1

As a comparative example to the above-described Examples 1 to 14, an organic electroluminescent device was fabricated in a similar manner as in Example 1 except that DPA represented by the structural formula (2) was formed as an electron transport layer 14d with a thickness of 120 nm.

Comparative Example 2

As another comparative example to the above-described Examples 1 to 14, an organic electroluminescent device was fabricated in a similar manner as in Example 1 except that Alq3 was formed as an electron transport layer 14d with a thickness of 15 nm. To configure the organic electroluminescent device in a cavity structure that emitted light is caused to resonate between an anode 13 and a cathode 15 and is outputted as in Examples 1 to 9, however, the thickness of a hole injection layer 14a, that of a hole transport layer 14b and that of a light-emitting layer 14c were adjusted to 10 nm, 140 nm and 20 nm, respectively.

Comparative Example 3

As a further comparative example to the above-described Examples 1 to 14, an organic electroluminescent device was fabricated in a similar manner as in Example 1 except that the compound A9-4 shown in Table 14 was formed as an electron transport layer 14d with a thickness of 15 nm. To configure the organic electroluminescent device in a resonator structure as in Examples 1 to 11, however, the thickness of a hole injection layer 14a, that of a hole transport layer 14b and that of a light-emitting layer 14c were adjusted to 10 nm, 140 nm and 20 nm, respectively.

Evaluation Results 1

With respect to each of the organic electroluminescent devices of Examples 1 to 14 and Comparative Examples 1 to 3 fabricated as described above, its voltage (V) and current efficiency (cd/A) were measured at a current density of 10 mA/cm2. Further, the time in which the relative brightness that the initial brightness was assumed to be 1 upon constant-current drive at 50° C., 25% duty and 100 mA/cm2 dropped to 0.9 was measured as its light-emitting life, and a drive voltage increase width (ΔV) at that time was measured. The results are shown in Table 33.

As shown in Table 33, the organic electroluminescent devices 11 of Examples 1 to 14, in each of which the electron transport layer 14d contains its corresponding benzimidazole derivative or derivatives, and each electron transport layer 14d has a greater thickness than the total thickness of the hole injection layer 14a and hole transport layer 14b, were each confirmed to have a higher current efficiency of 6.0 cd/A or higher and a longer light-emitting life of 200 h or longer in comparison with the organic electroluminescent devices of Comparative Examples 1-3. Accordingly, they were ascertained to be able to realize both of higher efficiency and longer life.

Especially with the organic electroluminescent device 11 of Example 10, the current efficiency was as high as 8.8 (cd/A) and therefore, a higher light-emitting efficiency was demonstrated even compared with the other examples. With the organic electroluminescent device 11 of Example 13 and the organic electroluminescent device 11 of Example 14, on the other hand, the light-emitting life was confirmed to be pronouncedly prolonged to 600 h and 800 h, respectively.

Examples 15 to 19

In addition, organic electroluminescent devices 11 were fabricated by varying, in an electron transport layer 14d, the thickness of a layer with the compound A9-4 contained therein to 70, 100, 126, 150 and 185 nm while maintaining constant the overall thickness of the organic layer 14.

As the device configuration, an Al—Nd (10 wt %) alloy layer was used as an anode 13, hexanitrylazatriphenylene represented by the structural formula (1) was used as a hole injection layer 14a, the compound D-43 was used as a hole transport layer 14b, and a layer formed with 9-(2-naphthyl)-10-[4-(1-naphthyl)phenyl]anthracene (host A) as a host and N,N,N',N'-tetra(2-naphthyl)-4,4'-diaminostilbene (dopant B), a blue-light emitting dopant compound, as a dopant such that the dopant concentration became 5% based on the film thickness was used as a light-emitting layer 14c. In the electron transport layer 14d, the compound A9-4 shown in Table 14 was used. While maintaining constant the overall thickness of the organic layer 14, the thickness of the layer, which contained the compound A9-4, in the electron transport layer 14d was varied to 70, 100, 126, 150 and 185 nm to fabricate the organic electroluminescent devices 11. The materials and film thicknesses in the configurations of the organic electroluminescent devices 11 of the respective examples are shown in Table 34. In each of Examples 13 to 15, 9-(2-naphthyl)-10-[4-(1-naphthyl)phenyl]anthracene (host A) was used as a thickness adjusting layer to adjust the thickness of the electron transport layer 14d. In a similar manner as in Example 1 except for the above-described variations, the devices were fabricated, and were measured for efficiency, voltage and life.

TABLE 34

(unit: nm)

| | Thickness of electron transport layer | | | | | |
|---|---|---|---|---|---|---|
| | Thickness of layer with nitrogen-containing heterocycle derivative contained therein Compound A9-4 | Thickness of thickness adjusting layer Host A | Thickness of hole injection layer Structural formula (1) | Thickness of hole transport layer Compound D-43 | Thickness of light-emitting layer Host A + dopant B | Thickness of anode Al—Nd (10%) |
| Material | | | | | | |
| Ex. 15 | 70 | 56 | 10 | 30 | 36 | 120 |
| Ex. 16 | 100 | 26 | 10 | 30 | 36 | 120 |
| Ex. 17 | 126 | 0 | 10 | 30 | 36 | 120 |
| Ex. 18 | 150 | 0 | 10 | 30 | 16 | 120 |
| Ex. 19 | 185 | 0 | 5 | 5 | 7 | 120 |
| Comp. Ex. 4 | 10 | 116 | 10 | 30 | 36 | 120 |
| Comp. Ex. 5 | 30 | 96 | 10 | 30 | 36 | 120 |
| Comp. Ex. 6 | 50 | 76 | 10 | 30 | 36 | 120 |
| Comp. Ex. 7 | 60 | 66 | 10 | 30 | 36 | 120 |

Comparative Examples 4 to 7

As comparative examples to Examples 15 to 19, organic electroluminescent devices were fabricated in a similar manner as in Example 15 except that the thickness of the layer, which contained the compound A9-4, in the electron transport layer 14d was varied to 10, 30, 50 and 60 nm, respectively. To form each organic electroluminescent device into a resonator structure upon its fabrication, the thickness of the electron transport layer 14d was adjusted by using 9-(2-naphthyl)-10-[4-(1-naphthyl)phenyl]anthracene (host A) as a thickness adjusting layer as in Examples 15 to 19.

Evaluation Results 2

With respect to each of the organic electroluminescent devices of Examples 15 to 19 and Comparative Examples 4 to 7 fabricated as described above, its drive voltage (V) was measured at a current density of 10 mA/cm². The results are shown in the diagram of FIG. 9. As shown in this diagram, it has been confirmed that the drive voltage becomes higher as the thickness of the compound A9-4, which makes up the electron transport layer 14d, decreases and the thickness of the thickness adjusting layer increases.

Evaluation Results 3

Figure 10:
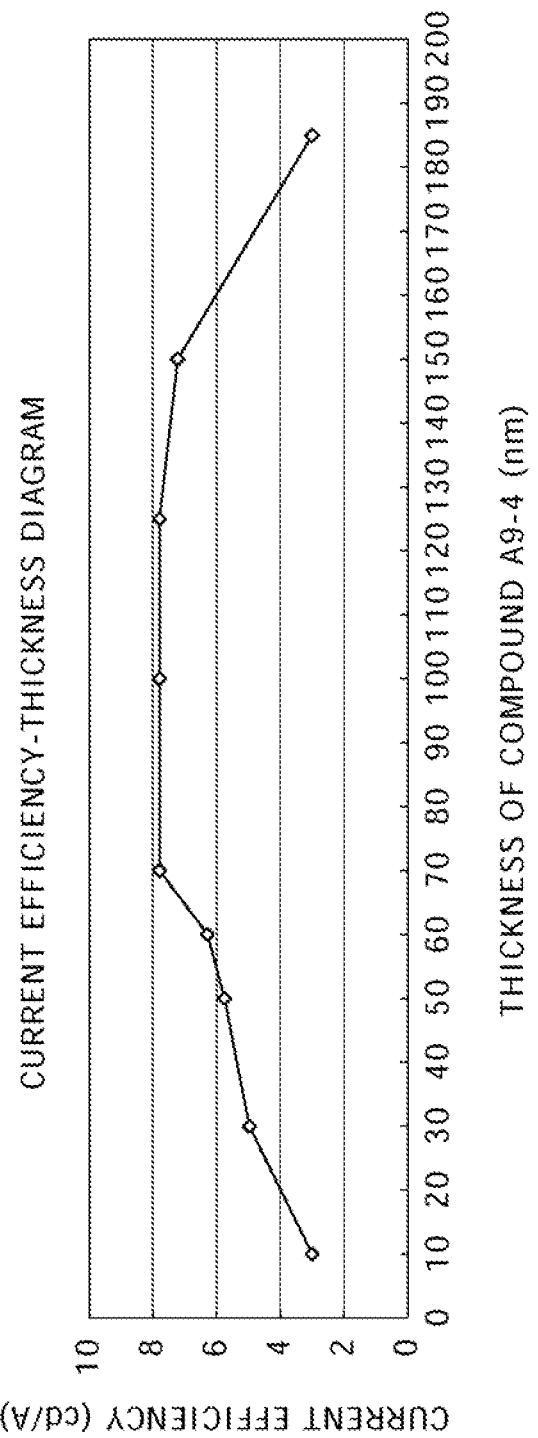
FIG. 10 is a diagram showing variations in current efficiency when the thickness of the layer with the nitrogen-containing heterocycle derivative contained therein was changed.

With respect to each of the organic electroluminescent devices of Examples 15 to 19 and Comparative Examples 4 to 7 fabricated as described above, its current efficiency (cd/A) was measured at a current density of 10 mA/cm2. The results are shown in the diagram of FIG. 10. As shown in this diagram, it has been confirmed that a high current efficiency is shown when the thickness of the compound A9-4, which makes up the electron transport layer 14d, falls within a range of from 70 nm to 130 nm. The reduced current efficiencies of the organic electroluminescent devices, in which the thicknesses of the compound A9-4 were 150 nm and 180 nm, are believed to be attributable to the thicknesses of the light-emitting layers 14c which were reduced in reverse proportion to the increased thicknesses of the electron transport layers 14d.

Evaluation Results 4

Figure 11:
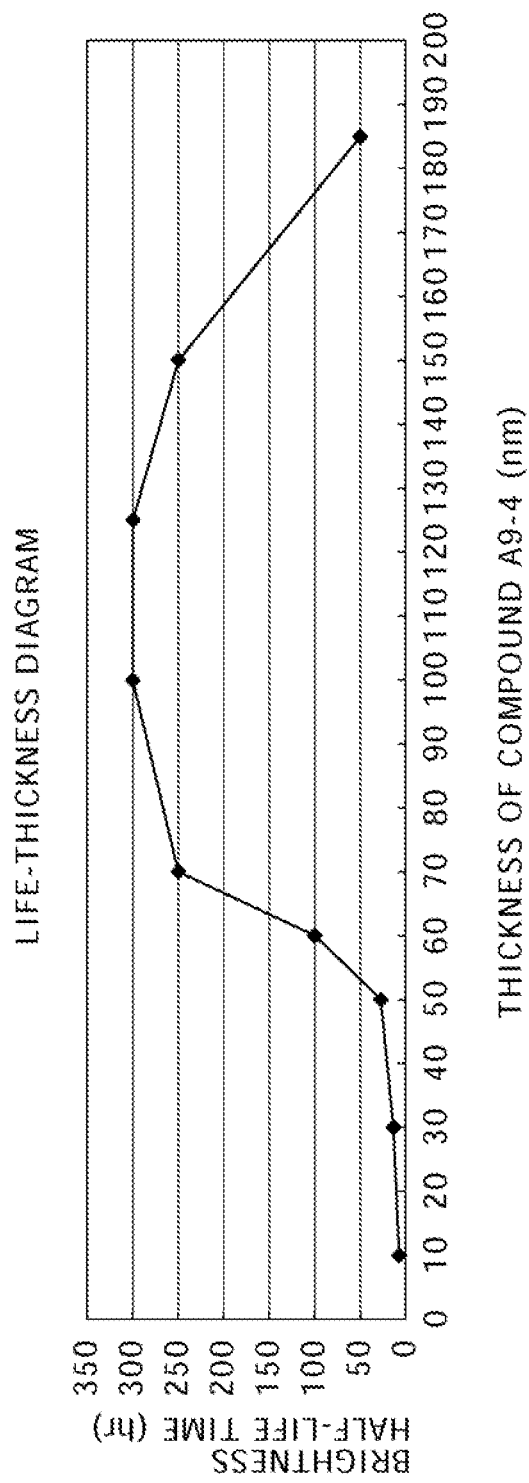
FIG. 11 is a diagram showing variations in light-emitting life when the thickness of the layer with the nitrogen-containing heterocycle derivative contained therein was changed.
Figure 12:
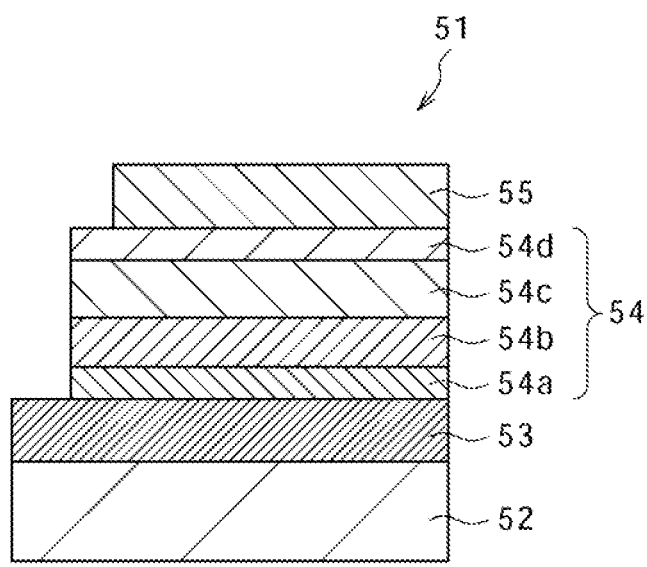
FIG. 12 is a cross-sectional view illustrating the configuration of an existing organic electroluminescent device.

With respect to each of the organic electroluminescent devices of Examples 15 to 19 and Comparative Examples 4 to 7 fabricated as described above, the time in which the relative brightness that the initial brightness was assumed to be 1 upon constant-current drive at 50° C., 25% duty and 100 mA/cm² dropped to 0.5 was measured as its light-emitting life. The results are shown in the diagram of FIG. 11. The organic electroluminescent devices of Examples 15 to 19 were confirmed to have longer light-emitting life compared with the organic electroluminescent devices of Comparative Examples 4 to 7. The reduced light-emitting lives of the organic electroluminescent devices, in which the thicknesses of the compound A9-4 were 150 nm and 180 nm, are believed to be attributable to the thicknesses of the light-emitting layers 14c which were reduced in reverse proportion to the increased thicknesses of the electron transport layers 14d.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An electroluminescent device comprising:
an anode;
a cathode; and
an organic layer held between said anode and said cathode,
the organic layer including
a light-emitting layer,
a hole supply layer arranged between said anode and the light-emitting layer and having a thickness ranging from 30 to 40 nm, the hole supply layer including a hole injection layer and a hole transport layer, and
an electron supply layer containing at least one layer including a nitrogen-containing heterocycle derivative that is a benzimidazole derivative that is arranged between said cathode and said light-emitting layer, the electron supply layer having a thickness greater than a combined thickness of the hole supply layer and the light-emitting layer,
wherein the electron supply layer and said organic layer are formed to satisfy the following relationship:

$$0.90 > d_1/d_2 > 0.30$$

where $d_1$ is the thickness of the electron supply layer and $d_2$ is a thickness of said organic layer,
wherein a combined thickness of the at least one layer including the nitrogen-containing heterocycle derivative ranges from 70 nm to 130 nm, and
wherein the electroluminescent device has a current efficiency of at least 6.0 cd/A.

2. The electroluminescent device according to claim 1, wherein said benzimidazole derivative is represented by the following formula (1), (2) or (3):

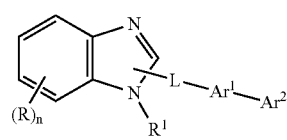

Formula (1)

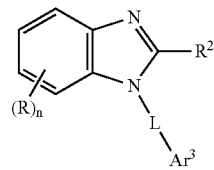

Formula (2)

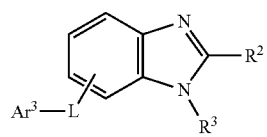

Formula (3)

wherein,
R represents a hydrogen atom, a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group, and n stands for an integer of from 0 to 4;
$R^1$ represents a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group;
$R^2$ and $R^3$ each independently represent a hydrogen atom, a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group;
L represents a substituted or unsubstituted $C_6$-$C_{60}$ arylene group, a substituted or unsubstituted pyridinylene group, a substituted or unsubstituted quinolinylene group or a substituted or unsubstituted fluolenylene group;
$Ar^1$ represents a substituted or unsubstituted $C_6$-$C_{60}$ arylene group, a substituted or unsubstituted pyridinylene group or a substituted or unsubstituted quinolinylene group;
$Ar^2$ represents a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group or a substituted or unsubstituted $C_1$-$C_{20}$ alkoxy group; and $Ar^3$ represents a substituted or unsubstituted $C_6$-$C_{60}$ aryl group, a substituted or unsubstituted pyridyl group, a substituted or unsubstituted quinolyl group, a substituted or unsubstituted $C_1$-$C_{20}$ alkyl group, a substituted or unsubstituted $C_1$-$C_{20}$ alkoxy group, or a group represented by —$Ar^1$-$Ar^2$ in which $Ar^1$ and $Ar^2$ have the same meanings as defined above.

3. The electroluminescent device according to claim 1, further comprising:

a layer containing an azatriphenylene derivative and arranged on a side of an interface between said hole supply layer and said anode.

4. A display device comprising:

a substrate; and organic electroluminescent devices formed in an array on said substrate, each of said organic electroluminescent devices including an anode, a cathode and an organic layer held between said anode and said cathode, the organic layer including a light-emitting layer, a hole supply layer arranged between said anode and the light-emitting layer and having a thickness ranging from 30 to 40 nm, the hole supply layer including a hole injection layer and a hole transport layer, and an electron supply layer containing at least one layer including a nitrogen-containing heterocycle derivative that is a benzimidazole derivative that is arranged between said cathode and said light-emitting layer, the electron supply layer having a thickness greater than a combines thickness of the hole supply layer and the light-emitting layer, wherein the electron supply layer and said organic layer are formed to satisfy the following relationship:

$$0.90 > d_1/d_2 > 0.30$$

where $d_1$ is the thickness of the electron supply layer and $d_2$ is a thickness of said organic layer, wherein a combined thickness of the at least one layer including the nitrogen-containing heterocycle derivative ranges from 70 nm to 130 nm, wherein the electroluminescent device has a current efficiency of at least 6.0 cd/A.

* * * * *